United States Patent
Onuki

(10) Patent No.: US 11,094,373 B2
(45) Date of Patent: Aug. 17, 2021

(54) OXIDE SEMICONDUCTOR BASED MEMORY DEVICE

(71) Applicant: SEMICONDUCTOR ENERGY LABORATORY CO., LTD., Atsugi (JP)

(72) Inventor: Tatsuya Onuki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/832,289

(22) Filed: Mar. 27, 2020

(65) Prior Publication Data

US 2020/0342935 A1  Oct. 29, 2020

Related U.S. Application Data

(63) Continuation of application No. 16/079,355, filed as application No. PCT/IB2017/051279 on Mar. 6, 2017, now Pat. No. 10,622,059.

(30) Foreign Application Priority Data

Mar. 18, 2016 (JP) .............................. JP2016-055513
Apr. 12, 2016 (JP) .............................. JP2016-079484

(51) Int. Cl.
*G11C 11/41* (2006.01)
*G11C 11/412* (2006.01)
(Continued)

(52) U.S. Cl.
CPC .......... *G11C 11/412* (2013.01); *G11C 11/401* (2013.01); *G11C 14/0054* (2013.01);
(Continued)

(58) Field of Classification Search
CPC ... G11C 11/412; G11C 16/04; G11C 14/0054; G11C 11/401; G11C 11/404;
(Continued)

(56) References Cited

U.S. PATENT DOCUMENTS 5,357,460 A   10/1994   Yusuki et al.
5,430,671 A    7/1995   Hirano et al.
(Continued)

FOREIGN PATENT DOCUMENTS

CN       001633712 A      6/2005
EP         2840574 A      2/2015
(Continued)

OTHER PUBLICATIONS

International Search Report (Application No. PCT/IB2017/051279) dated May 23, 2017.
(Continued)

*Primary Examiner* — Ajay Ojha
(74) *Attorney, Agent, or Firm* — Fish & Richardson P.C.

(57) ABSTRACT

A memory device with reduced power consumption is provided. The memory device includes a plurality of memory cells, a precharge circuit, a latch circuit, a bit line pair, and a local bit line pair. The precharge circuit has a function of supplying precharge voltage to the local bit line pair. The plurality of memory cells are connected to the local bit line pair. The latch circuit is connected to the local bit line pair. The latch circuit in a standby state is preferably supplied with the precharge voltage and one of low power supply voltage and high power supply voltage.

8 Claims, 33 Drawing Sheets

(51) Int. Cl.
  *H01L 29/786* (2006.01)
  *G11C 14/00* (2006.01)
  *H01L 27/12* (2006.01)
  *G11C 11/401* (2006.01)
  *H01L 29/792* (2006.01)
  *H01L 27/11* (2006.01)
  *G11C 11/404* (2006.01)
  *G11C 11/419* (2006.01)

(52) U.S. Cl.
  CPC ...... *H01L 27/1104* (2013.01); *H01L 27/1207* (2013.01); *H01L 27/1225* (2013.01); *H01L 29/7869* (2013.01); *H01L 29/78648* (2013.01); *H01L 29/78696* (2013.01); *H01L 29/792* (2013.01); *G11C 11/404* (2013.01); *G11C 11/419* (2013.01)

(58) Field of Classification Search
  CPC ... G11C 11/419; H01L 29/785; H01L 29/792; H01L 27/1104; H01L 29/786
  See application file for complete search history.

(56) References Cited

U.S. PATENT DOCUMENTS

| | | | |
|---|---|---|---|
| 7,405,958 B2 * | 7/2008 | Okazawa | G11C 11/16 365/66 |
| 7,408,218 B2 | 8/2008 | Akiyama et al. | |
| 7,683,419 B2 | 3/2010 | Akiyama et al. | |
| 7,804,118 B2 | 9/2010 | Akiyama et al. | |
| 8,106,441 B2 | 1/2012 | Akiyama et al. | |
| 8,787,102 B2 | 7/2014 | Ishizu | |
| 8,896,046 B2 | 11/2014 | Kato | |
| 8,964,450 B2 | 2/2015 | Ishizu | |
| 9,001,549 B2 | 4/2015 | Onuki | |
| 9,076,505 B2 | 7/2015 | Atsumi et al. | |
| 9,183,894 B2 | 11/2015 | Koyama | |
| 9,461,047 B2 | 10/2016 | Kato | |
| 9,536,574 B2 | 1/2017 | Ishizu | |
| 9,542,977 B2 | 1/2017 | Onuki et al. | |
| 9,559,105 B2 | 1/2017 | Ohmaru et al. | |
| 9,601,198 B2 | 3/2017 | Shuto et al. | |
| 9,627,010 B2 | 4/2017 | Ishizu et al. | |
| 9,842,650 B2 | 12/2017 | Taniguchi et al. | |
| 9,852,787 B2 | 12/2017 | Ishizu et al. | |
| 9,870,816 B2 | 1/2018 | Onuki et al. | |
| 2004/0232497 A1 | 11/2004 | Akiyama et al. | |
| 2012/0112257 A1 | 5/2012 | Kato | |
| 2012/0181534 A1 | 7/2012 | Hatano | |
| 2012/0294102 A1 | 11/2012 | Ishizu | |
| 2013/0148411 A1 | 6/2013 | Atsumi et al. | |
| 2013/0155790 A1 | 6/2013 | Atsumi | |
| 2014/0339541 A1 | 11/2014 | Kato et al. | |
| 2015/0070974 A1 | 3/2015 | Shuto et al. | |
| 2015/0117093 A1 | 4/2015 | Onuki et al. | |
| 2015/0269977 A1 | 9/2015 | Ishizu et al. | |
| 2015/0294693 A1 | 10/2015 | Onuki et al. | |
| 2015/0294710 A1 | 10/2015 | Onuki | |
| 2015/0294991 A1 | 10/2015 | Ishizu | |
| 2015/0325282 A1 | 11/2015 | Kato et al. | |
| 2016/0078938 A1 | 3/2016 | Hsu | |
| 2016/0104521 A1 | 4/2016 | Onuki et al. | |
| 2016/0233866 A1 | 8/2016 | Ishizu et al. | |
| 2017/0358334 A1 | 12/2017 | Onuki | |

FOREIGN PATENT DOCUMENTS

| | | |
|---|---|---|
| EP | 3174061 A | 5/2017 |
| JP | 10-112188 A | 4/1998 |
| JP | 2013-008937 A | 1/2013 |
| JP | 2013-168631 A | 8/2013 |
| JP | 2014-063557 A | 4/2014 |
| JP | 2015-111485 A | 6/2015 |
| JP | 2015-195075 A | 11/2015 |
| JP | 2015-207761 A | 11/2015 |
| JP | 2016-033842 A | 3/2016 |
| KR | 2013-0097675 A | 9/2013 |
| TW | 201611193 | 3/2016 |
| TW | 201626388 | 7/2016 |
| WO | WO-2003/052829 | 6/2003 |
| WO | WO-2012/060253 | 5/2012 |
| WO | WO-2013/172066 | 11/2013 |
| WO | WO-2016/181256 | 11/2016 |

OTHER PUBLICATIONS

Written Opinion (Application No. PCT/IB2017/051279) dated May 23, 2017.
Ishizu.T et al., "SRAM with C-Axis Aligned Crystalline Oxide Semiconductor: Power Leakage Reduction Technique for Microprocessor Caches", IMW2014 (6th IEEE International Memory Workshop), May 18, 2014, pp. 103-106.
Bartling.S et al., "An 8MHz 75µA/MHz Zero-Leakage Non-Volatile Logic-Based Cortex-M0 MCU SoC Exhibiting 100% Digital State Retention at VDD=0V with <400ns Wakeup and Sleep Transitions", ISSCC 2013 (Digest of Technical Papers. IEEE International Solid-State Circuits Conference), Feb. 17, 2013. pp. 432-434.
Sakimura.N et al., "10.5 A 90nm 20MHz Fully Nonvolatile Microcontroller for Standby-Power-Critical Applications", ISSCC 2014 (Digest of Technical Papers. IEEE International Solid-State Circuits Conference), 2014, pp. 184-185.
Singhal.V et al., "A 10.5µA/MHz at 16MHz Single-Cycle Non-Volatile Memory Access Microcontroller with Full State Retention at 108nA in a 90nm Process", ISSCC 2015 (Digest of Technical Papers. IEEE International Solid-State Circuits Conference), Feb. 23, 2015, pp. 148-150.

* cited by examiner

M1

M1

M1

M1

FIG. 17A
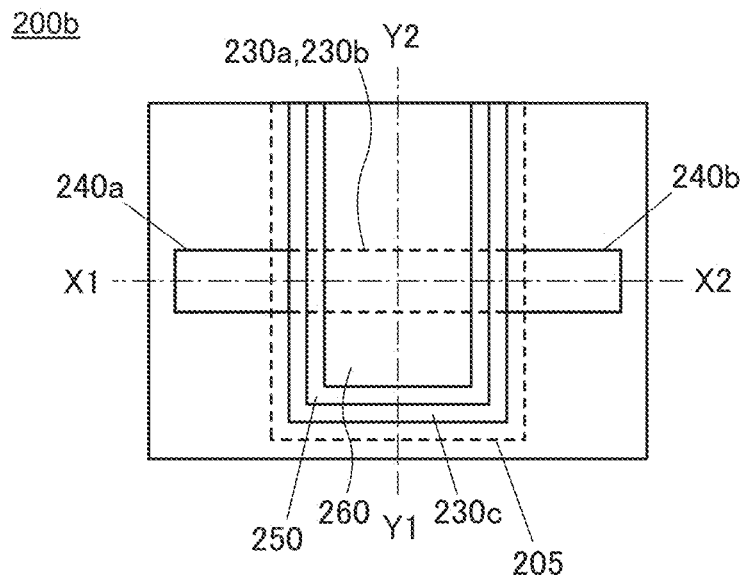
FIG. 17B
FIG. 17C
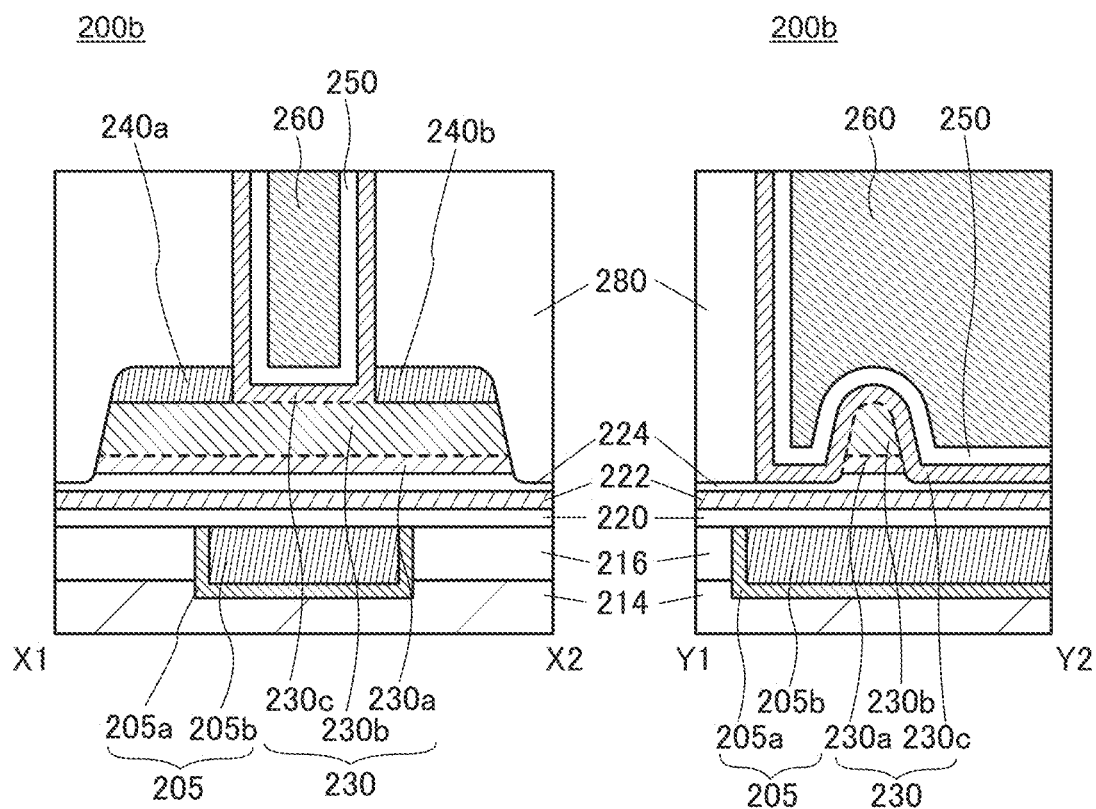

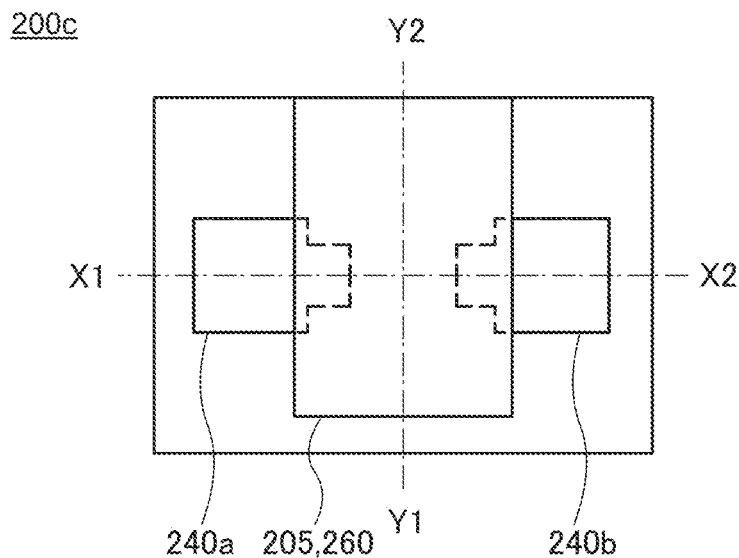
FIG. 18A
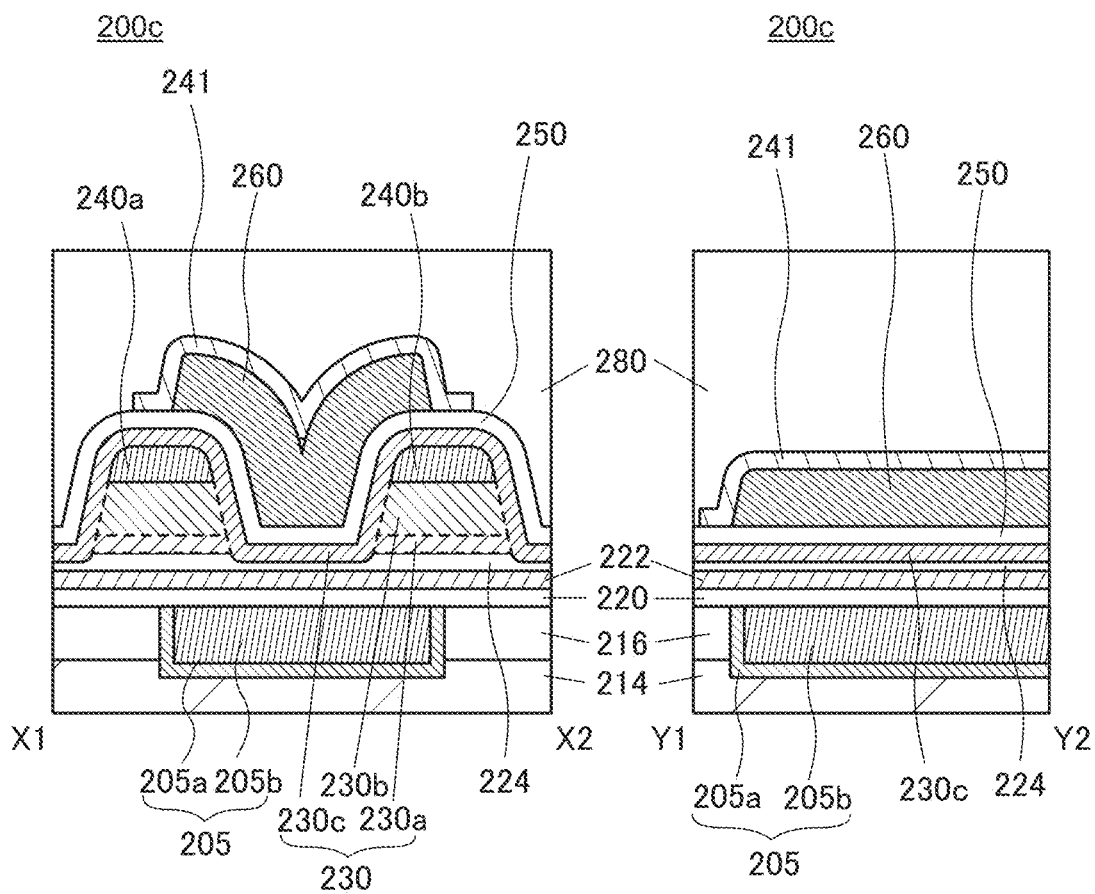
FIG. 18B
FIG. 18C

FIG. 19A
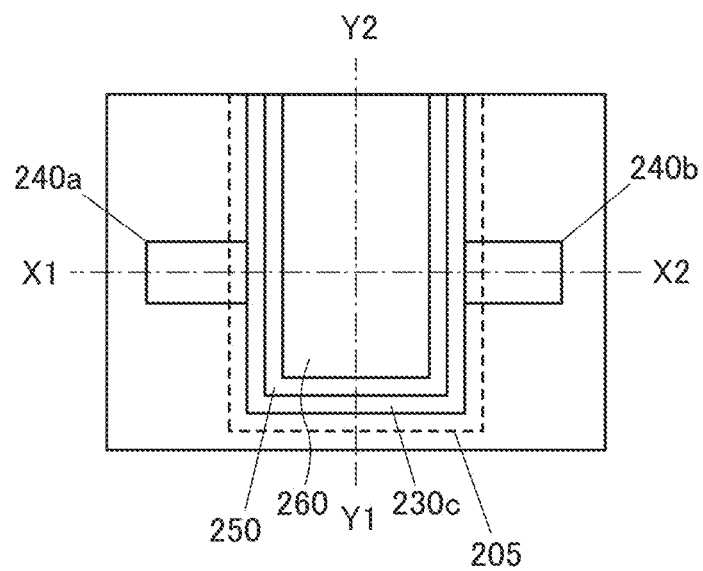
FIG. 19B
FIG. 19C
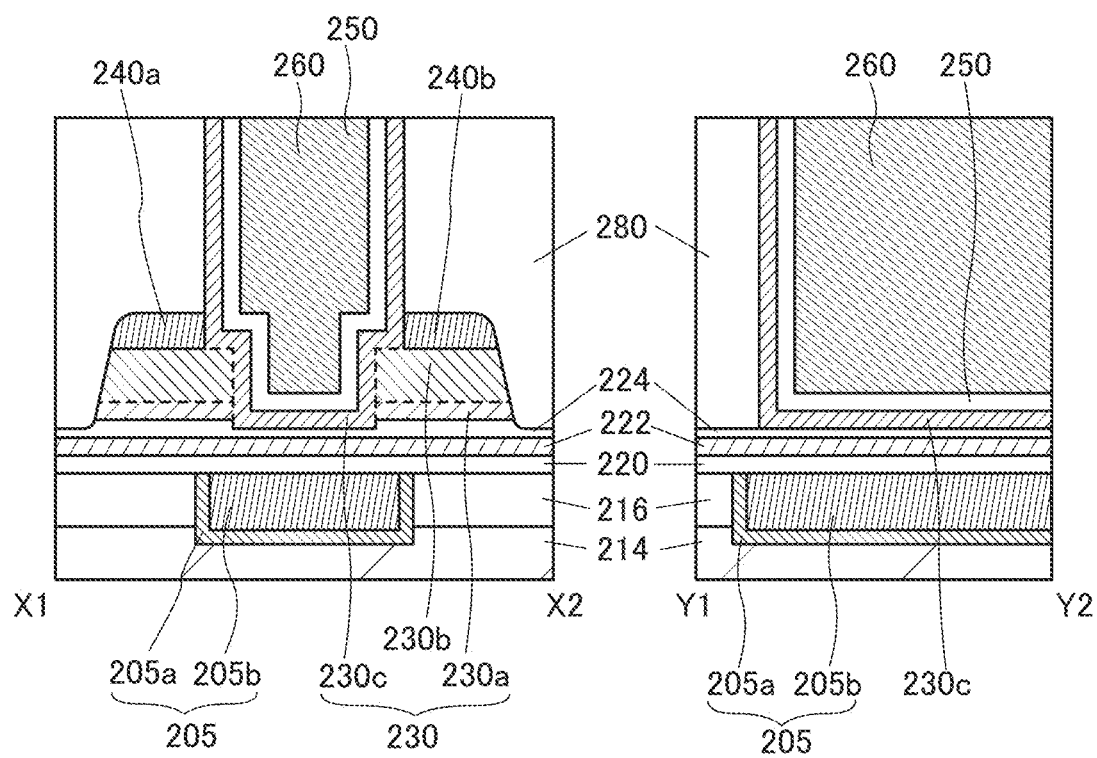

OXIDE SEMICONDUCTOR BASED MEMORY DEVICE

CROSS-REFERENCE TO RELATED APPLICATIONS

This application is a continuation of U.S. application Ser. No. 16/079,355, filed Aug. 23, 2018, now allowed, which is a U.S. National Phase Application under U.S.C. § 3.71 of International Application No. PCT/IB2017/051279, filed Mar. 6, 2017, which claims the benefit of foreign priority applications filed in Japan as Application No. 2016-079484, on Apr. 12, 2016 and Application No. 2016-055513, on Mar. 18, 2016, all of which are incorporated by reference.

TECHNICAL FIELD

One embodiment of the present invention relates to a semiconductor device, specifically, a memory device.

Furthermore, one embodiment of the present invention relates to an object, a method, or a manufacturing method. Alternatively, one embodiment of the present invention relates to a process, a machine, manufacture, or a composition (composition of matter). One embodiment of the present invention relates to a driving method thereof, or a manufacturing method thereof.

Note that the term semiconductor device in this specification indicates all the devices that can operate by utilizing semiconductor characteristics. A memory device, a display device, an electro-optical device, a power storage device, a semiconductor circuit, and an electronic device include a semiconductor device in some cases.

BACKGROUND ART

A reduction in power consumption of electronic devices has been highly required. Thus, a reduction in power consumption of integrated circuits (ICs) such as CPUs is a major challenge in circuit design. The power consumption of ICs is broadly classified into operating power consumption (dynamic power) and non-operating (standby) power consumption (static power). Dynamic power increases when an operating frequency is increased for high performance. Static power is power consumed mostly by the leakage current of transistors. Examples of leakage current include subthreshold leakage current, gate tunnel leakage current, gate-induced drain leakage (GIDL: Gate-induced drain leakage) current, and junction tunnel leakage current. These leakage currents increase in accordance with scaling down of transistors. Thus, an increase in power consumption is a large barrier to high performance and high integration of ICs.

In order to reduce power consumption of a semiconductor device, circuits that do not need to operate are stopped by power gating or clock gating. Power gating has the effect of eliminating standby power because supply of power is stopped. In order to perform power gating in a CPU, it is necessary to back up contents stored in a register or a cache to a nonvolatile memory.

A memory circuit capable of retaining data even when power is off, which takes advantage of a feature of extremely low off-state current of a transistor whose active layer is formed using an oxide semiconductor (Oxide Semiconductor) (hereinafter, such a transistor is referred to as an "oxide semiconductor transistor" or an "OS transistor"), has been proposed. For example, Non-Patent Document 1 discloses an OS-SRAM (static random access memory) including a backup circuit that includes an OS transistor. Non-Patent Document 1 discloses that in a microprocessor mounted with an OS-SRAM enables power gating in a short break-even time (BET) without affecting normal operation.

PRIOR ART REFERENCES

Non-Patent Document

[Non-Patent Document 1] T. Ishizu et al., Int. Memory Workshop, 2014, pp. 106-103.
[Non-Patent Document 2] S. Baffling et al., ISSCC Dig. Tech. Papers, pp. 432-434, 2013.
[Non-Patent Document 3] N. Sakimura et al., ISSCC Dig. Tech. Papers, pp. 184-185, 2014.
[Non-Patent Document 4] VK. Singhal et al., ISSCC Dig. Tech. Papers, pp. 148-149, 2015.

SUMMARY OF THE INVENTION

Problems to be Solved by the Invention

An SRAM is a memory that operates at high speed, and is used as a data memory or a cache memory incorporated in a logic circuit such as a CPU. When capacity of the SRAM is increased, however, low voltage operation, standby current (current in a non-access state), a cell size, and the like become problems.

An object of one embodiment of the present invention is to provide a memory device with low power consumption. Furthermore, an object of one embodiment of the present invention is to provide a memory device with a small circuit area. An object of one embodiment of the present invention is to provide a semiconductor device with low power consumption. Furthermore, an object of one embodiment of the present invention is to provide a semiconductor device with a small circuit area. Furthermore, an object of one embodiment of the present invention is to provide a novel semiconductor device.

Note that description of the plurality of objects does not mutually preclude the existence. One embodiment of the present invention does not necessarily achieve all the objects listed above. Furthermore, objects other than those listed above are apparent from description of this specification and the like, and such objects can be objects of one embodiment of the present invention.

Means for Solving the Problems

One embodiment of the present invention is a memory device including a plurality of memory cells, a precharge circuit, a latch circuit, a bit line pair formed of a first bit line and a second bit line, a local bit line pair formed of a first local bit line and a second local bit line, a first transistor, and a second transistor. The first transistor has a function of controlling electrical continuity between the first bit line and the first local bit line. The second transistor has a function of controlling electrical continuity between the second bit line and the second local bit line. Each of the plurality of memory cells comprises a third transistor, a fourth transistor, a first capacitor, and a second capacitor. The third transistor has a function of controlling electrical continuity between the first local bit line and the first capacitor. The fourth transistor has a function of controlling electrical continuity between the second local bit line and the second capacitor. The precharge circuit has a function of supplying a precharge voltage to the local bit line pair. The latch circuit is electrically connected to the local bit line pair. When the first transistor, the second transistor, the third transistor, and the fourth transistor are off, the precharge voltage and one of low power supply voltage and high power supply voltage are preferably supplied to the latch circuit.

In the above embodiment, it is preferable that the third transistor include an oxide semiconductor in a channel formation region and the fourth transistor include an oxide semiconductor in a channel formation region.

In the above embodiment, the plurality of memory cells are preferably provided over the precharge circuit or the latch circuit.

One embodiment of the present invention is a memory device including a plurality of memory cells, a precharge circuit, a latch circuit, a bit line pair formed of a first bit line and a second bit line, a local bit line pair formed of a first local bit line and a second local bit line; a first transistor, and a second transistor. The first transistor has a function of controlling electrical continuity between the first bit line and the first local bit line. The second transistor has a function of controlling electrical continuity between the second bit line and the second local bit line. The plurality of memory cells are each classified as a first memory cell or a second memory cell. Each of the first memory cells includes a third transistor and a first capacitor. Each of the second memory cells includes a fourth transistor and a second capacitor. The third transistor has a function of controlling electrical continuity between the first local bit line and the first capacitor. The fourth transistor has a function of controlling electrical continuity between the second local bit line and the second capacitor. The precharge circuit has a function of supplying a precharge voltage to the local bit line pair. The latch circuit is electrically connected to the local bit line pair. When the first transistor, the second transistor, the third transistor, and the fourth transistor are off, the precharge voltage and one of low power supply voltage and high power supply voltage are preferably supplied to the latch circuit.

In the above embodiment, it is preferable that the third transistor include an oxide semiconductor in a channel formation region and the fourth transistor include an oxide semiconductor in a channel formation region.

In the above embodiment, the plurality of memory cells are preferably provided over the precharge circuit or the latch circuit.

One embodiment of the present invention is a semiconductor wafer including a plurality of the memory devices described as the above embodiments and a separation region.

One embodiment of the present invention is an electronic device including the memory device described as the above embodiments and a battery.

Effect of the Invention

One embodiment of the present invention can provide a memory device with low power consumption. Furthermore, one embodiment of the present invention can provide a memory device with a small circuit area. One embodiment of the present invention can provide a semiconductor device with low power consumption. Furthermore, one embodiment of the present invention can provide a semiconductor device with a small circuit area. Furthermore, one embodiment of the present invention can provide a novel semiconductor device.

Note that description of the plurality of effects does not preclude the existence of other effects. Furthermore, One embodiment of the present invention does not necessarily obtain all the effects listed above. In one embodiment of the present invention, an object other than the objects described as examples, an effect other than the effects described as examples, and a novel feature will be apparent from description of the specification and the like.

BRIEF DESCRIPTION OF THE DRAWINGS

FIGS. 17A to 17C A top view and cross-sectional views illustrating a structure example of a transistor.

FIGS. 18A to 18C A top view and cross-sectional views illustrating a structure example of a transistor.

FIGS. 19A to 19C A top view and cross-sectional views illustrating a structure example of a transistor.

FIGS. 22A and 22B Top views illustrating a semiconductor wafer.

DETAILED DESCRIPTION OF THE INVENTION

Figure 1:
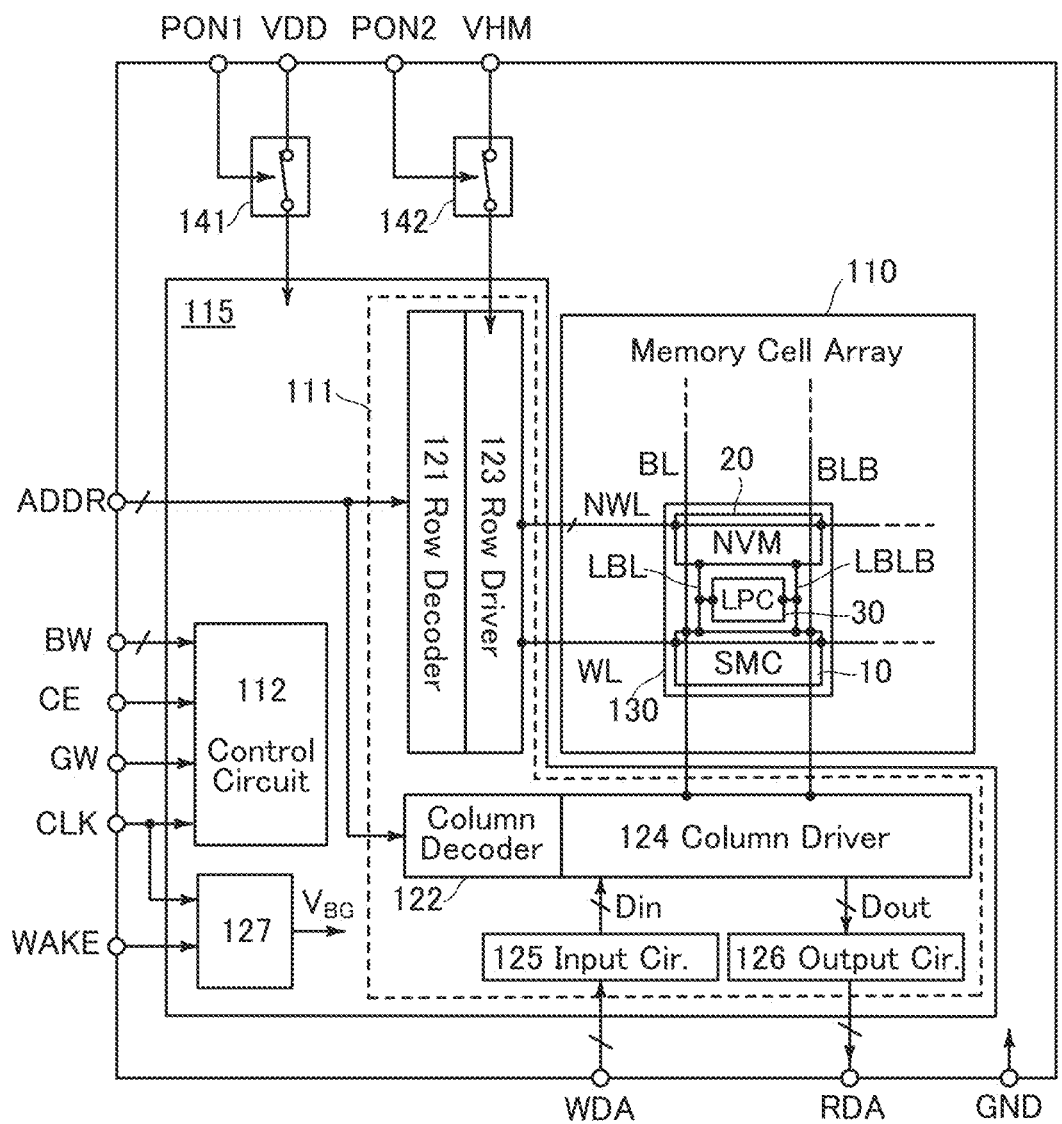
FIG. 1 A block diagram illustrating a structure example of a memory device.

Embodiments of the present invention will be described in detail with reference to the drawings. Note that it will be readily appreciated by those skilled in the art that modes and details of the present invention can be modified in various ways without departing from the spirit and scope of the present invention. Therefore, the present invention should not be limited to description of embodiments and an example below.

Note that in structures of the present invention described below, the same portions or portions having similar functions are denoted by the same reference numerals in different drawings, and description thereof is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Unless otherwise specified, on-state current in this specification refers to drain current of a transistor in an on state. Unless otherwise specified, the on state of an re-channel transistor means that the voltage ($V_G$) between its gate and source is higher than or equal to the threshold voltage ($V_{th}$), and the on state of a p-channel transistor means that $V_G$ is lower than or equal to $V_{th}$. For example, the on-state current of an n-channel transistor refers to drain current that flows when $V_G$ is higher than or equal to $V_{th}$. Furthermore, the on-state current of a transistor depends on a voltage between a drain and a source ($V_D$) in some cases.

Unless otherwise specified, off-state current in this specification refers to drain current of a transistor in an off state. Unless otherwise specified, the off state of an re-channel transistor means that $V_G$ is lower than $V_{th}$, and the off state of a p-channel transistor means that $V_G$ is higher than $V_{th}$. For example, the off-state current of an n-channel transistor refers to drain current that flows when $V_G$ is lower than $V_{th}$. The off-state current of a transistor depends on $V_G$ in some cases. Thus, "the off-state current of a transistor is lower than $10^{-21}$ A" may mean that there is $V_G$ at which the off-state current of the transistor is lower than $10^{-21}$ A.

Furthermore, the off-state current of a transistor depends on $V_D$ in some cases. Unless otherwise specified, the off-state current in this specification may be off-state current at $V_D$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at $V_D$ used in a semiconductor device or the like including the transistor.

In this specification and the like, one of a source and a drain is denoted as "one of a source and a drain" (or a first electrode or a first terminal) and the other of the source and the drain is denoted as "the other of the source and the drain" (or a second electrode or a second terminal) in the description of the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

Note that in this specification, a high power supply voltage and a low power supply voltage are sometimes referred to as an H level (or VDD) and an L level (or GND), respectively.

Furthermore, in this specification, the embodiments and the example described below can be combined as appropriate. In addition, in the case where a plurality of structure examples are described in one embodiment, some of the structure examples can be combined with each other as appropriate.

Embodiment 1

In this embodiment, a memory device will be described as an example of a semiconductor device.

A memory device of this embodiment is nonvolatile, and includes a memory portion A that enables high-speed processing and a memory portion B that can retain data for a long time even when power is off.

The memory portion A corresponds to a working memory, and data is exchanged between a host device and the memory device. The memory portion B corresponds to a long-term memory storage portion, and retains information written in the memory portion A for a long time. The memory portion B has a lower processing speed than the memory portion A, but has a higher capacity than the memory portion A. Moreover, the memory portion B can retain data for a long time in a state where the power is off <<Memory Device 100>>

FIG. 1 is a block diagram illustrating a structure example of a memory device. A memory device 100 illustrated in FIG. 1 includes a memory cell array 110, a peripheral circuit 111, a control circuit 112, a voltage generation circuit 127, and power switches (PSWs) 141 and 142.

In the memory device 100, each circuit, each signal, and each voltage can be appropriately selected as needed. Alternatively, another circuit or another signal may be added. Signals BW, CE, GW, CLK, WAKE, ADDR, WDA, PON1, and PON2 are signals input from the outside, and a signal RDA is a signal output to the outside. The signal CLK is a clock signal. The signals CE, GW, and BW are control signals. The signal CE is a chip enable signal, the signal GW is a global write enable signal, and the signal BW is a byte write enable signal. The signal ADDR is an address signal. The signal WDA is write data, and the signal RDA is read data. The signals PON1 and PON2 are power gating control signals. Note that the signals PON1 and PON2 may be generated in the control circuit 112.

The control circuit 112 is a logic circuit having a function of controlling the entire operation of the memory device 100. For example, the control circuit performs a logical operation on the signals CE, GW, and BW to determine an operation mode of the memory device 100 (e.g., writing operation or reading operation). Alternatively, the control circuit 112 generates a control signal for the peripheral circuit 111 so that the operation mode is executed.

The memory cell array 110 includes a plurality of memory cells (MC) 130 and a plurality of wirings WL, NWL, BL, and BLB. The plurality of memory cells 130 are arranged in a matrix.

The memory cells 130 that are arranged in a row are electrically connected to the wirings WL and NWL in the row. The wirings WL and NWL are each a word line, and the wirings BL and BLB are a bit line pair for transmitting complementary data. The wiring BLB is a bit line to which data whose logic is inverted from that of the wiring BL, and is referred to as a complementary bit line or an inverted bit line in some cases. The memory cell 130 includes two kinds of memory circuits 10 and 20. The memory circuit 10 (hereinafter referred to as "SMC 10") is a memory circuit that can store 1-bit complementary data. The memory circuit 20 (hereinafter referred to as "NVM 20") is a memory circuit that can store n-bit (n is an integer larger than 1) complementary data, and can retain data for a long time in a state where power is off. That is, the SMC 10 is a memory cell that constitutes the above-described memory portion A (working memory), and the NVM 20 is a memory cell that constitutes the above-described memory portion B (long-term memory storage portion).

The voltage generation circuit 127 has a function of generating a negative voltage ($V_{BG}$). $V_{BG}$ is applied to a transistor used in the NVM 20. WAKE has a function of controlling the input of CLK to the voltage generation circuit 127. For example, when an H-level signal is applied as WAKE, the signal CLK is input to the voltage generation circuit 127, and the voltage generation circuit 127 generates $V_{BG}$. Note that the details of the voltage generation circuit 127 are described with reference to after-mentioned FIG. 10 and FIG. 11.

The SMC 10 and the NVM 20 are electrically connected through a local bit line pair (wirings LBL and LBLB). The wiring LBLB is a local bit line with respect to the wiring BL, and the wiring LBLB is a local bit line with respect to the wiring BLB. The SMC 10 and the NVM 20 are electrically connected through the wirings LBL and LBLB. The memory cell 130 includes a circuit 30 (hereinafter referred to as "LPC 30"). The LPC 30 is a local precharge circuit for precharging the wiring LBL and the wiring LBLB. A control signal for the LPC 30 is generated in the peripheral circuit 111.

The peripheral circuit 111 is a circuit for writing and reading data to/from the memory cell array 110. The peripheral circuit 111 has a function of driving the wirings WL, NWL, BL, and BLB. The peripheral circuit 111 includes a row decoder 121, a column decoder 122, a row driver 123, a column driver 124, an input circuit 125, and an output circuit 126.

The row decoder 121 and the column decoder 122 have a function of decoding the signal ADDR. The row decoder 121 is a circuit for specifying a row to be accessed, and the column decoder 122 is a circuit for specifying a column to be accessed. The row driver 123 has a function of selecting the wirings WL and NWL in a row specified by the row decoder 121. Specifically, the row driver 123 has a function of generating a signal for selecting the wirings WL and NWL. The column driver 124 has a function of writing data to the memory cell array 110, reading data from the memory cell array 110, retaining the read data, precharging the wirings BL and BLB, and the like.

The input circuit 125 has a function of retaining the signal WDA. Data retained by the input circuit 125 is output to the column driver 124. Data output from the input circuit 125 is data written to the memory cell array 110. Data (Dout) read from the memory cell array 110 by the column driver 124 is output to the output circuit 126. The output circuit 126 has a function of retaining Dout. The output circuit 126 outputs the retained data to the outside of the memory device 100. The output data is the signal RDA.

The PSW 141 has a function of controlling the supply of VDD to a circuit other than the memory cell array 110 (to a peripheral circuit 115). The PSW 142 has a function of controlling the supply of VHM to the row driver 123. Here, in the memory device 100, a high power supply voltage is VDD and a low power supply voltage is GND (a ground potential). In addition, VHM is a high power supply voltage used for setting the wiring NWL to a high level and is higher than VDD. The on/off of the PSW 141 is controlled by the signal PON1, and the on/off of the PSW 142 is controlled by the signal PON2. The number of power domains to which VDD is supplied is one in the peripheral circuit 115 in FIG. 1 but can be plural. In that case, a power switch is provided for each power domain.

<<Memory Cell 130>>

Figure 2:
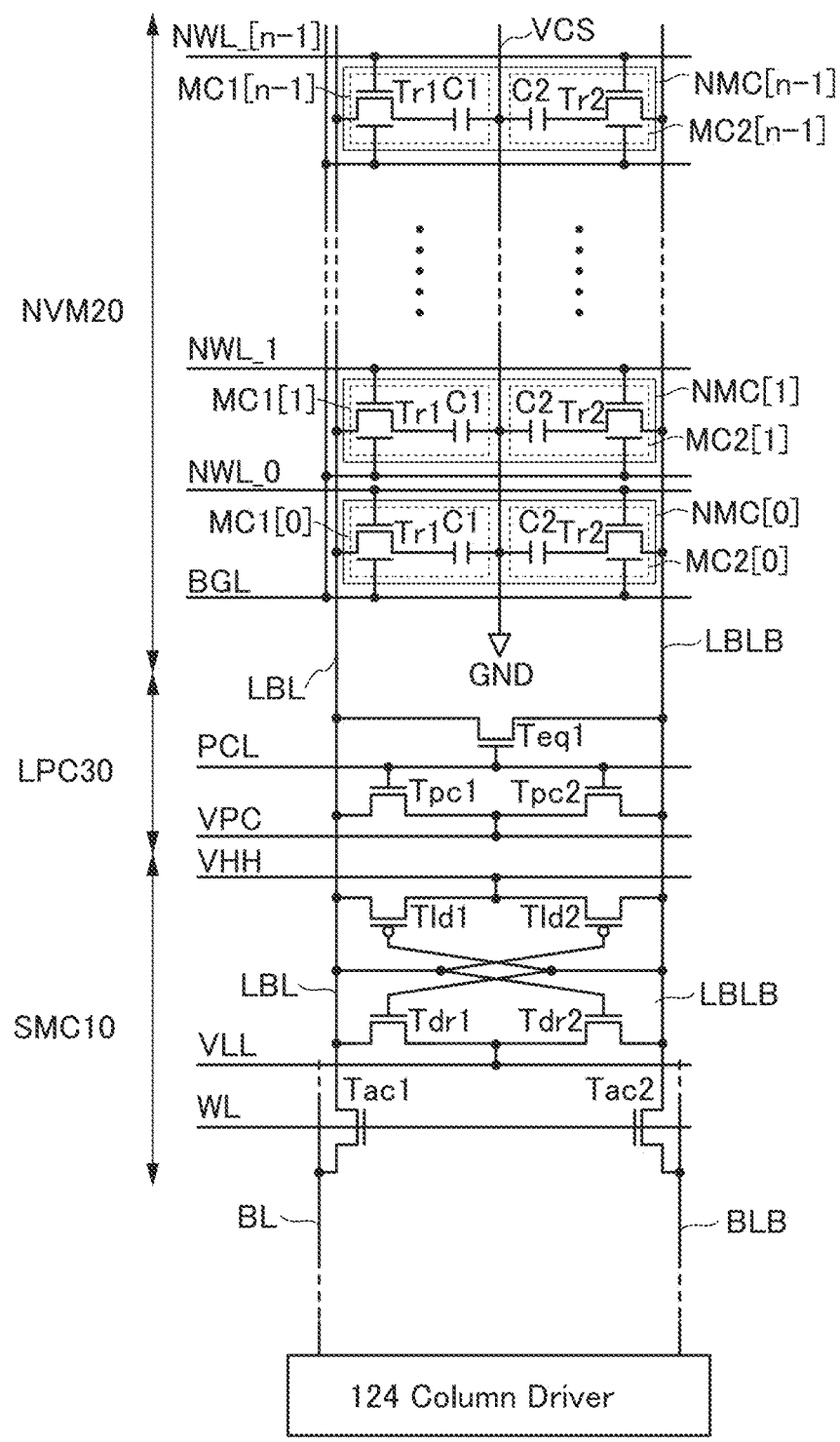
FIG. 2 A circuit diagram illustrating a structure example of a memory cell.

FIG. 2 illustrates a circuit structure example of the memory cell 130.

<SMC 10>

The SMC 10 is electrically connected to the wiring BL, the wiring BLB, the wiring LBL, the wiring LBLB, a wiring VHH, and a wiring VLL.

The SMC 10 has a circuit structure similar to that of a CMOS type (6-transistor type) SRAM cell and includes transistors Tld1, Tld2, Tdr1, Tdr2, Tac1, and Tac2. The transistors Tld1 and Tld2 are load transistors (pull-up transistors), the transistors Tdr1 and Tdr2 are driving transistors (pull-down transistors), and the transistors Tac1 and Tac2 are access transistors (transfer transistors).

By the transistor Tac1, electrical continuity between the wiring BL and the wiring LBL is controlled. By the transistor Tac2, electrical continuity between the wiring BLB and the wiring LBLB is controlled. The on/off of the transistors Tac1 and Tac2 is controlled by the potential of the wiring WL. The transistors Tld1 and Tdr1 form an inverter, and the transistors Tld2 and Tdr2 form an inverter. Input terminals of these two inverters are electrically connected to one another's output terminals, whereby a latch circuit is formed. A power supply voltage is supplied to the two inverters through the wirings VHH and VLL.

<NVM 20>

The NVM 20 illustrated in FIG. 2 includes n (n is an integer larger than or equal to 1) NMCs. The n NMCs are electrically connected to different wirings NWL. Furthermore, the n NMCs are electrically connected to one wiring VCS. To distinguish the n NMCs from each other, signs such as [0] and [1] are used. To distinguish the n wirings NWL from each other, signs such as _0 and _1 are used.

The NMC is a memory circuit (also can be referred to as a memory cell) that can retain 1-bit complementary data. The NMC includes an MC 1 and an MC 2. The MC 1 is a memory cell for retaining data written to the wiring LBL, and the MC 2 is a memory cell for retaining data written to the wiring LBLB. The MC 1 and MC 2 each have a circuit structure similar to that of a 1-transistor 1-capacitor type dynamic random access memory (DRAM) memory cell. The MC 1 includes a transistor Tr1 and a capacitor C1. The MC 2 includes a transistor Tr2 and a capacitor C2. The capacitor C1 functions as a storage capacitor of the MC 1, and the capacitor C2 functions as a storage capacitor of the MC 2. The wiring VCS is a power supply line for the storage capacitors of the MC 1 and MC 2, and GND is input here.

A gate (first gate) of each of the transistors Tr1 and Tr2 is electrically connected to the wiring NWL. One of a source and a drain of the transistor Tr1 is electrically connected to the wiring LBL, and one of a source and a drain of the transistor Tr2 is electrically connected to the wiring LBLB. A first terminal of the capacitor C1 is electrically connected to the other of the source and the drain of the transistor Tr1, and a second terminal of the capacitor C1 is electrically connected to the VCS. A first terminal of the capacitor C2 is electrically connected to the other of the source and the drain of the transistor Tr2, and a second terminal thereof is electrically connected to the VCS.

Each of the transistors Tr1 and Tr2 includes a second gate. The second gate of each of the transistors Tr1 and Tr2 is electrically connected to a wiring BGL. The wiring BGL is a signal line to which a signal for controlling the potential of the second gates of the transistors Tr1 and Tr2 is input, or a power supply line to which a fixed potential is input. The threshold voltages of the transistors Tr1 and Tr2 can be controlled by the potential of the wiring BGL. Thus, the transistors Tr1 and Tr2 can be prevented from being normally on.

Reducing the off-state current of the transistors Tr1 and Tr2 can increase the retention time of the NMC. An ultralow off-state current means that, for example, off-state current per micrometer of channel width is lower than or equal to 100 zA (zeptoamperes). Note that since the off-state current is preferably as low as possible, the normalized off-state current is preferably lower than or equal to 10 zA/μm or lower than or equal to 1 zA/μm, further preferably lower than or equal to 10 yA (yoctoamperes)/μm. Note that 1 zA is $1 \times 10^{-21}$ A and 1 yA is $1 \times 10^{-24}$ A.

To obtain such an ultralow off-state current, a channel formation region of a transistor is formed using a semiconductor with a wide bandgap. An example of such a semiconductor is an oxide semiconductor. An oxide semiconductor has a bandgap of 3.0 eV or larger; thus, an OS transistor has a low leakage current due to thermal excitation and also has an extremely low off-state current. Note that the details of the OS transistor and the oxide semiconductor will be explained in after-mentioned Embodiment 3.

When the transistors Tr1 and Tr2 are OS transistors, the retention time of the NMC can be prolonged, and the NMC can be used as a nonvolatile memory circuit. Moreover, the OS transistor has small temperature dependence of off-state current characteristics. Thus, the normalized off-state current of the OS transistor can be lower than or equal to 100 zA even at high temperatures (e.g., 100° C. or higher). Thus, when the OS transistor is applied to the NMC, data can be retained without being lost even in a high-temperature environment. As a result, the memory device 100 having high reliability even in a high-temperature environment can be obtained.

The NMC can retain complementary data by including a pair of memory cells (MC 1 and MC 2), and can retain the complementary data for a long time by using OS transistors as the transistors Tr1 and Tr2. Since the complementary data is retained in the NMC, the SMC 10 can function as a differential amplifier circuit at the time of reading the complementary data retained in the NMC. For this reason, even when a voltage difference between the voltage retained by the capacitor C1 of the MC 1 and the voltage retained by the capacitor C2 of the MC 2 is small, reading operation with high reliability can be performed. Moreover, the NMC can perform high-speed reading operation and high-speed writing operation as well as a DRAM memory cell does.

Note that the second gates of the transistor Tr1 and the transistor Tr2 included in the NVM 20 may be omitted depending on circumstances. In the case where the transistor Tr1 and the transistor Tr2 do not include the second gates, the manufacturing process of the memory device 100 can be simplified. Furthermore, the voltage generation circuit 127 illustrated in FIG. 1 can also be omitted.

<LPC 30>

The LPC 30 is electrically connected to a wiring PCL and a wiring VPC. The wiring PCL is a signal line for supplying a signal for controlling the precharge operation of the wirings LBL and LBLB. The wiring VPC is a power supply line for supplying a precharge voltage. The LPC 30 includes transistors Teq1, Tpc1, and Tpc2. Gates of the transistors Teq1, Tpc1, and Tpc2 are electrically connected to the wiring PCL. The transistor Teq1 controls the electrical continuity between the wirings LBL and LBLB. The transistor Tpc1 controls the electrical continuity between the wirings LBL and VPC. The transistor Tpc2 controls the electrical continuity between the wirings LBLB and VPC.

In the example in FIG. 2, the transistors Teq1, Tpc1, and Tpc2 are n-channel transistors, but they may be p-channel transistors. Alternatively, the transistor Teq1 is not necessarily provided in the LPC 30. In that case, each of the transistors Tpc1 and Tpc2 may be either an n-channel transistor or a p-channel transistor. Alternatively, the LPC 30 can be constituted only by the transistor Teq1. Also in that case, the transistor Teq1 may be either an n-channel transistor or a p-channel transistor. The LPC 30 that is constituted by the transistor Teq1 precharges the wirings LBL and LBLB by smoothing the potentials of the wiring LBL and the wiring LBLB.

The peripheral circuit 111 has a function of supplying potentials to various kinds of power supply lines (the wirings VHH, VLL, and VPC) provided in the memory cell array 110. Therefore, when the PSW 141 is turned off and the supply of VDD to the peripheral circuit 111 is stopped, the supply of potentials to these power supply lines is also stopped.

In a standby state of the memory cell 130 in FIG. 2, an increase in leakage current flowing through the SMC 10 increases static power. In order to reduce the static power, voltage that is lower than VDD should be supplied to the wiring VHH. In the case where a new voltage is supplied to the wiring VHH, however, a circuit that generates the voltage (voltage generation circuit) needs to be additionally provided, which causes an increase in area overhead. Note that the standby state used here refers to a state in which all the word lines in the memory cell 130 (the wiring WL and the wirings NWL_0 to NWL_[n−1]) are not selected.

In order to solve the above problem, in the standby state of the memory cell 130, it is preferable that GND be supplied to the wiring VLL and a precharge voltage be supplied to the wiring VHH. The precharge voltage is lower than VDD. Furthermore, the precharge voltage is also used for the LPC 30, and thus a new voltage generation circuit does not need to be provided. Furthermore, the precharge voltage may be supplied to the wiring VLL and VDD may be supplied to the wiring VHH. Supplying the precharge voltage to one of the wiring VHH and the wiring VLL can reduce the static power of the memory device 100.

<<Operation Example of Memory Device 100>>

Figure 3:
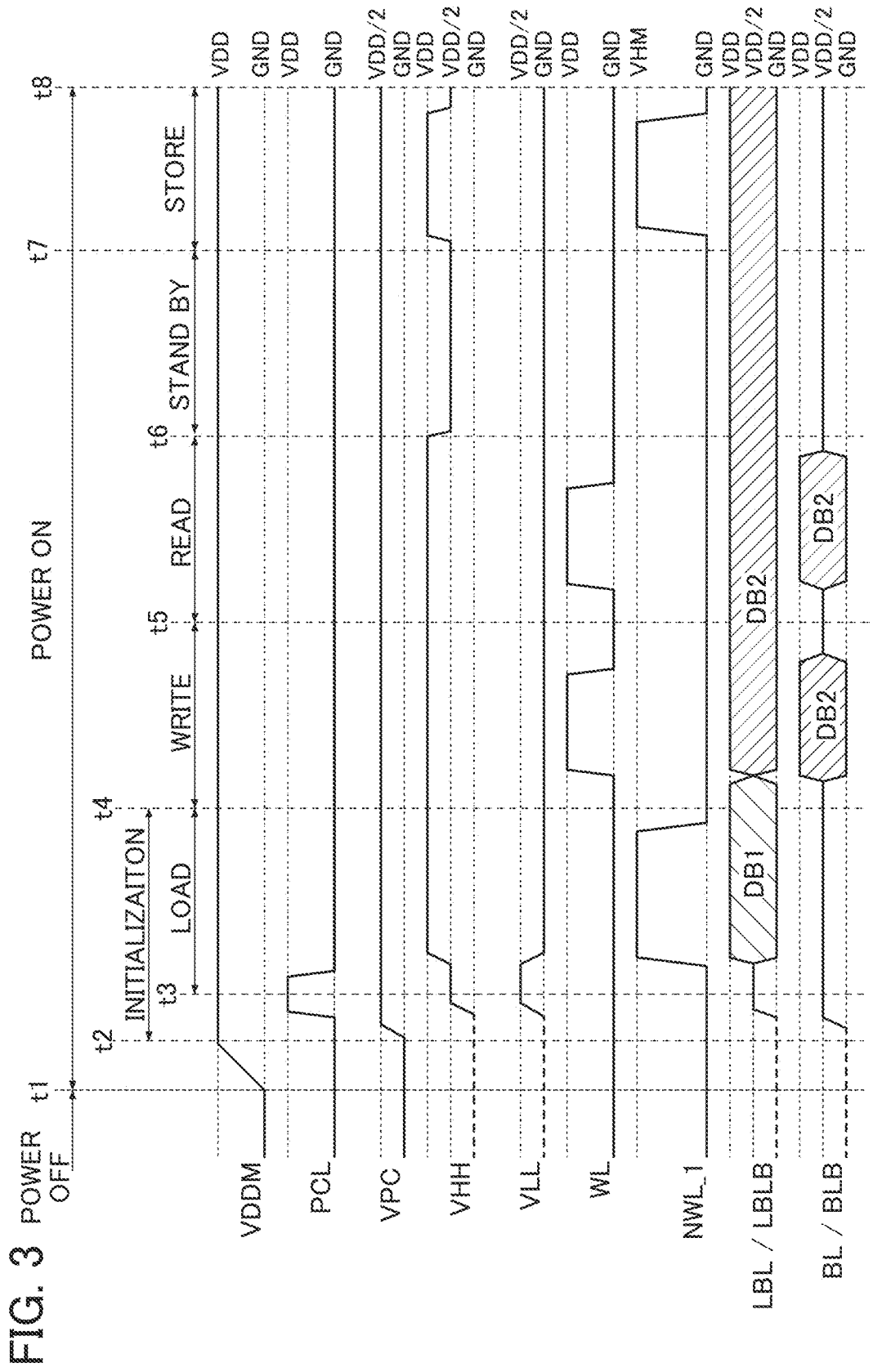
FIG. 3 A timing chart showing an operation example of a memory device.

An operation example of the memory device 100 is described using a timing chart in FIG. 3. In this example, the access target during a period in which the host device processes a task is only the SMC 10. When the task is completed, data is transferred from the SMC 10 to the NVM 20 (store operation), and the data is written to one of the NMCs in the NVM 20. Furthermore, in the case where another task is executed, the data is transferred from the one of the NMCs in the NVM 20 to the SMC 10 (load operation). Here, an operation example of the memory device 100 is described assuming that the transfer destination and the transfer source of the data are NMC [1].

Time t1 to t8 denoted in FIG. 3 represent timings of operations. A wiring VDDM is a power supply line for VDD supply that is provided in the memory device 100. The supply of VDD to the wiring VDDM is controlled by the PSW 141. In addition, for the wirings VHH, VLL, and the like, waveforms represented by dotted lines show that the potentials are uncertain. Furthermore, a low level (L level) for the wiring VDDM or the like is GND. A high level (H level) for the wirings PCL and WL is VDD, and a high level for the wirings NWL_0 to NWL_[n−1] is VHM.

Note that the reason why the high level for the wirings NWL_0 to NWL_[n−1] is VHM is that the threshold voltages of the transistors Tr1 and Tr2 are assumed to be higher than the threshold voltages of the other transistors such as the transistor Tac1. In the case where data can be written to/read from the NVM 20 by applying VDD to the wirings NWL_0 to NWL_[n−1], the high level for the wirings NWL_0 to NWL_[n−1] can be set to VDD. In that case, the PSW 142 is not necessarily provided in the memory device 100 (see FIG. 1).

<Power Gating>

First, the power gating operation of the memory device 100 is described. Before Time t1, the memory device 100 is in a power-off state in which the supply of VDD is stopped. After Time t1, the memory device 100 is in a power-on state in which VDD is supplied.

Before Time t1, the PSW 141 is turned off and the memory device 100 is in the power-off state. The wiring VDDM is at GND. In addition, the wirings WL, NWL_0 to NWL_[n−1], PCL, and VPC are also at GND because the supply of VDD to the peripheral circuit 111 is also stopped when the PSW 141 is turned off.

When the PSW 141 is turned on at Time t1, the wiring VDDM is charged, and then its potential is increased to VDD. A period from Time t1 to t2 is a time required for power supply resumption. Note that in the timing chart in FIG. 3, the PSW 142 is turned on and off in accordance with the on/off of the PSW 141.

<Initialization, Load>

When the power is from t2 to t4, an initialization operation for bringing the memory device 100 into an initial state is performed. In the operation from Time t2 to t3, the bit line pair and the local bit line pair are precharged. Specifically, the wiring VPC, the wiring VHH, and the wiring VLL are set to VDD/2. The bit line pair (wirings BL and BLB) and the local bit line pair (wirings LBL and LBLB) are each precharged to VDD/2. The precharging of the bit line pair is performed by the column driver 124, and the precharging of the local bit line pair is performed by the LPC 30. By setting the wiring PCL to a high level (H level), the transistors Teq1, Tpc1, and Tpc2 are turned on, and precharging and potential smoothing of the wirings LBL and LBLB are performed.

From t3 to t4, the memory device 100 performs load operation. Data is load from the NMC [1] in the NVM 20 to the SMC 10. Here, the NMC [1] stores data DB1. The wiring PCL is set to an L level so that the wirings LBL and LBLB are brought into a floating state. Next, the wiring NWL_1 is set to an H level so that the transistor Tr1 of an MC1 [1] and the transistor Tr2 of an MC2 [1] are turned on. The data DB1 is written to the wirings LBL and LBLB. After the wiring NWL_1 is set to an H level, the wiring VHH is set to VDD and the wiring VLL is set to GND, whereby the SMC 10 is made active. The SMC 10 amplifies and retains the data DB1 written to the wirings LBL and BLBL. In the case where the MC1 [1] retains "1", the wiring LBL becomes VDD and the wiring LBLB becomes GND. The wiring NWL_1 is kept at an H level for a certain period, and then set to an L level; thus, the load operation is completed.

<Writing>

From Time t4 to t5, the memory device 100 performs data writing operation. Here, data written to the SMC 10 is data DB2. When write access occurs, the data DB2 is written to the bit line pair by the column driver 124. Here, when the wiring BL is at VDD, the wiring BLB is at GND. The row address is decoded by the row decoder 121, and the wiring WL in a row specified by the row address is set to an H level by the row driver 123. Thus, the transistors Tac1 and Tac2 are turned on, and the data DB2 is written to the local bit line pair. The wiring WL is kept at an H level for a certain period, and then set to an L level. After the wiring WL is set to an L level, the bit line pair are precharged to VDD/2 and then brought into a floating state by the column driver 124. The writing operation is thus completed.

<Reading>

From Time t5 to t6, the memory device 100 performs data reading operation. When reading access occurs, the row address is decoded by the row decoder 121, and the wiring WL in a row specified by the row address is set to an H level by the row driver 123. Thus, the transistors Tac1 and Tac2 are turned on, and the data DB2 of the local bit line pair is written to the bit line pair. The data DB2 written to the bit line pair is read by the column driver 124. The wiring WL is kept at an H level for a certain period, and then set to an L level. After the wiring WL is set to an L level, the bit line pair is charged to VDD/2 and then brought into a floating state by the column driver 124. The data reading operation is thus completed.

<Standby>

From Time t6 to t7, the memory device 100 is in a standby state where access is not requested from the host device. By making the SMC 10 active at this time, the memory device 100 can respond quickly to the next access request. Furthermore, by lowering the wiring VHH from VDD to VDD/2 at this time, the static power of the SMC 10 can be reduced in the memory device 100. In FIG. 3, the static power of the memory device 100 is reduced by setting the wiring VHH to VDD/2 and the wiring VLL to GND; alternatively, the static power may be reduced by setting the wiring VHH to VDD and the wiring VLL to VDD/2.

Note that in this embodiment, the precharge voltage is set to VDD/2, but not limited to this. The value of the precharge voltage can be selected in the range higher than GND and lower than VDD.

Note that the above-described operation for static power reduction may be performed individually on the memory cell 130. Specifically, in the case where the memory cell 130 for which access is required and the memory cell 130 in a standby state coexist in the memory device 100, the above-described operation for static power reduction may be performed only on the memory cell 130 in a standby state.

<Store>

From Time t7 to t8, the memory device 100 performs data transfer (store) operation. When the memory device 100 receives an instruction to execute another task or an instruction to terminate a task from the host device, the memory device 100 performs store operation. First, the wiring VHH is returned to VDD, and the wiring NWL_1 is set to an H level. The data DB2 written to the local bit line pair is written to the NMC [1]. Here, when the wiring LBL is at VDD, the MC1 [1] retains "1" and the MC2 [1] retains "0".

The wiring NWL_1 is kept at an H level for a certain period, and then set to an L level. The store operation is thus completed. Next, the memory device 100 sets the wiring VHH to VDD/2 and waits an instruction from the host device. After that, the memory device 100 performs data reading operation or data writing operation in accordance with access request from the host device.

<<Modification Example of Memory Cell>>

Figure 4:
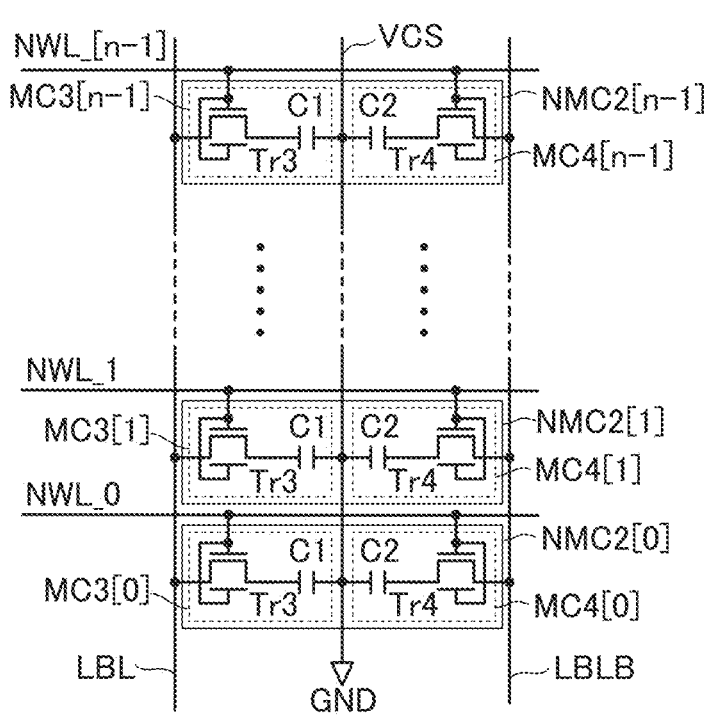
FIG. 4 A circuit diagram illustrating a structure example of a memory cell.

An NVM 21 illustrated in FIG. 4 is a memory circuit including n NMCs 2. The NMC 2 includes an MC 3 and an MC 4. The MC 3 is a modification example of the MC 1, and is provided with a transistor Tr3 instead of the transistor Tr1. The MC 4 is a modification example of the MC 2, and is provided with a transistor Tr4 instead of the transistor Tr2.

The transistor Tr3 is provided with a second gate, and the second gate and a first gate are electrically connected. Similarly, the transistor Tr4 is provided with a second gate, and the second gate and a first gate are electrically connected. Electrical connection between the second gate and the first gate can improve the on-state current of the transistors Tr3 and Tr4.

<<Device Structure of Memory Cell Array>>

Figure 5:
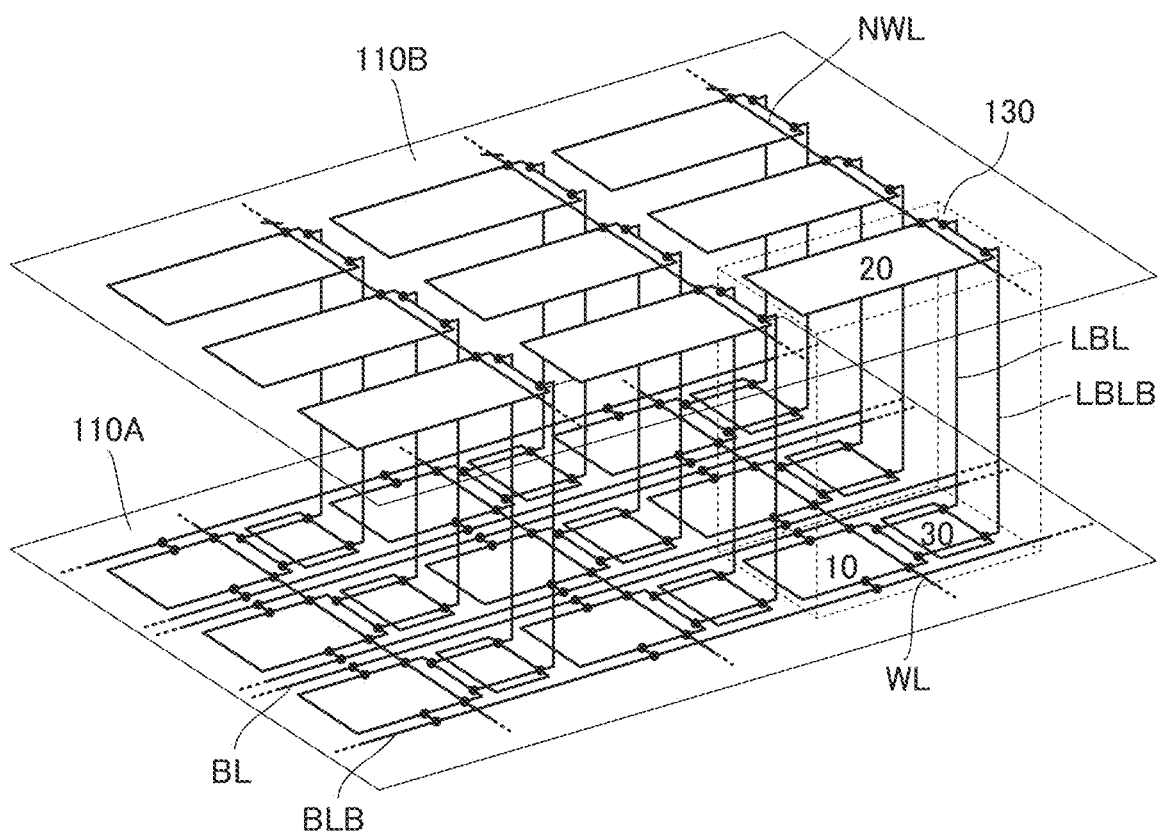
FIG. 5 A block diagram illustrating a configuration example of a memory cell array.

In the memory device 100, the transistors Tr1 and Tr2 in the NVM 20 can be OS transistors and the other transistors can be, for example, Si transistors or the like. In that case, the memory cell array 110 can have a device structure in which a circuit including the OS transistors is stacked over a circuit including the Si transistors. FIG. 5 schematically illustrates an example of a device structure of the memory cell array 110.

<Memory Cell Array>

In the example of FIG. 5, a memory cell array 110B is stacked over a memory cell array 110A. In the memory cell array 110A, SMCs 10 and LPCs 30 are arranged in a matrix. In the memory cell array 110B, NVMs 20 are arranged in a matrix. The memory cell array 110A forms the memory portion A with a high response speed. The memory cell array 110B forms the memory portion B for long-term data storage. By stacking the memory cell array 110B over the memory cell array 110A, an increase in capacity and a reduction in size of the memory device 100 can be performed effectively.

<Twin Cell Architecture>

Figure 6:
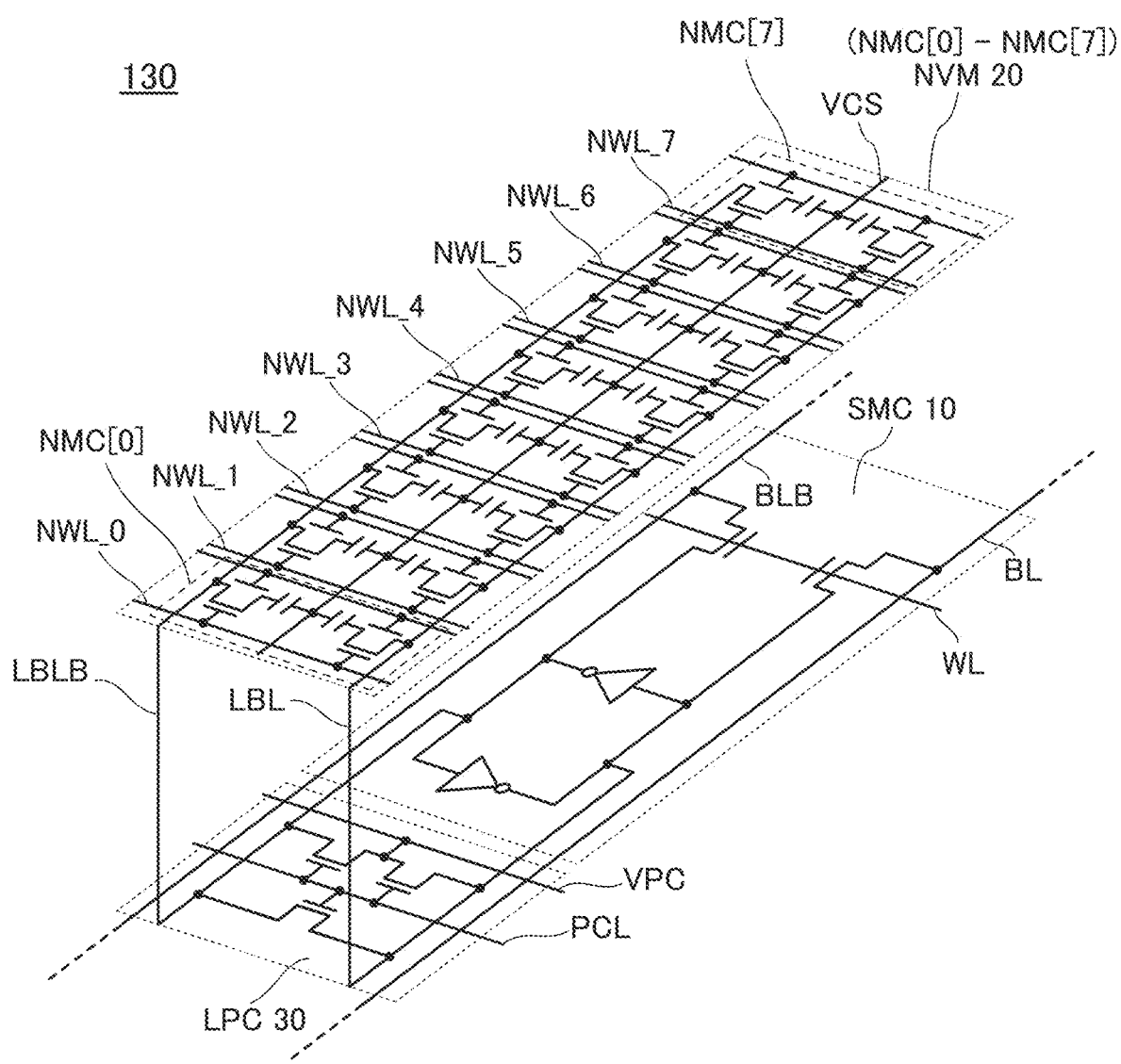
FIG. 6 A circuit diagram illustrating a configuration example of a memory cell.

Focusing on one of the memory cells 130, the NVM 20 is formed over a region where the SMC 10 and the LPC 30 are formed. FIG. 6 is a circuit diagram schematically illustrating an example of a device structure of the memory cell 130. FIG. 6 shows an example in which the NVM 20 has a circuit configuration for storing 8-bit complementary data. Thus, the NVM 20 includes NMC [0] to NMC [7]. The NMC [0] to NMC [7] are provided over the region where the SMC 10 and the LPC 30 are formed. Note that the above-described structure of the memory cell 130 (the structure in which two complementary memory cells (MC 1 and MC 2) are connected to one wiring NWL) is called twin cell architecture.

Note that in the memory cell 130, the number of NMCs is preferably a multiple of 8. That is, the number of bits of data that can be retained by the NVM 20 is preferably a multiple of 8. When the number of NMCs is a multiple of 8, the memory cell 130 can handle data in units, for example, of bytes (8 bits), words (32 bits), or half-words (16 bits) units.

Figure 7:
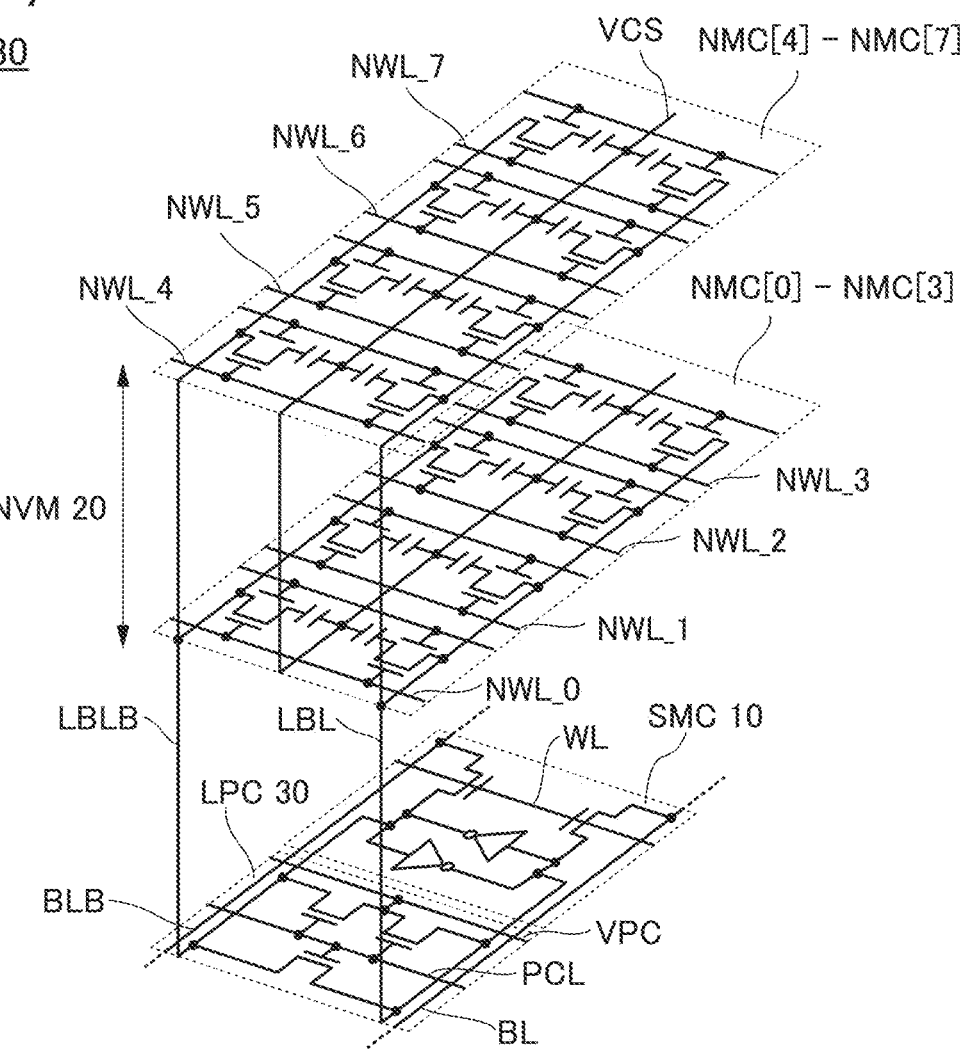
FIG. 7 A circuit diagram illustrating a configuration example of a memory cell.

An OS transistor can be stacked over an OS transistor. Accordingly, the memory cell array 110B can have a device structure in which two or more layers of circuits are stacked. FIG. 7 illustrates an example of a device structure of the memory cell 130 in the case where two memory cell arrays 110B are stacked. Also here, the NVM 20 includes the NMC [0] to NMC [7]. The NMC [0] to NMC [3] are stacked over the region where the SMC 10 and the LPC 30 are formed, and the NMC [4] to NMC [7] are stacked over the region where the NMC [0] to NMC [3] are formed.

Stacking of the memory cell array 110B over the memory cell array 110A achieves a high capacity and a small size of the memory cell array 110. For example, in the case where the memory cell 130 has the device structure of FIG. 6, the area of the memory cell array 110 per bit equals to the area of one NMC. That is, the area per bit equals to the area of a region where two transistors and two capacitors are provided. Furthermore, in the case where the memory cell 130 has the device structure of FIG. 7, the area of the memory cell array 110 per bit equals to ½ of that of the example in FIG. 6. By stacking and providing the NVM 20 over the SMC 10 in such a manner, the area of the memory cell 130 per bit is small as compared with that of a CMOS type SRAM memory cell.

The memory cell array 110B including the NVMs 20 is highly compatible with a CMOS circuit as compared with other nonvolatile memories such as a flash memory, an MRAM (magnetoresistive random access memory), and a PRAM (phase-change random access memory). A flash memory requires a high voltage for driving. An MRAM and a PRAM are each a current-drive memory, and therefore, an element or a circuit for current drive are required. In contrast, the NVM 20 is operated by controlling the on/off of the transistors Tr1 and Tr2. That is, the NVM 20 is a circuit including voltage-drive transistors like a CMOS circuit and can be driven at a low voltage. Therefore, a processor and the memory device 100 can be easily incorporated in one chip. Furthermore, the area of the memory device 100 per bit can be reduced without performance degradation. Still furthermore, power consumption of the memory device 100 can be reduced. Moreover, the memory device 100 can store data even in a power-off state, and thus, the power gating of the memory device 100 can be performed.

An SRAM is operated at high speed and therefore used in an on-chip cache memory of a standard processor. An SRAM has the following drawbacks: power is consumed even in a standby state, and it is difficult to increase the capacity. For example, it is said that, in a processor for a mobile device, power consumption of an on-chip cache memory in a standby state accounts for 80% of the average power consumption of the whole processor. In contrast, the memory device 100 is a RAM that has advantages of an SRAM, which are high-speed reading and writing, and does not have the drawbacks of an SRAM. Thus, the use of the memory device 100 in an on-chip cache memory is advantageous in reducing the power consumption of the whole processor.

<Folded Architecture>

Figure 8:
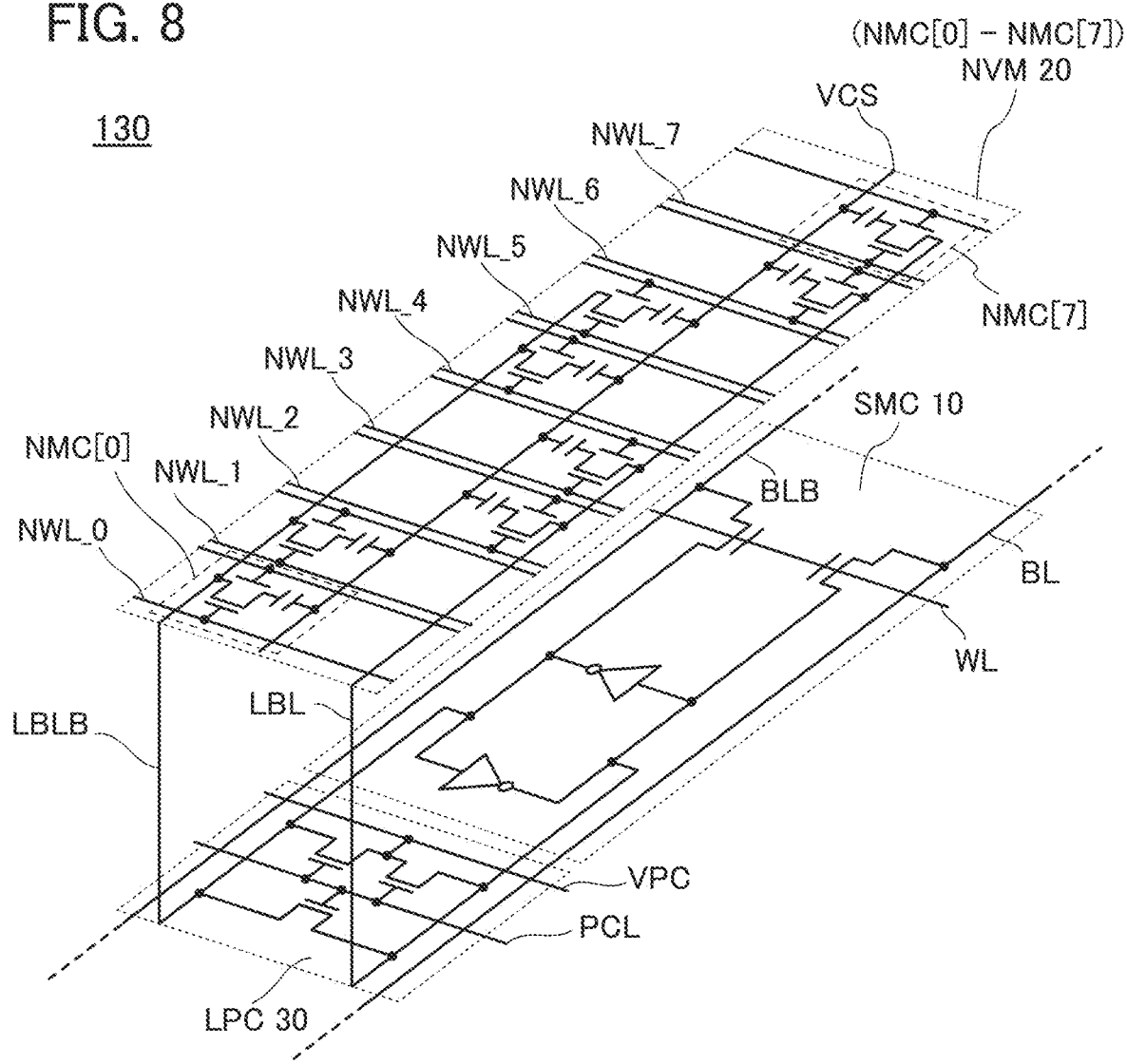
FIG. 8 A circuit diagram illustrating a configuration example of a memory cell.

Examples of other layouts of a memory cell include a folded architecture and an open architecture. FIG. 8 illustrates an example in which a folded architecture is applied to the memory cell 130. In the memory cell 130 with the twin cell architecture illustrated in FIG. 6, the NMC includes two transistors and two capacitors; whereas in the memory cell 130 with the folded architecture in FIG. 8, the NMC includes one transistor and one capacitor. In the memory cell 130 with the folded architecture, the NMCs are classified as ones connected to the wiring LBL and ones connected to the wiring LBLB. With the use of the folded architecture for the memory cell 130, noise that is output to the wiring LBL or the wiring LBLB by a change in the potential of the wiring NWL can be reduced.

<Open Architecture>

Figure 9:
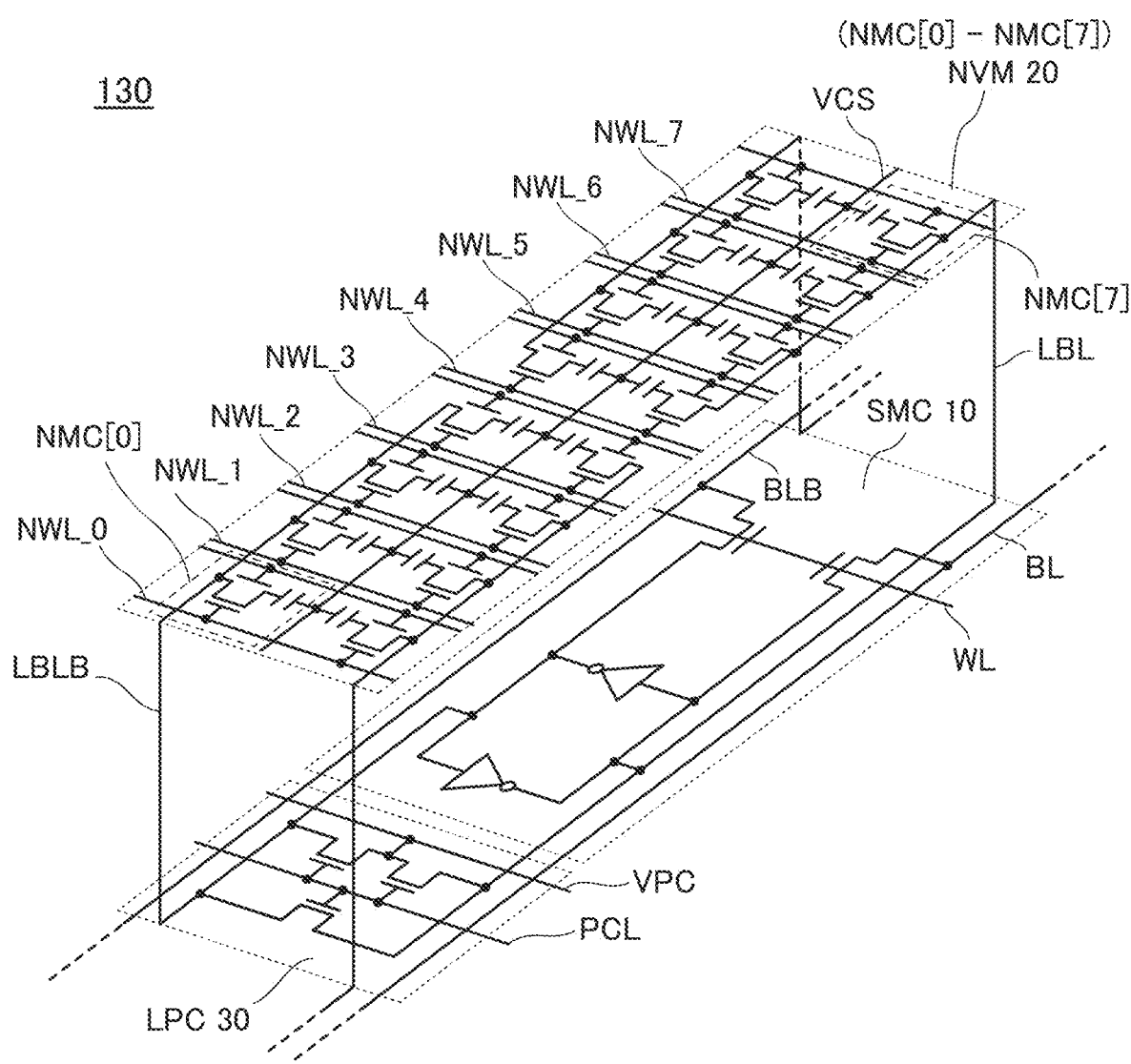
FIG. 9 A circuit diagram illustrating a configuration example of a memory cell.

FIG. 9 illustrates an example in which an open architecture is applied to the memory cell 130. In the memory cell 130 with the open architecture illustrated in FIG. 9, the NMC includes one transistor and one capacitor. In FIG. 9, two NMCs appear to be connected to one wiring NWL, but one of the two NMCs is connected to an adjacent memory cell 130. In the memory cell 130 with the open architecture, the NMCs are classified as ones connected to the wiring LBL and ones connected to the wiring LBLB. With the open architecture, the NMCs can be highly integrated, and the capacity of data that the memory device 100 can store be increased as compared with the twin cell architecture or the folded architecture.

In the memory cell 130 with the twin cell architecture, complementary data retained in two capacitors is regarded as one bit; whereas in the memory cell 130 with the folded architecture or the open architecture described above, data retained in one capacitor is regarded as one bit. For the other operations of the folded and the open architecture, description of operations of the twin cell architecture can be referred to.

Also in the folded architecture and the open architecture, as in the twin cell architecture, in a standby state, it is preferable that GND be supplied to the wiring VLL and a precharge voltage be supplied to the wiring Will (alternatively, the precharge voltage be supplied to the wiring VLL and VDD be supplied to the wiring VHH). Thus, the memory device 100 can reduce the static power.

<<Voltage Retention Circuit, Voltage Generation Circuit>>

Next, a voltage retention circuit 128 and the voltage generation circuit 127 are described with reference to FIG. 10 and FIG. 11.

Figure 10:
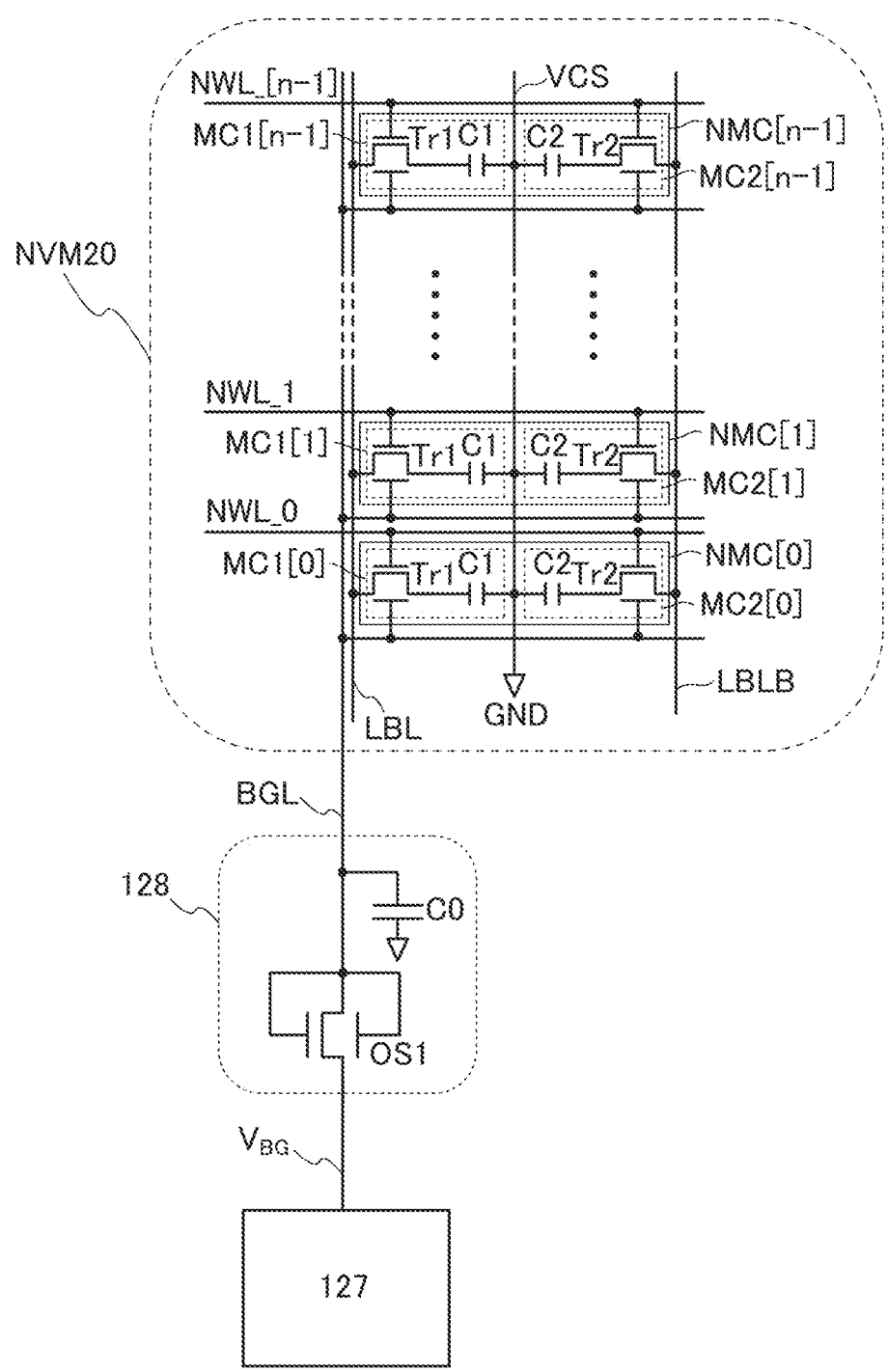
FIG. 10 A circuit diagram illustrating a memory cell, a voltage retention circuit, and a voltage generation circuit.

FIG. 10 illustrates the NVM 20, the voltage retention circuit 128 to which the NVM 20 is connected, and the voltage generation circuit 127 to which the voltage retention circuit 128 is connected.

The voltage retention circuit 128 includes a transistor OS1 and a capacitor C0. A first terminal of the transistor OS1 is electrically connected to a first gate of the transistor OS1, a second gate of the transistor OS1, a first terminal of the capacitor C0, and the wiring BGL. A second terminal of the transistor OS1 is electrically connected to the voltage generation circuit 127 and supplied with the voltage $V_{BG}$. Note that in the following description, the transistor OS1 is described as an n-channel transistor.

The voltage retention circuit 128 has a function of writing a potential to the second gates of the transistors Tr1 and Tr2 and retaining the potential. For example, in the case where the voltage retention circuit 128 writes a negative potential to the second gates of the transistors Tr1 and Tr2, the transistors Tr1 and Tr2 can keep $V_{th}$ high while the negative potential of the second gates of the transistors Tr1 and Tr2 is retained. The transistors Tr1 and Tr2 can prevent normally-on by keeping $V_{th}$ high, which can reduce power consumption of the memory device 100.

In the transistor OS1, the first gate and the second gate preferably have a region where they overlap with each other with a semiconductor layer provided therebetween. Furthermore, the above-described OS transistor is preferably used as the transistor OS1. When the OS transistor is used as the transistor OS1, drain current at $V_{GS}=0$ V (hereinafter referred to as cutoff current) can be made sufficiently low, and the voltage retention circuit 128 can retain the negative potential applied to the wiring BGL for a long time.

The channel length of the transistor OS1 is preferably longer than that of each of the transistors Tr1 and Tr2. In the case where the channel length of each of the transistors Tr1 and Tr2 is shorter than 1 µm, for example, the channel length of the transistor OS1 is longer than or equal to 1 µm, further preferably longer than or equal to 3 µm, further preferably longer than or equal to 5 µm, and further preferably longer than or equal to 10 µm.

When the transistor OS1 has a longer channel length, the transistor OS1 is not affected by a short-channel effect, and the cutoff current can be low. Furthermore, the withstand voltage between a source and a drain of the transistor OS1 can be increased. The high withstand voltage between the source and the drain of the transistor OS1 is preferable because it can facilitate a connection between the transistor OS1 and the voltage generation circuit 127 generating a high voltage.

The transistor OS1 is used in a circuit that needs high integration, such as a memory cell; thus, the channel lengths of the transistors Tr1 and Tr2 are preferably short. Meanwhile, the voltage retention circuit 128 is formed outside the memory cell; thus, a long channel length of the transistor OS1 does not become a problem. In addition, although the on-state current of a transistor is reduced when the channel length of the transistor is increased, the transistor OS1 is mainly used in an off state and thus is not required to have high on-state current.

The voltage generation circuit 127 has a function of generating a negative potential ($V_{BG}$). Circuit diagrams shown in FIG. 11 illustrate examples of the voltage generation circuit 127. These circuits are step-down charge pump, in each of which GND is input to an input terminal IN, and $V_{BG}$ is output from an output terminal OUT. The number of stages of fundamental circuits in the charge pump circuit is four in the examples shown here; however, it is not limited to this, and the charge pump circuit may be configured with a given number of stages.

Figure 11A:
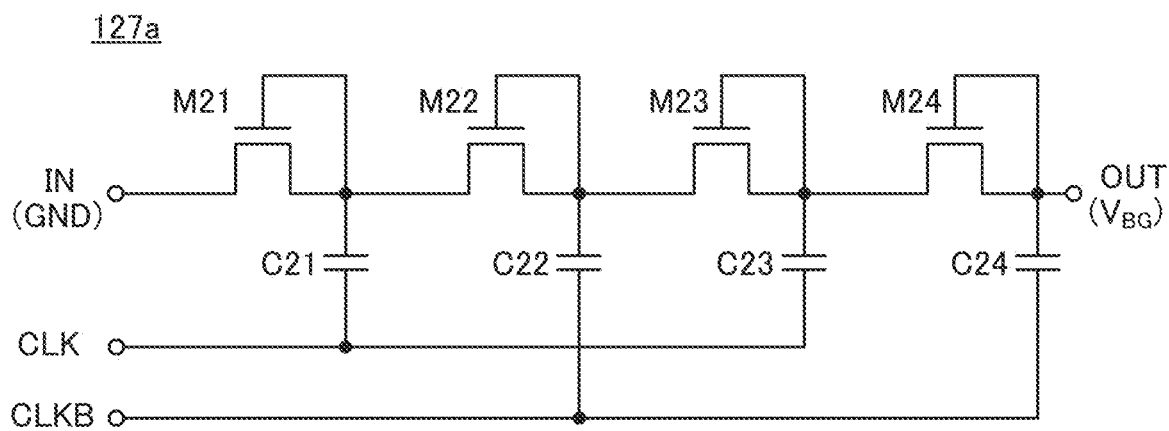
FIGS. 11A and 11B Circuit diagrams each illustrating a structure example of a voltage generation circuit.

A voltage generation circuit 127*a* illustrated in FIG. 11(A) includes transistors M21 to M24 and capacitors C21 to C24. The transistors M21 to M24 are hereinafter described as n-channel transistors.

The transistors M21 to M24 are connected in series between the input terminal IN and the output terminal OUT, in each of which a gate and a first electrode are connected so that the transistor functions as a diode. The capacitors C21 to C24 are connected to the gates of the transistors M21 to M24, respectively.

The CLK is input to first electrodes of the capacitors C21 and C23 in the odd-numbered stages, and CLKB is input to first electrodes of the capacitors C22 and C24 in the even-numbered stages. The CLKB is an inverted clock signal obtained by phase inversion of the CLK.

The voltage generation circuit 127*a* has a function of stepping down GND input to the input terminal IN and generating $V_{BG}$. The voltage generation circuit 127*a* can generate a negative potential only by the supply of the CLK and the CLKB.

The above-described transistors M21 to M24 may be OS transistors. The OS transistors are preferably used because the reverse current of the diode-connected transistors M21 to M24 can be reduced.

Figure 11B:
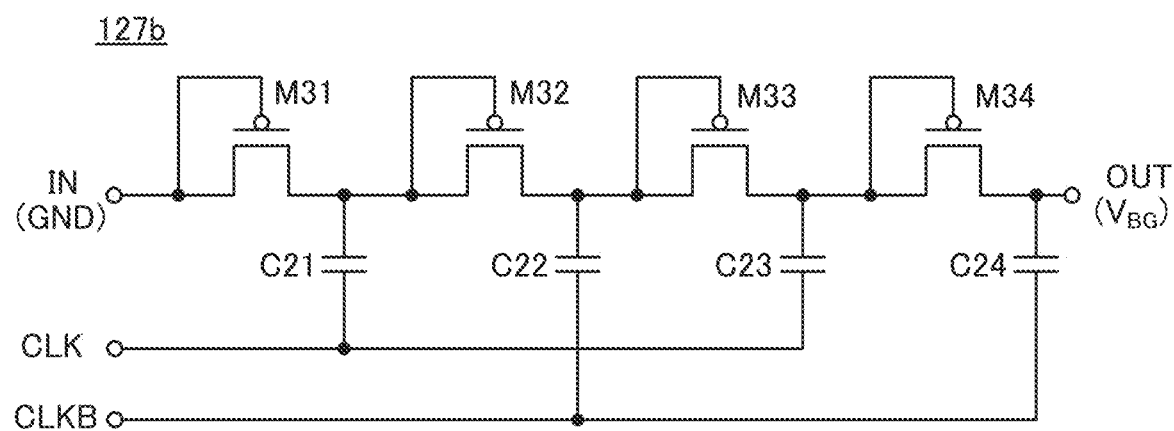

A voltage generation circuit 127*b* illustrated in FIG. 11(B) includes transistors M31 to M34 that are p-channel transistors. The description of the voltage generation circuit 127*a* is referred to for the other components.

As described above, the memory device 100 of one embodiment of the present invention can reduce the power consumption and circuit area by employing the above structures.

Embodiment 2

In this embodiment, structure examples of the memory device 100 described in Embodiment 1 will be described.

Figure 12:
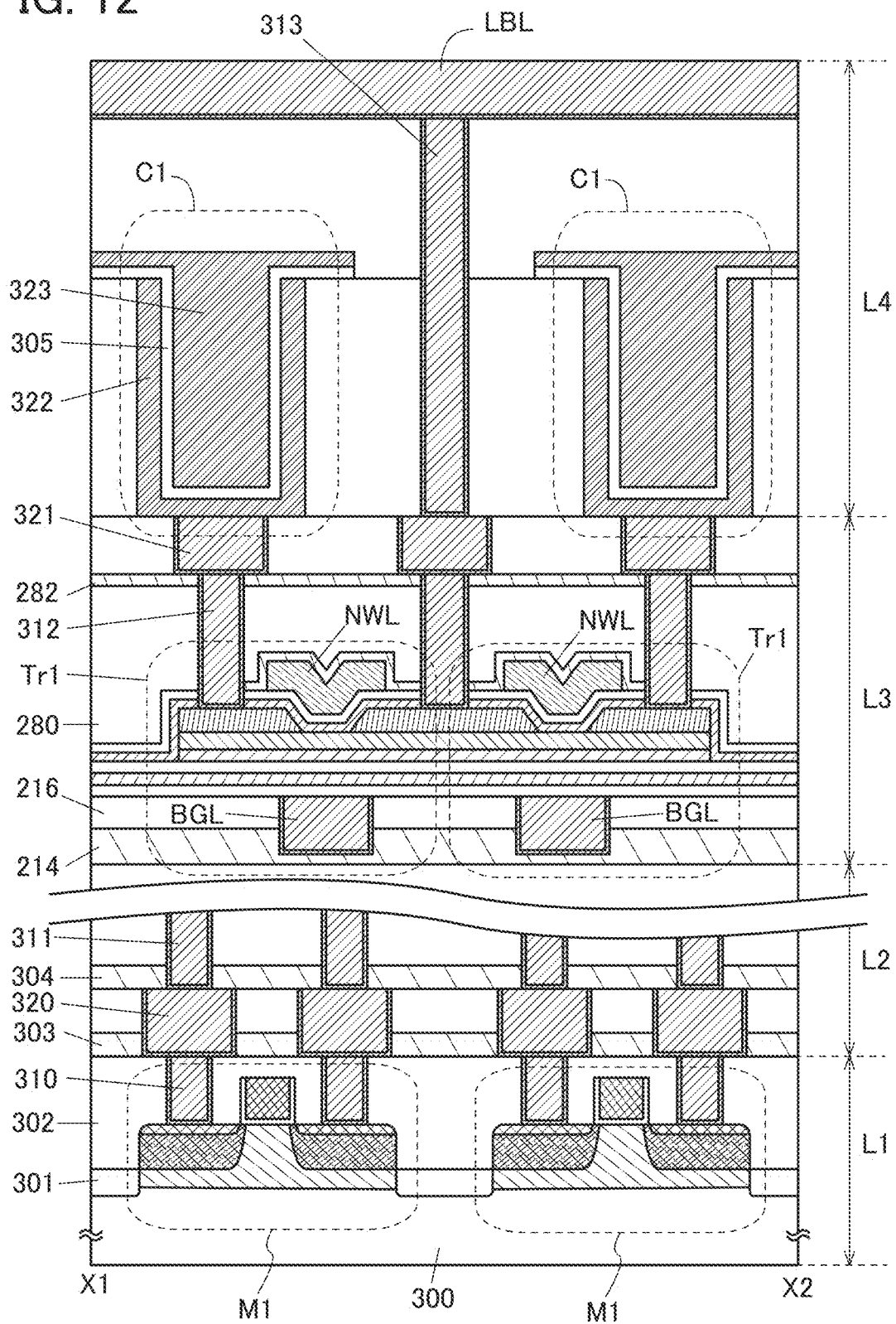
FIG. 12 A cross-sectional view illustrating a structure example of a memory device.

FIG. 12 illustrates an example of a cross-sectional view of the memory device 100. The memory device 100 illustrated in FIG. 12 includes a layer L1, a layer L2, a layer L3, and a layer L4 that are stacked in this order from the bottom.

The layer L1 includes a transistor M1, a substrate 300, an element isolation layer 301, an insulator 302, a plug 310, and the like.

The layer L2 includes an insulator 303, a wiring 320, an insulator 304, a plug 311, and the like.

The layer L3 includes an insulator 214, an insulator 216, the transistor Tr1, a plug 312, an insulator 282, a wiring 321, and the like. The first gate of the transistor Tr1 functions as the wiring NWL, and the second gate of the transistor Tr1 functions as the wiring BGL.

The layer L4 includes the capacitor C1, a plug 313, the wiring LBL, and the like. The capacitor C1 is formed of a conductor 322, a conductor 323, and an insulator 305.

Figure 14A:
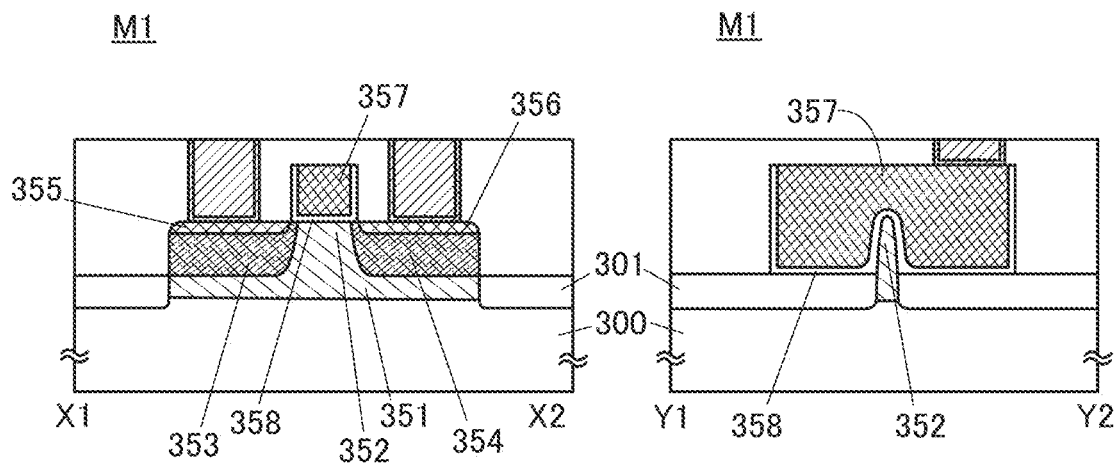
FIGS. 14A to 14D Cross-sectional views each illustrating a structure example of a transistor.
Figure 14B:
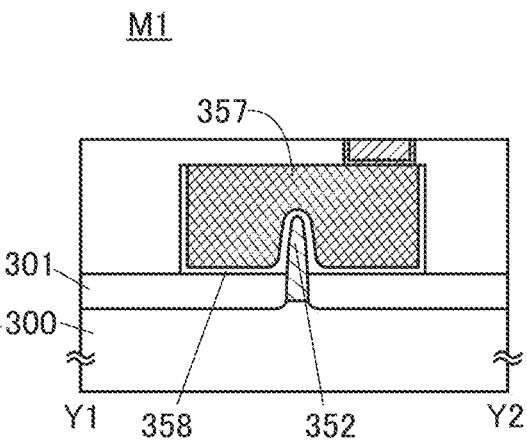

Next, the transistor M1 will be described in detail with reference to FIG. 14. FIG. 14(A) is a cross-sectional view of the transistor M1 in the channel length direction, and FIG. 14(B) is a cross-sectional view of the transistor M1 in the channel width direction.

The transistor M1 is provided over the substrate 300 and isolated from another adjacent transistor by the element isolation layer 301. For the element isolation layer 301, silicon oxide, silicon oxynitride, silicon nitride oxide, silicon nitride, or the like can be used. Note that in this specification, an oxynitride refers to a compound that contains more oxygen than nitrogen, and a nitride oxide refers to a compound that contains more nitrogen than oxygen.

As the substrate 300, a single crystal semiconductor substrate or a polycrystalline semiconductor substrate of silicon or silicon carbide, a compound semiconductor substrate of silicon germanium, an SOI (Silicon On Insulator) substrate, or the like can be used. Moreover, a glass substrate, a quartz substrate, a plastic substrate, a metal substrate, an attachment film, paper containing a fibrous material, or a base film, for example, may be used as the substrate 300. Alternatively, a semiconductor element may be formed using one substrate and then the semiconductor element is transferred to another substrate.

Alternatively, a flexible substrate may be used as the substrate 300. Note that as a method for providing a transistor over a flexible substrate, there is also a method in which a transistor is formed over a non-flexible substrate and then is separated from the non-flexible substrate and transferred to the substrate 300 that is a flexible substrate. In that case, a separation layer is preferably provided between the non-flexible substrate and the transistor. Note that as the substrate 300, a sheet, a film, a foil or the like that contains a fiber may be used. The substrate 300 may have elasticity. Furthermore, the substrate 300 may have a property of returning to its original shape when bending or pulling is stopped. Alternatively, the substrate 300 may have a property of not returning to its original shape. The thickness of the substrate 300 is, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 300 that is a flexible substrate has a small thickness, the weight of a semiconductor device can be reduced. Moreover, when the substrate 300 has a small thickness, even in the case of using glass or the like, the substrate 300 may have elasticity or a property of returning to its original shape after bending or pulling is stopped. Thus, an impact applied to a semiconductor device over the substrate 300, which is caused by dropping or the like, can be reduced. That is, a durable semiconductor device can be provided. For the substrate 300 that is a flexible substrate, a metal, an alloy, resin, glass, or fiber thereof can be used, for example. The substrate 300 that is a flexible substrate preferably has a lower coefficient of linear expansion because deformation due to an environment is suppressed. For the substrate 300 that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K may be used. Examples of the resin include polyester, polyolefin, polyamide (e.g., nylon and aramid), polyimide, polycarbonate, acrylic, and polytetrafluoroethylene (PTFE). In particular, aramid is preferably used for the substrate 300 that is a flexible substrate because of its low coefficient of linear expansion.

This embodiment shows an example where a single crystal silicon wafer is used as the substrate 300.

The transistor M1 illustrated in FIGS. 14(A) and 14(B) includes a channel formation region 352 and impurity regions 353 and 354 provided in a well 351, conductive regions 355 and 356 provided in contact with the impurity regions, a gate insulator 358 provided over the channel formation region 352, and a gate electrode 357 provided over the gate insulator 358. Note that for the conductive regions 355 and 356, metal silicide or the like may be used.

The channel formation region 352 of the transistor M1 has a projecting shape, and the gate insulator 358 and the gate electrode 357 are provided along side and top surfaces of the projecting shape (see FIG. 14(B)). The transistor with such a shape is referred to as a FIN-type transistor. Although the case where the projecting portion is formed by processing part of the semiconductor substrate is described in this embodiment, a semiconductor layer with a projecting shape may be formed by processing an SOI substrate.

This embodiment shows an example in which a Si transistor is used as the transistor M1. The transistor M1 may be either an n-channel transistor or a p-channel transistor; a transistor appropriate for an intended circuit is used.

Figure 14C:
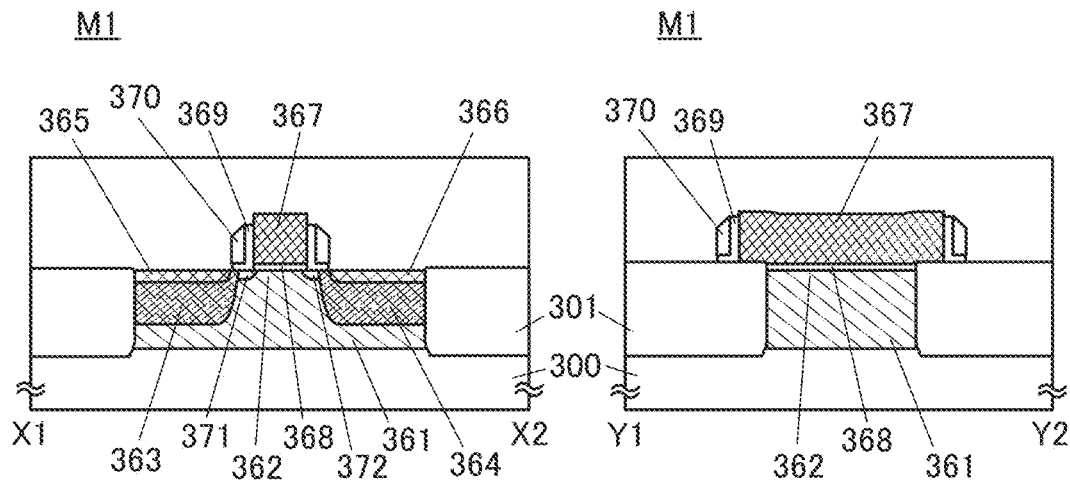
Figure 14D:
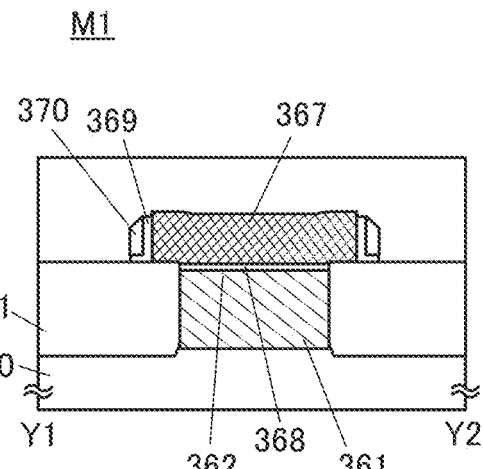

Note that a planar transistor may be used as the transistor M1. FIGS. 14(C) and 14(D) show an example of that case. FIG. 14(C) is a cross-sectional view of the transistor M1 in the channel length direction, and FIG. 14(D) is a cross-sectional view of the transistor M1 in the channel width direction.

The transistor M1 illustrated in FIGS. 14(C) and 14(D) includes a channel formation region 362, low-concentration impurity regions 371 and 372, and high-concentration impurity regions 363 and 364 provided in a well 361; conductive regions 365 and 366 provided in contact with the high-concentration impurity regions; a gate insulator 368 provided over the channel formation region 362; a gate electrode 367 provided over the gate insulator 368; and sidewall insulating layers 369 and 370 provided on sidewalls of the gate electrode 367. Note that for the conductive regions 365 and 366, metal silicide or the like may be used.

FIG. 12 is described again. The insulator 302 serves as an interlayer insulator. In the case where a Si transistor is used as the transistor M1, the insulator 302 preferably contains hydrogen. Hydrogen contained in the insulator 302 has an effect in, terminating dangling bonds of silicon and thus improving the reliability of the transistor M1. For the insulator 302, silicon oxide, silicon oxynitride, silicon nitride oxide, silicon nitride, or the like is preferably used.

For the insulator 303, it is preferable to use a barrier film that prevents hydrogen or impurities from diffusing from the substrate 300, the transistor M1, or the like into a region where the transistor Tr1 is provided. For example, silicon nitride formed by a CVD method can be used. Diffusion of hydrogen into an oxide semiconductor contained in the transistor Tr1 degrades the characteristics of the oxide semiconductor in some cases. Therefore, a film that prevents hydrogen diffusion is preferably used between the transistor M1 and the transistor Tr1.

The film that prevents hydrogen diffusion means a film that releases a small amount of hydrogen. The amount of released hydrogen can be measured by thermal desorption spectroscopy (TDS), for example. The amount of hydrogen released from the insulator 324 that is converted into hydrogen atoms per area of the insulator 303 is smaller than or equal to $10 \times 10^{15}$ atoms/cm$^2$, preferably smaller than or equal to $5 \times 10^{15}$ atoms/cm$^2$ in TDS analysis in the range of 50° C. to 500° C., for example.

For the insulators 304, 214, and 282, an insulator that inhibits copper diffusion or an insulator with barrier properties against oxygen and hydrogen is preferably used. For a film that inhibits copper diffusion, silicon nitride can be used, for example. Alternatively, a metal oxide such as an aluminum oxide may be used.

For the insulator 216, a silicon oxide film or a silicon oxynitride film can be used, for example.

The details of an insulator 280 and the transistor Tr1 will be described in Embodiment 3.

For the insulator 305, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like may be used.

Alternatively, the insulator 305 may have a stacked-layer structure using the above insulators. For example, the insulator 305 may have a stacked-layer structure using a material with high dielectric strength, such as silicon oxynitride, and a high dielectric (high-k) material, such as aluminum oxide. With this structure, the capacitor C1 can have a sufficient capacitance, and electrostatic breakdown can be prevented.

The conductors, wirings, and plugs illustrated in FIG. 12 each preferably are a single layer or a stacked layer of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. Moreover, it is preferable to use a low-resistance conductive material such as aluminum or copper.

Figure 13:
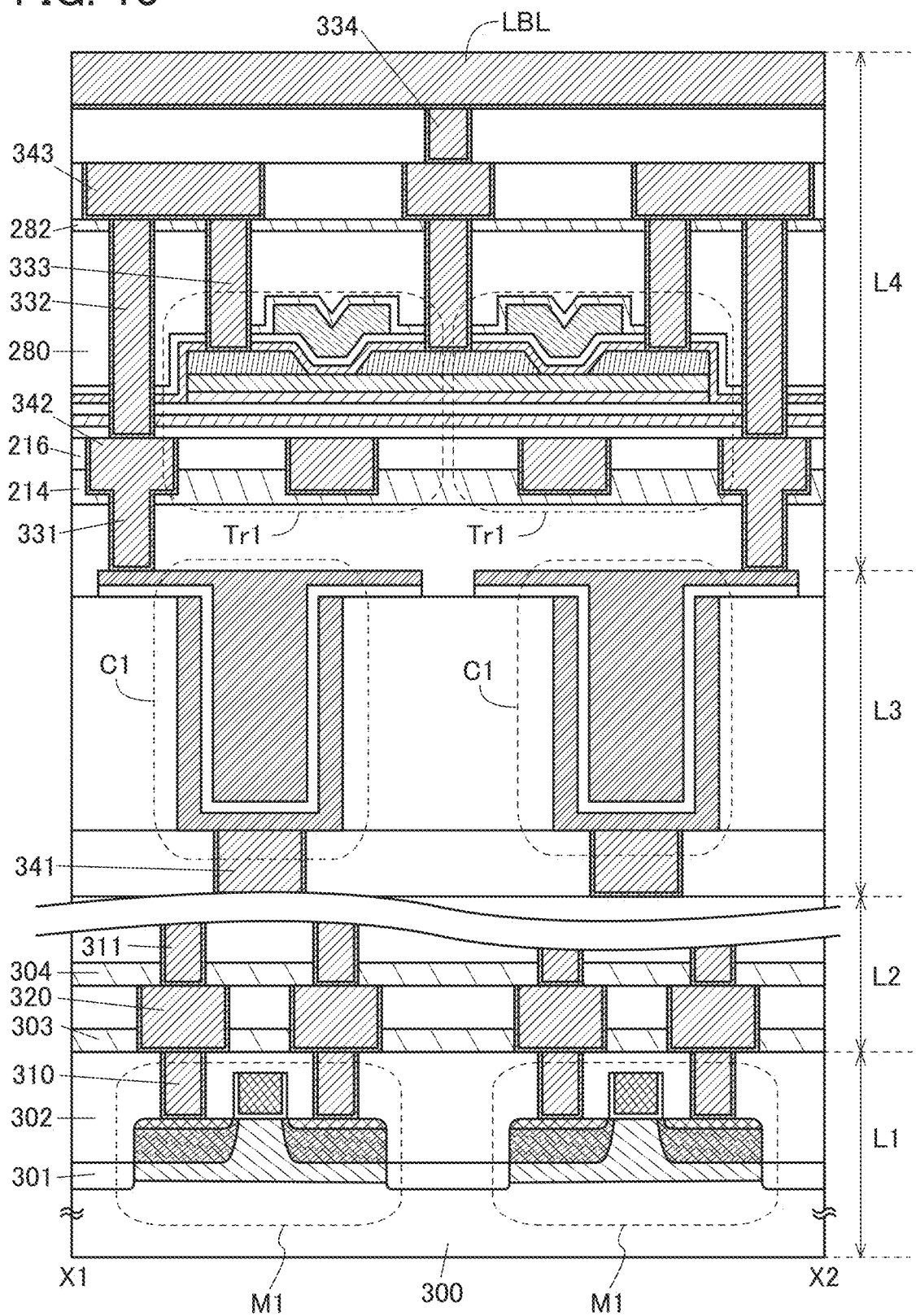
FIG. 13 A cross-sectional view illustrating a structure example of a memory device.

In the memory device 100 illustrated in FIG. 12, the transistor Tr1 may be formed over the capacitor C1. FIG. 13 shows a cross-sectional view in that case. The cross-sectional view illustrated in FIG. 13 is different from the cross-sectional view in FIG. 12 in the layer L3 and the layer L4.

In FIG. 13, the layer L3 includes a wiring 341 and the capacitor C1.

In FIG. 13, the layer L4 includes a plug 331, a plug 332, a plug 333, a plug 334, a wiring 342, a wiring 343, the wiring LBL, the insulator 214, the insulator 216, the insulator 280, the insulator 282, and the transistor Tr1.

Providing the capacitor C1 below the transistor Tr1 can prevent the transistor Tr1 from being affected by hydrogen or process damage caused during formation of the capacitor C1.

In FIG. 12 and FIG. 13, regions without reference numerals or hatch patterns are formed of an insulator. As the insulator, it is possible to use an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for these regions, an organic resin such as a polyimide resin, a polyamide resin, an acrylic resin, a siloxane resin, an epoxy resin, or a phenol resin can be used.

Embodiment 3

In this embodiment, a structure of the OS transistor used in the above embodiments will be described.
<Oxide Semiconductor>

First, an oxide semiconductor that can be used for the OS transistor will be described.

An oxide semiconductor preferably contains at least indium or zinc, further preferably contains indium and zinc. Here, the case where an oxide semiconductor contains indium, an element M, and zinc is considered.

The element M is preferably gallium (Ga), for example. Other examples of an element that can be used as the element M include aluminum (Al), boron (B), silicon (Si), titanium (Ti), zirconium (Zr), lanthanum (La), cerium (Ce), yttrium (Y), hafnium (Hf), tantalum (Ta), niobium (Nb), and scandium (Sc).

First, preferred ranges of atomic ratios of indium, the element M, and zinc contained in an oxide semiconductor of the present invention are described with reference to FIGS. 15(A), 15(B), and 15(C). Note that the proportion of oxygen atoms is not shown in FIG. 15. The terms of the atomic ratio of indium to the element M and zinc contained in the oxide semiconductor are denoted by [In], [M], and [Zn].

Figure 15A:
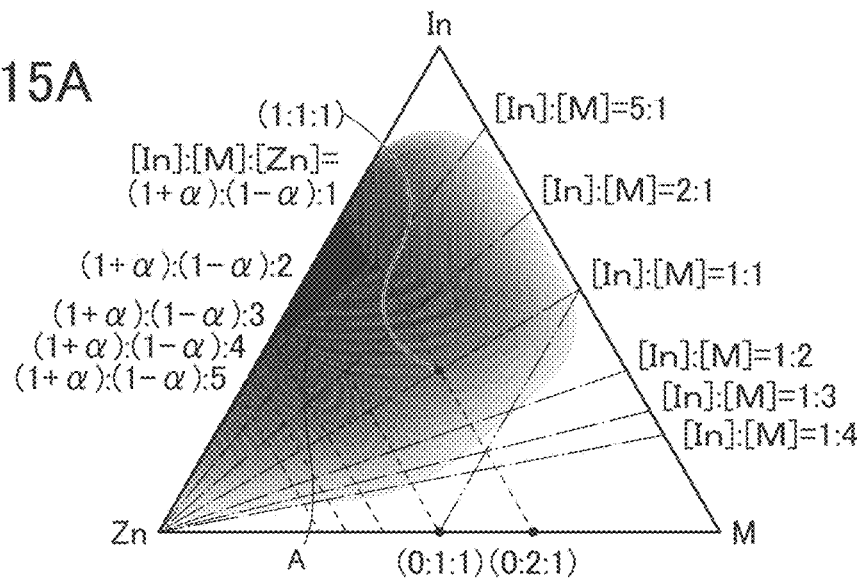
FIGS. 15A to 15C Diagrams illustrating a crystal structure of InMZnO$_4$.
Figure 15B:
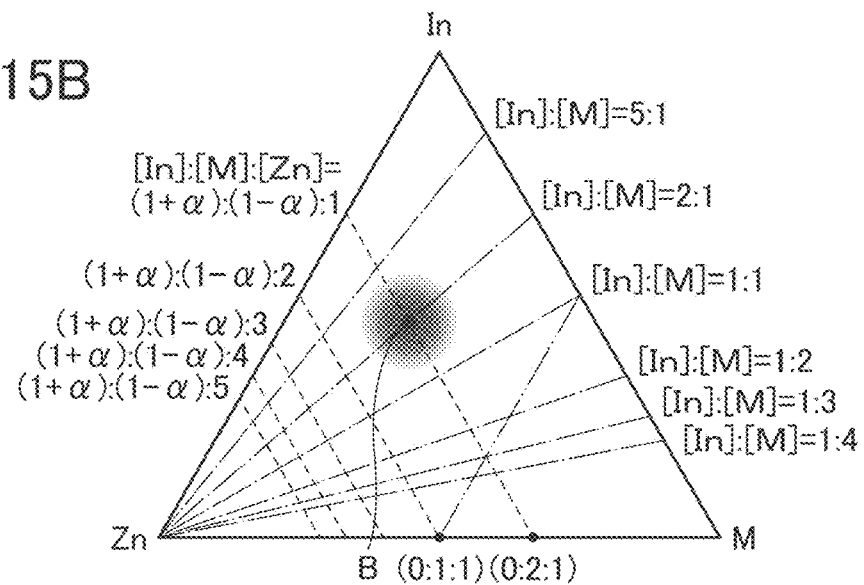
Figure 15C:
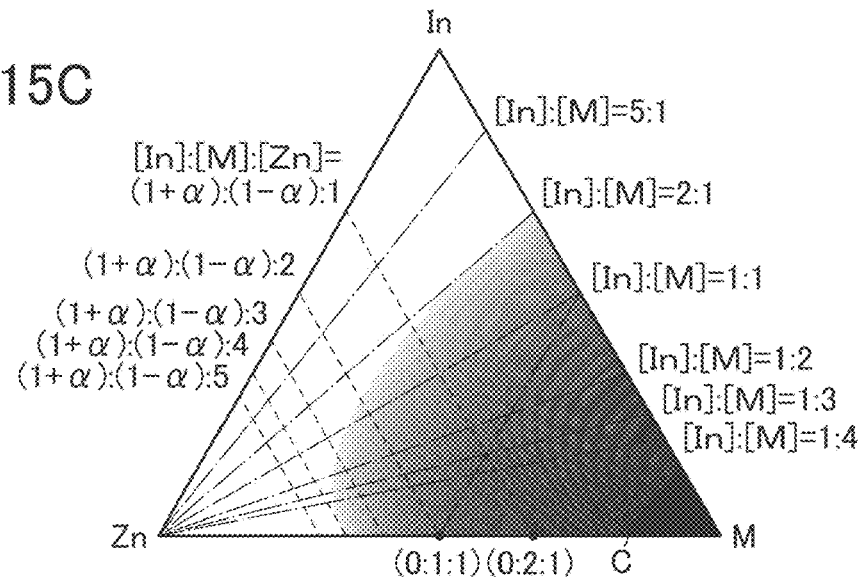

In FIGS. 15(A), 15(B), and 15(C), broken lines indicate a line where the atomic ratio [In]:[M]:[Zn] is $(1+\alpha):(1-\alpha):1$ (where $\alpha$ is $-1$ or larger and 1 or smaller), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Furthermore, dashed-dotted lines indicate a line where the atomic ratio [In]:[M]:[Zn] is $1:1:\beta$ (where $\beta \geq 0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Furthermore, a dashed double-dotted line indicates a line where the atomic ratio [In]:[M]:[Zn] is $(1+\gamma):2:(1-\gamma)$ (where $\gamma$ is $-1$ or larger and 1 or smaller). Furthermore, an oxide semiconductor with the atomic ratio [In]:[M]:[Zn]=0:2:1 or a value in the neighborhood thereof shown in FIG. 15 tends to have a spinel crystal structure.

A plurality of phases coexist in an oxide semiconductor in some cases (two-phase coexistence, three-phase coexistence, or the like). For example, with an atomic ratio having a value in the neighborhood of an atomic ratio of [In]:[M]:[Zn]=0:2:1, two phases of a spinel crystal structure and a layered crystal structure are likely to coexist. In addition, with an atomic ratio having a value in the neighborhood of an atomic ratio of [In]:[M]:[Zn]=1:0:0, two phases of a bixbyite crystal structure and a layered crystal structure are likely to coexist. In the case where a plurality of phases coexist in the oxide semiconductor, a grain boundary might be formed between different crystal structures.

In addition, an oxide semiconductor with a higher content of indium can have high carrier mobility (electron mobility). This is because in an oxide semiconductor containing indium, the element M, and zinc, the s orbital of heavy metal mainly contributes to carrier conduction, and a higher indium content in the oxide semiconductor enlarges a region where the s orbitals of indium atoms overlap.

A region A in FIG. 15(A) represents a region where an oxide semiconductor has high carrier mobility and is likely to have a layered structure with few grain boundaries.

A region B illustrated in FIG. 15(B) represents values of [In]:[M]:[Zn]=4:2:3 to 4:2:4.1 and in the neighborhood thereof. The values in the neighborhood includes, for example, an atomic ratio [In]:[M]:[Zn]=5:3:4. An oxide semiconductor with an atomic ratio represented by the region B is an excellent oxide semiconductor that has particularly high crystallinity and high carrier mobility.

In contrast, when the indium content and the zinc content in an oxide semiconductor become lower, the carrier mobility becomes lower. Thus, with an atomic ratio [In]:[M]:[Zn] of 0:1:0 and a value in the neighborhood thereof (e.g., a region C illustrated in FIG. 15(C)), insulation performance becomes better.

<Transistor Structure 1>

Figure 16A:
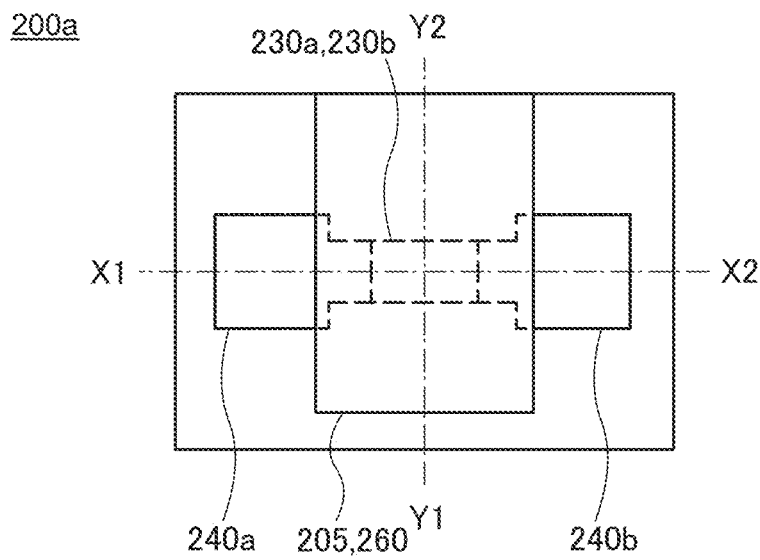
FIGS. 16A to 16C A top view and cross-sectional views illustrating a structure example of a transistor.
Figures 16B, 16C:
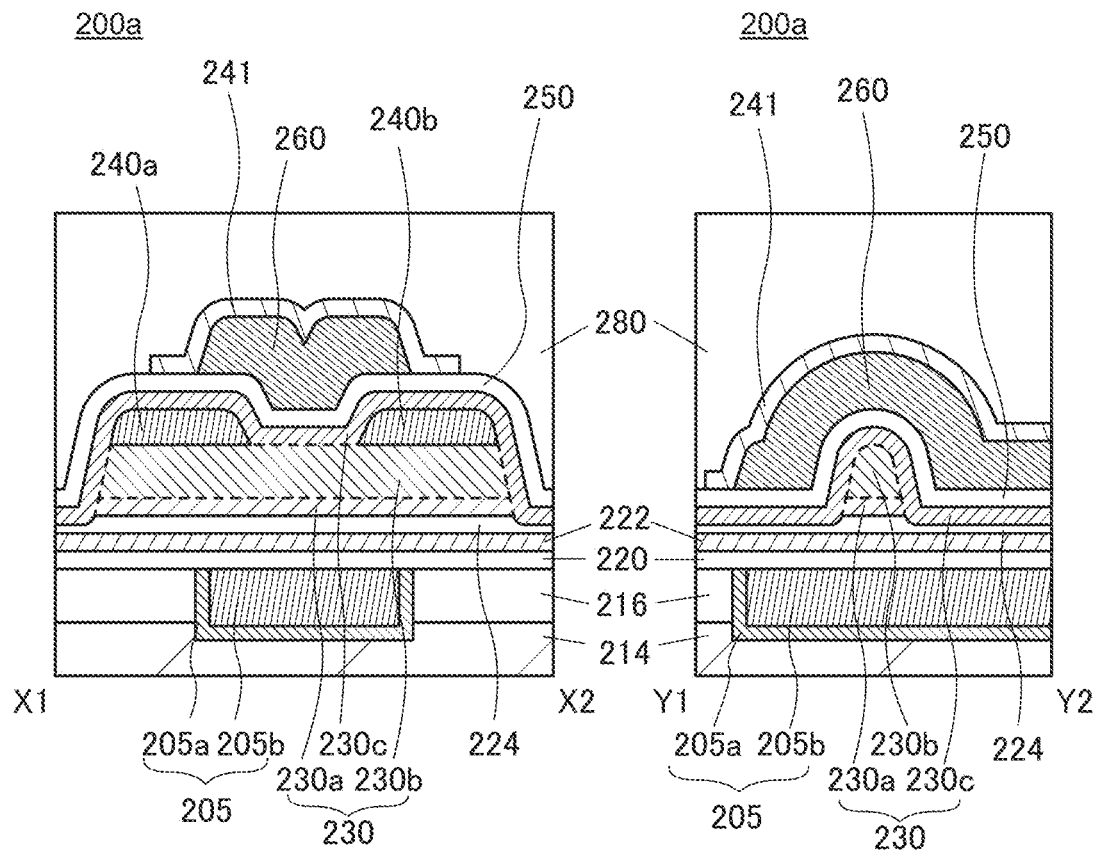

FIGS. 16(A) to 16(C) are a top view and cross-sectional views of a transistor 200a. FIG. 16(A) is a top view. FIG. 16(B) is a cross-sectional view taken along the dashed-dotted line X1-X2 shown in FIG. 16(A). FIG. 16(C) is a cross-sectional view taken along the dashed-dotted line shown Y1-Y2 in FIG. 16(A). Note that for clarification of the drawing, some components are not illustrated in the top view of FIG. 16(A).

FIGS. 16(B) and 16(C) illustrate an example in which the transistor 200a is provided over the insulator 214 and the insulator 216.

The transistor 200a includes a conductor 205 (conductors 205a and 205b) and a conductor 260 that function as gate electrodes, insulators 220, 222, 224, and 250 that function as gate insulating layers, an oxide semiconductor 230 (oxide semiconductors 230a, 230b, and 230c), a conductor 240a that functions as one of a source and a drain, a conductor 240b that functions as the other of the source and the drain, an insulator 241 that protects the conductor 260, and the insulator 280 that contains excess oxygen (contains oxygen in excess of that in the stoichiometric composition).

In the transistor 200a, the conductor 260 is referred to as a top gate and the conductor 205 is referred to as a bottom gate in some cases. Alternatively, the conductor 260 is referred to as a first gate and the conductor 205 is referred to as a second gate in some cases.

Furthermore, the oxide semiconductor 230 includes the oxide semiconductor 230a, the oxide semiconductor 230b over the oxide semiconductor 230a, and the oxide semiconductor 230c over the oxide semiconductor 230b. Note that when the transistor 200a is turned on, a current flows mainly in the oxide semiconductor 230b. That is, the oxide semiconductor 230b has a function of a channel formation region. Meanwhile, although a current sometimes flows through the vicinity of the interface (a mixed region in some cases) between the oxide semiconductor 230b and the oxide semiconductors 230a and 230c, the other regions of the oxide semiconductors 230a and 230c sometimes function as insulators.

The conductor 205 is a metal film containing an element selected from molybdenum, titanium, tantalum, tungsten, aluminum, copper, chromium, neodymium, and scandium; a metal nitride film containing the above elements as its component (e.g., a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

For example, it is preferable to use a conductor with a barrier property against hydrogen (e.g., tantalum nitride) as the conductor 205a and to stack tungsten, which has high conductivity, as the conductor 205b. The use of the combination can prevent diffusion of hydrogen into the oxide semiconductor 230 while conductivity of a wiring is ensured. Note that a two-layer structure of the conductor 205a and the conductor 205b is shown in FIG. 16(B); however, the structure is not limited thereto and may be a single-layer structure or a stacked-layer structure of three or more layers.

Each of the insulators 220 and 224 is preferably an insulator containing oxygen, such as a silicon oxide film or a silicon oxynitride film. In particular, an insulator containing excess oxygen is preferably used as the insulator 224. When such an insulator containing excess oxygen is provided in contact with the oxide in the transistor 200a, oxygen vacancies in the oxide can be compensated for. Note that the insulator 220 and the insulator 224 are not necessarily formed of the same material.

The insulator 222 preferably has a single-layer structure or a stacked-layer structure using an insulator containing a material such as silicon nitride, silicon nitride oxide, aluminum oxide, hafnium oxide, tantalum oxide, or zirconium oxide.

Furthermore, appropriate adjustment of the thicknesses of the insulator 220, the insulator 222, and the insulator 224 can control $V_{th}$ or provide a transistor with a low leakage current in an off state. The insulator 220, the insulator 222, and the insulator 224 are preferably thin, in which case $V_{th}$ can be easily controlled by the conductor 205. For example, each of the insulator 220, the insulator 222, and the insulator 224 has a thickness of 50 nm or less, further preferably 30 nm or less, further preferably 10 nm or less, further preferably 5 nm or less.

The oxide semiconductor 230a, the oxide semiconductor 230b, and the oxide semiconductor 230c are formed using metal oxide such as In-M-Zn oxide. Furthermore, for the oxide semiconductor 230, In—Ga oxide or In—Zn oxide may be used.

The energy level of the conduction band minimum of each of the oxide semiconductors 230a and 230c is closer to the vacuum level than that of the oxide semiconductor 230b. Typically, a difference between the energy level of the conduction band minimum of the oxide semiconductor 230b and the energy level of the conduction band minimum of each of the oxide semiconductors 230a and 230c is preferably larger than or equal to 0.15 eV or larger than or equal to 0.5 eV, and smaller than or equal to 2 eV or smaller than or equal to 1 eV. That is, a difference between the electron affinity of the oxide semiconductor 230b and the electron affinity of each of the oxide semiconductors 230a and 230c is preferably larger than or equal to 0.15 eV or larger than or equal to 0.5 eV, and smaller than or equal to 2 eV or smaller than or equal to 1 eV.

The energy gap of the oxide semiconductor 230b is preferably 2 eV or larger, further preferably 2.5 eV or larger and 3.0 eV or smaller. Furthermore, the energy gap of each of the oxide semiconductors 230a and 230c is preferably 2 eV or larger, further preferably 2.5 eV or larger, further preferably 2.7 eV or larger and 3.5 eV or smaller. Furthermore, the energy gap of each of the oxide semiconductors 230a and 230c is preferably larger than that of the oxide semiconductor 230b. For example, the energy gap of each of the oxide semiconductors 230a and 230c is preferably 0.15 eV or more, 0.5 eV or more, 1.0 eV or more and 2 eV or less or 1 eV or less larger than the energy gap of the oxide semiconductor 230b.

Furthermore, the thickness of each of the oxide semiconductors 230a, 230b, and 230c is larger than or equal to 3 nm and smaller than or equal to 200 nm, preferably larger than or equal to 3 nm and smaller than or equal to 100 nm, further preferably larger than or equal to 3 nm and smaller than or equal to 60 nm.

A decrease in the carrier density of an oxide semiconductor film is preferable, in which case the negative shift of the threshold voltage of the transistor or the off-state current of the transistor can be reduced.

Examples of a factor affecting the carrier density of an oxide semiconductor include oxygen vacancies (Vo) and impurities in the oxide semiconductor. As oxygen vacancies in the oxide semiconductor increase, the density of defect states increases when hydrogen is bonded to the oxygen vacancies (this state is also referred to as VoH). Alternatively, the density of defect states increases with an increase in the amount of impurities in the oxide semiconductor. Hence, the carrier density of an oxide semiconductor can be controlled by controlling the density of defect states in the oxide semiconductor.

Having a low impurity concentration and a low density of defect states is referred to as being highly purified intrinsic or substantially highly purified intrinsic. A highly purified intrinsic or substantially highly purified intrinsic oxide semiconductor film has few carrier generation sources, and thus can have a low carrier density.

A highly purified intrinsic or substantially highly purified intrinsic oxide semiconductor is preferably used as each of the oxide semiconductors 230a and 230c. For example, the carrier density of each of the oxide semiconductors 230a and 230c is lower than $8 \times 10^{15}$ $cm^{-3}$, preferably lower than $1 \times 10^{11}$ $cm^{-3}$, further preferably lower than $1 \times 10^{10}$ $cm^{-3}$, and higher than or equal to $1 \times 10^{-9}$ $cm^{-3}$.

In contrast, the carrier density of an oxide semiconductor is preferably increased in order to improve the on-state current or field-effect mobility of a transistor. In order to increase the carrier density of the oxide semiconductor, the impurity concentration or the density of defect states in the oxide semiconductor is slightly increased, or alternatively, the bandgap of the oxide semiconductor is narrowed. For example, an oxide semiconductor that has a slightly high impurity concentration or a slightly high density of defect states in the range where a favorable on/off ratio is obtained in the $I_D$-$V_G$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has a lower threshold voltage.

The carrier density of the oxide semiconductor 230b is preferably higher than those of the oxide semiconductor 230a and the oxide semiconductor 230c. The carrier density of the oxide semiconductor 230b is preferably higher than or equal to $1 \times 10^5$ $cm^{-3}$ and lower than $1 \times 10^{18}$ $cm^{-3}$, further preferably higher than or equal to $1 \times 10^7$ $cm^{-3}$ and lower than or equal to $1 \times 10^{17}$ $cm^{-3}$, further preferably higher than or equal to $1 \times 10^9$ $cm^{-3}$ and lower than or equal to $5 \times 10^{16}$ $cm^{-3}$, further preferably higher than or equal to $1 \times 10^{10}$ $cm^{-3}$ and lower than or equal to $1 \times 10^{16}$ $cm^{-3}$, and further preferably higher than or equal to $1 \times 10^{11}$ $cm^{-3}$ and lower than or equal to $1 \times 10^{15}$ $cm^{-3}$.

The density of defect states in a mixed layer formed at an interface between the oxide semiconductors 230a and 230b or an interface between the oxide semiconductors 230b and 230c is preferably made low.

Specifically, when the oxide semiconductors 230a and 230b or the oxide semiconductors 230b and 230c contain the same element (as a main component) in addition to oxygen, a mixed layer with a low density of defect states can be formed. For example, in the case where the oxide semiconductor 230b is an In—Ga—Zn oxide semiconductor, it is preferable to use an In—Ga—Zn oxide semiconductor, a Ga—Zn oxide semiconductor, gallium oxide, or the like as each of the oxide semiconductors 230a and 230c.

At this time, the oxide semiconductor 230b serves as a main carrier path. Since the density of defect states at the interface between the oxide semiconductors 230a and 230b and the interface between the oxide semiconductors 230b and 230c can be made low, the influence of interface scattering on carrier conduction is small, and a high on-state current can be obtained.

When an electron is trapped by a trap state, the trapped electron behaves like a fixed charge; thus, $V_{th}$ of the transistor is shifted in the positive direction. Providing the oxide semiconductors 230a and 230c can make the trap state apart from the oxide semiconductor 230b. This structure can prevent the positive shift of $V_{th}$ of the transistor.

A material whose conductivity is sufficiently lower than that of the oxide semiconductor 230b is used for the oxide semiconductors 230a and 230c. In that case, the oxide semiconductor 230b, the interface between the oxide semiconductors 230a and 230b, and the interface between the oxide semiconductors 230b and 230c mainly function as a channel region. For example, an oxide semiconductor with high insulation performance and the atomic ratio represented by the region C in FIG. 15(C) can be used as the oxide semiconductors 230a and 230c. Note that the region C illustrated in FIG. 15(C) shows the atomic ratio [In]:[M]:[Zn] of 0:1:0 or a value in the neighborhood thereof.

In the case where an oxide semiconductor with the atomic ratio represented by the region A illustrated in FIG. 15(A) is used as the oxide semiconductor 230b, it is particularly preferable to use an oxide semiconductor with [M]/[In] of greater than or equal to 1, preferably greater than or equal to 2, as each of the oxide semiconductors 230a and 230c. In addition, it is suitable to use an oxide semiconductor with [M]/([Zn]+[In]) of greater than or equal to 1 and sufficiently high insulation performance as the oxide semiconductor 230c.

The oxide semiconductor 230c has lower crystallinity than the oxide semiconductor 230b in some cases. The oxide semiconductor 230b preferably contains a CAAC-OS that will be described later. The reduction in crystallinity of the oxide semiconductor 230c sometimes makes the oxide semiconductor 230c have a higher oxygen-transmitting property, leading to easy supply of oxygen from the insulator positioned above the oxide semiconductor 230c to the oxide semiconductor 230b. Here, the oxide semiconductor 230c may be amorphous or a-like (amorphous-like oxide semiconductor) that will be described later.

The oxide semiconductor 230a may contain a CAAC-OS. Furthermore, the oxide semiconductor 230a preferably has higher crystallinity than the oxide semiconductor 230c.

The insulator 250 can have a single-layer structure or a stacked-layer structure using an insulator containing a material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST), for example. Alternatively, to the insulator of these, aluminum oxide, bismuth oxide, germanium oxide, niobium oxide, silicon oxide, titanium oxide, tungsten oxide, yttrium oxide, or zirconium oxide may be added, for example. Alternatively, the insulator of these may be subjected to nitriding treatment. A layer of silicon oxide, silicon oxynitride, or silicon nitride may be stacked over the insulator.

Furthermore, like for the insulator 224, for the insulator 250, it is preferable to use an oxide insulator that contains oxygen at a higher proportion than oxygen in the stoichiometric composition. When such an insulator containing excess oxygen is provided in contact with the oxide semiconductor 230, oxygen vacancies in the oxide semiconductor 230 can be reduced.

Furthermore, as the insulator 250, it is possible to use an insulating film with barrier properties against oxygen and hydrogen, such as aluminum oxide, aluminum oxynitride, hafnium oxide, hafnium oxynitride, or silicon nitride. The insulator formed of such a material functions as a layer that prevents release of oxygen from the oxide semiconductor 230 or entry of impurities such as hydrogen from the outside.

A metal such as aluminum, titanium, chromium, nickel, copper, yttrium, zirconium, molybdenum, silver, tantalum, or tungsten or an alloy containing any of the metals as its main component can be used for the conductors 240a and 240b. Although a single layer structure is shown in the drawing, a stacked-layer structure of two or more layers may be employed.

For example, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film, an aluminum film or a copper film, and a titanium film or a titanium nitride film are stacked in this order; and a three-layer structure where a molybdenum film or a molybdenum nitride film, an aluminum film or a copper film, and a molybdenum film or a molybdenum nitride film are stacked in this order; or the like may be employed. Note that a transparent conductive material containing indium oxide, tin oxide, or zinc oxide may be used.

The conductor 260 functioning as a gate electrode can be formed using, for example, a metal selected from aluminum, chromium, copper, tantalum, titanium, molybdenum, and tungsten, an alloy containing any of these metals as its component, or an alloy containing any of these metals in combination. Furthermore, one or more metals selected from manganese and zirconium may be used. Alternatively, a semiconductor typified by polycrystalline silicon doped with an impurity element such as phosphorus, or silicide such as nickel silicide may be used.

For example, a two-layer structure where a titanium film is stacked over aluminum may be employed. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Another example is a three-layer structure where a titanium film, an aluminum film, and a titanium film are stacked in this order. Alternatively, an alloy film or a nitride film that contains aluminum and one or more metals selected from titanium, tantalum, tungsten, molybdenum, chromium, neodymium, and scandium may be used.

Alternatively, for the conductor 260, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added may be used. Alternatively, a stacked-layer structure using the above light-transmitting conductive material and the above metal may be employed.

By using a conductive material with a high work function for the conductor 260, $V_{th}$ of the transistor 200a can be increased and the cutoff current can be decreased. A conductive material whose work function is preferably 4.8 eV or more, further preferably 5.0 eV or more, further preferably 5.2 eV or more, further preferably 5.4 eV or more, further preferably 5.6 eV or more is used for the conductor 260. Examples of the conductive material with a high work function include molybdenum, molybdenum oxide, Pt, Pt silicide, Ni silicide, indium tin oxide, and In—Ga—Zn oxide to which nitrogen is added.

The insulator 241 is provided to cover the conductor 260. As the insulator 241, it is possible to use an insulating film with barrier properties against oxygen and hydrogen, such as aluminum oxide, aluminum oxynitride, hafnium oxide, hafnium oxynitride, or silicon nitride. Formation using any of these materials can prevent oxidation of the conductor 260 by heat treatment process. Note that the insulator 241 can be omitted when a material that is hard to oxidize is used as the conductor 260.

The insulator 280 is provided over the transistor 200a. The insulator 280 preferably contains excess oxygen. In particular, when an insulator containing excess oxygen is provided as an interlayer film or the like in the vicinity of the transistor 200a, oxygen vacancies in the transistor 200a are reduced, whereby the reliability can be improved.

As the insulator containing excess oxygen, specifically, an oxide material from which part of oxygen is released by heating is preferably used. An oxide from which part of oxygen is released by heating is an oxide film of which the amount of released oxygen converted into oxygen atoms is greater than or equal to $1.0 \times 10^{18}$ atoms/cm$^{-3}$, preferably greater than or equal to $3.0 \times 10^{20}$ atoms/cm$^{-3}$ in TDS analysis. Note that the temperature of the film surface in the TDS analysis is preferably higher than or equal to 100° C. and lower than or equal to 700° C., or higher than or equal to 100° C. and lower than or equal to 500° C.

As such a material, a material containing silicon oxide or silicon oxynitride is preferably used, for example. Alternatively, metal oxide can be used.

Furthermore, the insulator 280 covering the transistor 200a may function as a planarization film that covers roughness thereunder.

<Transistor Structure 2>

FIGS. 17(A) to 17(C) are a top view and cross-sectional views of a transistor 200b. FIG. 17(A) is a top view. FIG. 17(B) is a cross-sectional view taken along the dashed-dotted line X1-X2 shown in FIG. 17(A). FIG. 17(C) is a cross-sectional view taken along the dashed-dotted line Y1-Y2 shown in FIG. 17(A). Note that for clarification of the drawing, some components are not illustrated in the top view of FIG. 17(A).

The transistor 200b differs from the transistor 200a in that the oxide semiconductor 230c, the insulator 250, and the conductor 260 are formed in an opening formed in the insulator 280.

Since the transistor 200b has a structure in which the conductors 240a and 240b hardly overlap the conductor 260, the parasitic capacitance added to the conductor 260 can be reduced. Thus, the transistor with a high operation frequency can be provided.

For other details of the transistor 200b, the description of the transistor 200a can be referred to.

<Transistor Structure 3>

FIGS. 18(A) to 18(C) are a top view and cross-sectional views of a transistor 200c. FIG. 18(A) is a top view, FIG. 18(B) is a cross-sectional view taken along the dashed-dotted line X1-X2 shown in FIG. 18(A), and FIG. 18(C) is a cross-sectional view taken along the dashed-dotted line Y1-Y2 shown in FIG. 18(A). Note that for clarification of the drawing, some components in the top view of FIG. 18(A) are not illustrated.

The transistor 200c in FIG. 18 differs from the transistor 200a in that a center portion of the oxide semiconductors 230a and 230b is etched (see FIG. 18(B)).

In the transistor 200a, a channel is formed in the oxide semiconductor 230b. In the transistor 200c, a channel is formed in the oxide semiconductor 230c. The oxide semiconductor 230c has lower electron mobility and a wider band gap than the oxide semiconductor 230b. Thus, the transistor 200c has lower on-state current and lower off-state current than the transistor 200a. The transistor 200c is suitable as a transistor whose off-state current is more valued than the on-state current.

The transistor 200c can be formed concurrently with the transistor 200a. For example, it is preferable to use the transistor 200a for transistors requiring high on-state current, e.g., the transistors Tr1 and Tr2 in FIG. 2, and use the transistor 200c for a transistor requiring low off-state current, e.g., the transistor OS1 in FIG. 10.

For other details of the transistor 200b, the description of the transistor 200a can be referred to.

<Transistor Structure 4>

FIGS. 19(A) to 19(C) are a top view and cross-sectional views of a transistor 200d. FIG. 19(A) is a top view, FIG. 19(B) is a cross-sectional view taken along the dashed-dotted line X1-X2 shown in FIG. 19(A), and FIG. 19(B) is a cross-sectional view taken along the dashed-dotted line Y1-Y2 shown in FIG. 19(A). Note that for clarification of the drawing, some components in the top view of FIG. 19(A) are not illustrated.

The transistor 200d differs from the transistor 200b in that a center portion of the oxide semiconductors 230a and 230b is etched (see FIG. 19(B)).

In the transistor 200b, a channel is formed in the oxide semiconductor 230b. In the transistor 200d, a channel is formed in the oxide semiconductor 230c. The oxide semiconductor 230c has lower electron mobility and a wider band gap than the oxide semiconductor 230b. Thus, the transistor 200d has lower on-state current and lower off-state current than the transistor 200b. The transistor 200d is suitable as a transistor whose off-state current is more valued than the on-state current.

The transistor 200d can be formed concurrently with the transistor 200b. For example, it is preferable to use the transistor 200b for transistors requiring high on-state current, e.g., the transistors Tr1 and Tr2 in FIG. 2, and use the transistor 200d for a transistor requiring low off-state current, e.g., the transistor OS1 in FIG. 10.

For other details of the transistor 200d, the description of the transistor 200b can be referred to.

Embodiment 4

In this embodiment, structures of oxide semiconductors that can be used for the OS transistor will be described.

In this specification, the term "parallel" indicates a state where the angle between two straight lines ranges from −10° to 10°, and accordingly also includes the case where the angle ranges from −5° to 5°. In addition, the term "substantially parallel" indicates a state where the angle between two straight lines ranges from −30° to 30°. In addition, the term "perpendicular" indicates a state where the angle between two straight lines ranges from 80° to 100°, and accordingly also includes the case where the angle ranges from 85° to 95°. In addition, the term "substantially perpendicular" indicates a state where the angle between two straight lines ranges from 60° to 120°.

Furthermore, in this specification, trigonal and rhombohedral crystal systems are included in a hexagonal crystal system.

<Structure of Oxide Semiconductor>

The structures of oxide semiconductors will be described below.

Oxide semiconductors can be classified into a single crystal oxide semiconductor and a non-single-crystal oxide semiconductors. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

From another perspective, oxide semiconductors can be classified into an amorphous oxide semiconductor and crystalline oxide semiconductors. Examples of the crystalline oxide semiconductors include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be referred to as a completely amorphous oxide semiconductor. Moreover, an oxide semiconductor that is not isotropic (e.g., an oxide semiconductor that has a periodic structure in a microscopic region) cannot be referred to as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, the CAAC-OS will be described.

The CAAC-OS is an oxide semiconductor having a plurality of c-axis-aligned crystal parts (also referred to as pellets).

Analysis of a CAAC-OS by X-ray diffraction (XRD) is described. For example, in structural analysis of a CAAC-OS including an $InGaZnO_4$ crystal that is classified into the space group R-3 m by an out-of-plane method, a peak appears at a diffraction angle (2θ of around 31°. This peak is derived from the (009) plane of the $InGaZnO_4$ crystal, which indicates that crystals in the CAAC-OS have c-axis alignment, and that the c-axes are aligned in a direction substantially perpendicular to a surface where the CAAC-OS film is formed (also referred to as formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3 m. Therefore, it is preferred that the CAAC-OS do not show the peak at a 2θ of around 36°.

Meanwhile, in structural analysis of the CAAC-OS by an in-plane method in which an X-ray is incident on the CAAC-OS in a direction parallel to the formation surface, a peak appears at a 2θ of around 56°. This peak is derived from the (110) plane of the $InGaZnO_4$ crystal. When analysis (φ scan) is performed with a 2θ fixed at around 56° and with the sample rotated using a normal vector of the sample surface as an axis (φ axis), no clear peak appears. Meanwhile, when single crystal $InGaZnO_4$ is subjected to φ scan with a 2θ fixed at around 56°, six peaks that are derived from crystal planes equivalent to the (110) plane are observed. Accordingly, the structural analysis using XRD shows that a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an $InGaZnO_4$ crystal in a direction parallel to the formation surface of the CAAC-OS, a diffraction pattern including a spot derived from the (009) plane of the $InGaZnO_4$ crystal appears. Thus, the electron diffraction also indicates that pellets included in the CAAC-OS have c-axis alignment and that the c-axes are aligned in the direction substantially perpendicular to the formation surface or the top surface of the CAAC-OS. Meanwhile, a ring-like diffraction pattern is observed when an electron beam with a probe diameter of 300 nm is incident on the same sample in a direction perpendicular to the sample surface. It is found that the a-axes and b-axes of the pellets included in the CAAC-OS do not have orientation.

In a combined analysis image (also referred to as high-resolution TEM image) of a bright-field image and a diffraction pattern of the CAAC-OS, which is obtained using a transmission electron microscope (TEM), a plurality of pellets can be observed. However, even in the high-resolution TEM image, a boundary between pellets, that is, a crystal grain boundary (also referred to as grain boundary) cannot be clearly observed in some cases. Thus, in the CAAC-OS, a reduction in electron mobility due to the grain boundary is less likely to occur.

From the high-resolution TEM image, pellets in which metal atoms are arranged in a layered manner can be observed. The size of a pellet is larger than or equal to 1 nm or larger than or equal to 3 nm. Therefore, the pellet can be referred to as a nanocrystal (nc: nanocrystal). Furthermore, the CAAC-OS can also be referred to as an oxide semiconductor including CANC (C-Axis Aligned nanocrystals). A pellet reflects unevenness of a formation surface or a top surface of the CAAC-OS and is parallel to the formation surface or the top surface of the CAAC-OS.

Furthermore, the pellet is confirmed to have a hexagonal shape. Note that the shape of the pellet is not always a regular hexagonal shape but is a non-regular hexagonal shape in many cases.

A clear crystal grain boundary cannot be observed in the CAAC-OS. In the CAAC-OS, formation of a crystal grain boundary is inhibited by distortion of a lattice arrangement. This is probably because the CAAC-OS can tolerate distortion owing to a low density of arrangement of oxygen atoms in the a-b plane direction, the interatomic bond distance changed by substitution of a metal element, and the like.

As described above, the CAAC-OS has c-axis alignment, its pellets (nanocrystals) are connected in the a-b plane direction, and its crystal structure has distortion. Accordingly, the CAAC-OS can also be referred to as an oxide semiconductor including a CAA crystal (c-axis-aligned a-b-plane-anchored crystal).

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that impurities mean an element other than the main components of the oxide semiconductor, such as hydrogen, carbon, silicon, and a transition metal element. For example, an element, such as silicon, having higher strength of bonding to oxygen than a metal element contained in an oxide semiconductor extracts oxygen from the oxide semiconductor, which results in disorder of the atomic arrangement and reduced crystallinity of the oxide semiconductor. Furthermore, a heavy metal such as iron or nickel, argon, carbon dioxide, or the like has a large atomic radius (or molecular radius), which becomes a factor in disturbing the atomic arrangement of the oxide semiconductor and decreasing crystallinity.

<nc-OS>

Next, an nc-OS will be described.

Analysis of an nc-OS by XRD is described. In structural analysis of an nc-OS by an out-of-plane method, for example, a peak indicating orientation does not appear. That is, a crystal of the nc-OS does not have orientation.

Furthermore, for example, when an electron beam with a probe diameter of 50 nm is incident on a 34-nm-thick region of a thinned nc-OS including an $InGaZnO_4$ crystal in a direction parallel to the formation surface, a ring-like diffraction pattern (nanobeam electron diffraction pattern) is observed. Furthermore, when an electron beam with a probe diameter of 1 nm is incident on the same sample, a plurality of spots are observed in the ring-shaped region. Accordingly, ordering in an nc-OS is not observed when an electron beam having a probe diameter of 50 nm is incident but is observed when an electron beam having a probe diameter of 1 nm is incident.

Furthermore, when an electron beam with a probe diameter of 1 nm is incident on a region with a thickness smaller than 10 nm, an electron diffraction pattern in which spots are arranged in an approximately regular hexagonal shape is observed in some cases. This means that an nc-OS in the thickness range of smaller than 10 nm has a well-ordered region, i.e., a crystal. Note that an electron diffraction pattern having regularity is not observed in some regions because crystals are oriented in various directions.

In a high-resolution TEM image, the nc-OS has a region in which a crystal part can be observed, and a region in which a clear crystal part cannot be observed. In many cases, the size of a crystal part included in the nc-OS is larger than or equal to 1 nm and smaller than or equal to 10 nm, or specifically, larger than or equal to 1 nm and smaller than or equal to 3 nm. Note that an oxide semiconductor whose crystal part has a size larger than 10 nm and smaller than or equal to 100 nm is sometimes referred to as a microcrystalline oxide semiconductor. In a high-resolution TEM image of the nc-OS, for example, a crystal grain boundary cannot be clearly observed in some cases. Note that there is a possibility that the origin of the nanocrystal is the same as that of a pellet in a CAAC-OS; therefore, a crystal part of the nc-OS may be referred to as a pellet in the following description.

As described above, in the nc-OS, a microscopic region (e.g., a region larger than or equal to 1 nm and smaller than or equal to 10 nm, in particular, a region larger than or equal to 1 nm and smaller than or equal to 3 nm) has a periodic atomic arrangement. Furthermore, there is no regularity of crystal orientation between different pellets in the nc-OS. Thus, the orientation of the whole film cannot be observed. Accordingly, the nc-OS cannot be distinguished from an a-like OS or an amorphous oxide semiconductor by some analysis methods.

Note that since there is no regularity of crystal orientation between the pellets (nanocrystals), the nc-OS can also be referred to as an oxide semiconductor including RANC (Random Aligned nanocrystals) or an oxide semiconductor including NANC (Non-Aligned nanocrystals).

The nc-OS is an oxide semiconductor that has higher regularity than an amorphous oxide semiconductor; therefore, the nc-OS has a lower density of defect states than an a-like OS and an amorphous oxide semiconductor. Since there is no regularity of crystal orientation between different pellets in the nc-OS, the nc-OS has a higher density of defect states than the CAAC-OS.

<a-like OS>

An a-like OS is an oxide semiconductor having a structure between those of the nc-OS and an amorphous oxide semiconductor.

An a-like OS has an unstable structure containing a void.

For example, growth of a crystal part in the a-like OS is sometimes induced by electron irradiation. In contrast, in the nc-OS and the CAAC-OS, growth of a crystal part is hardly induced by electron irradiation. That is, it is demonstrated that the a-like OS has an unstable structure as compared with the nc-OS and the CAAC-OS.

Furthermore, the a-like OS has a lower density than the nc-OS and the CAAC-OS because it contains a void. Specifically, the density of the a-like OS is higher than or equal to 78.6% and lower than 92.3% of the density of a single crystal having the same composition. Furthermore, the density of each of the nc-OS and the CAAC-OS is higher than or equal to 92.3% and lower than 100% of the density of the single crystal having the same composition. It is difficult to deposit an oxide semiconductor having a density lower than 78% of that of the single crystal.

For example, in an oxide semiconductor that satisfies In:Ga:Zn=1:1:1 [atomic ratio], the density of single crystal InGaZnO$_4$ with a rhombohedral crystal structure is 6.357 g/cm$^{-3}$. Accordingly, for example, for the oxide semiconductor that satisfies In:Ga:Zn=1:1:1 [atomic ratio], the density of the a-like OS is higher than or equal to 5.0 g/cm$^{-3}$ and lower than 5.9 g/cm$^{-3}$, and the density of each of the nc-OS and the CAAC-OS is higher than or equal to 5.9 g/cm$^{-3}$ and lower than 6.3 g/cm$^{-3}$.

Note that in the case where single crystals with the same composition do not exist, single crystals with different compositions are combined at an adequate ratio, which makes it possible to calculate a density equivalent to that of a single crystal with the desired composition. The density of the single crystal with the desired composition can be calculated using a weighted average according to the combination ratio of the single crystals with different compositions. Note that it is preferable to combine as few kinds of single crystals as possible to calculate the density.

As described above, oxide semiconductors have various structures and various properties. Note that an oxide semiconductor may be a stacked film including two or more kinds of an amorphous oxide semiconductor, an a-like OS, an nc-OS, and a CAAC-OS, for example.

Embodiment 5

In this embodiment, a semiconductor device which includes the memory device will be described.

For example, the memory device is incorporated in a processor (also referred to as "processing unit") and stores data (including an instruction) necessary for the operation of the processor. Examples of the processor include a CPU, a GPU (Graphics Processing Unit), a PLD (Programmable Logic Device), a DSP (Digital Signal Processor), an MCU (Microcontroller Unit), a custom LSI, and an RFIC.

<<CPU>>

Figure 20:
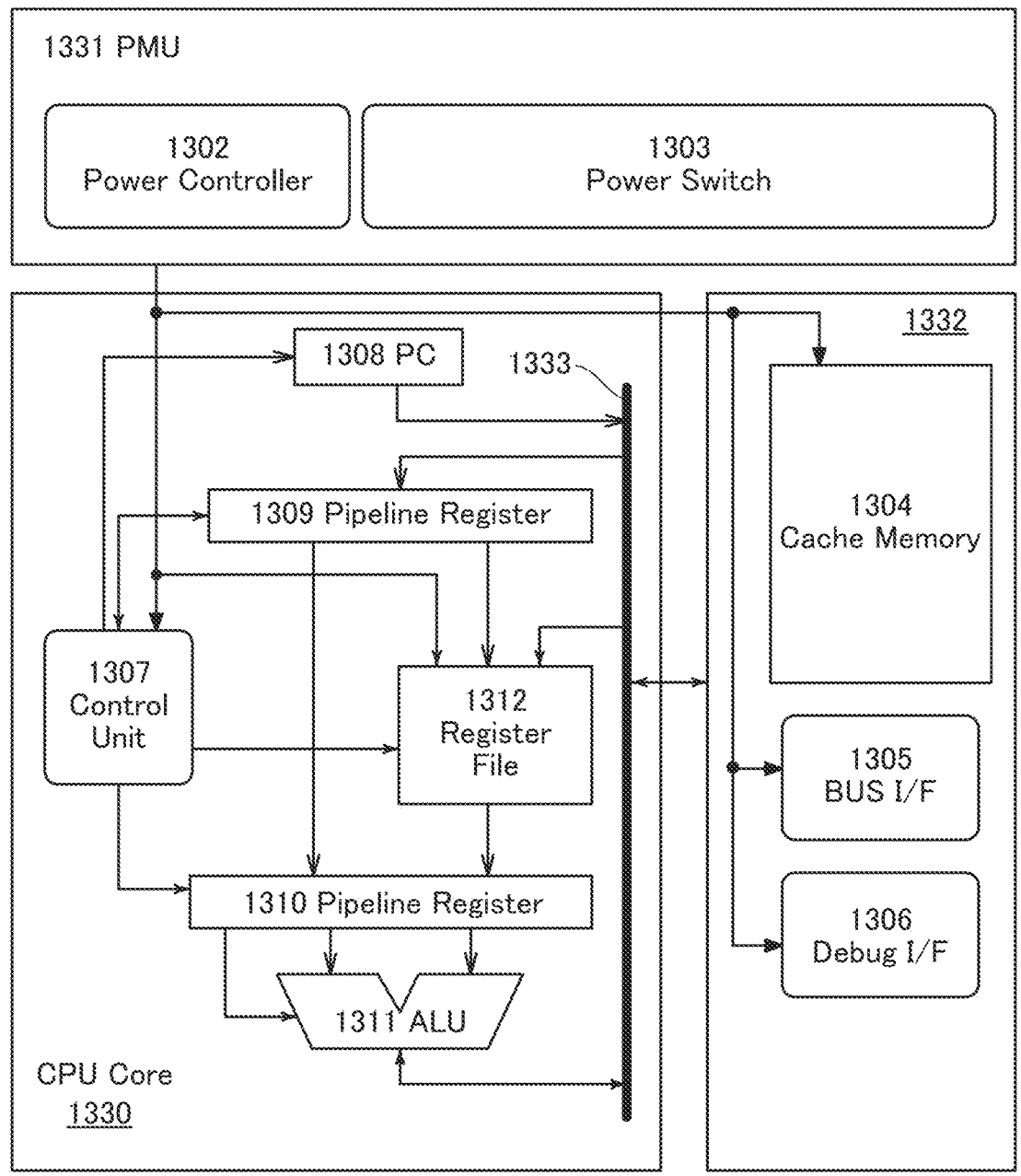
FIG. 20 A block diagram illustrating a structure example of a processor (CPU).

FIG. 20 is a block diagram illustrating a structure example of a CPU. A CPU 1300 illustrated in FIG. 20 includes a CPU core 1330, a power management unit (PMU) 1331, and a peripheral circuit 1332.

The CPU core 1330 includes a control unit 1307, a program counter (PC) 1308, a pipeline register 1309, a pipeline register 1310, an arithmetic logic unit (ALU: Arithmetic Logic Unit) 1311, a register file 1312, and a data bus 1333. Data is transmitted between the CPU core 1330 and the peripheral circuit 1332 via the data bus 1333.

The PMU 1331 includes a power controller 1302 and a power switch 1303. The peripheral circuit 1332 includes a cache memory 1304, a bus interface (BUS I/F) 1305, and a debug interface (Debug I/F) 1306.

The memory device described in Embodiment 1 can be used in the cache memory 1304. This can suppress an increase in area and power consumption and increase the capacity of the cache memory 1304. Moreover, the standby power of the cache memory 1304 can be reduced; accordingly, the CPU 1300 with a small size and low power consumption can be provided.

The control unit 1307 has functions of decoding and executing instructions contained in a program such as input applications by controlling the overall operations of the program counter 1308, the pipeline registers 1309 and 1310, the ALU 1311, the register file 1312, the cache memory 1304, the bus interface 1305, the debug interface 1306, and the power controller 1302.

The ALU 1311 has a function of performing a variety of arithmetic operations such as four arithmetic operations and logic operations. The cache memory 1304 has a function of temporarily storing frequently used data. The program counter 1308 is a register having a function of storing an address of an instruction to be executed next. Note that although not illustrated in FIG. 20, the cache memory 1304 is provided with a control circuit for controlling the operation of the cache memory 1304.

The pipeline register 1309 has a function of temporarily storing instruction data. The register file 1312 includes a plurality of registers including a general purpose register and can store data that is read from the main memory, data obtained as a result of arithmetic operations in the ALU 1311, or the like. The pipeline register 1310 has a function of temporarily storing data used for arithmetic operations performed in the ALU 1311, data obtained as a result of arithmetic operations in the ALU 1311, or the like.

The bus interface 1305 functions as a path for data between the CPU 1300 and devices outside the CPU 1300. The debug interface 1306 functions as a path of a signal for inputting an instruction to control debugging to the CPU 1300.

The power switch 1303 has a function of controlling supply of the power supply voltage to circuits other than the power controller 1302 in the CPU 1300. The CPU 1300 includes several power domains, and a circuit to be power gated belongs to any one of the power domains in the CPU 1300. The power switch 1303 controls supply of the power supply voltage to circuits in the same power domain. The power controller 1302 has a function of controlling the operation of the power switch 1303. With such a power supply management system, the CPU 1300 can perform power gating. An example of the procedure of the power gating will be described.

First, the CPU core 1330 sets the timing for stopping the supply of the power supply voltage in a register of the power controller 1302. Next, an instruction to start power gating is sent from the CPU core 1330 to the power controller 1302. Then, the registers and the cache memory 1304 in the CPU 1300 start data saving. Subsequently, the power switch 1303 stops the supply of the power supply voltage to the circuits other than the power controller 1302 in the CPU 1300. Then, an interrupt signal is input to the power controller 1302, thereby starting the supply of the power supply voltage to the circuits included in the CPU 1300. Note that a counter may be provided in the power controller 1302 to be used to determine the timing of starting the supply of the power supply voltage regardless of input of an interrupt signal. Next, the registers start data restoration. Furthermore, when the cache memory 1304 operates, for example, by a write-back method, data of the NVM 20 is loaded into the SMC 10. After that, execution of an instruction is resumed in the control unit 1307.

<<RFIC>>

An RFIC is described as an example of a processor. The RFIC is also referred to as an RF tag, a wireless chip, a wireless ID chip, and the like. The RFIC includes a memory circuit, stores necessary information in the memory circuit, and transmits and receives information to/from the outside by using contactless means, for example, wireless communication. With these features, the RFIC can be used for an individual authentication system in which an object is recognized by reading the individual information of the object or the like, for example.

Figure 21:
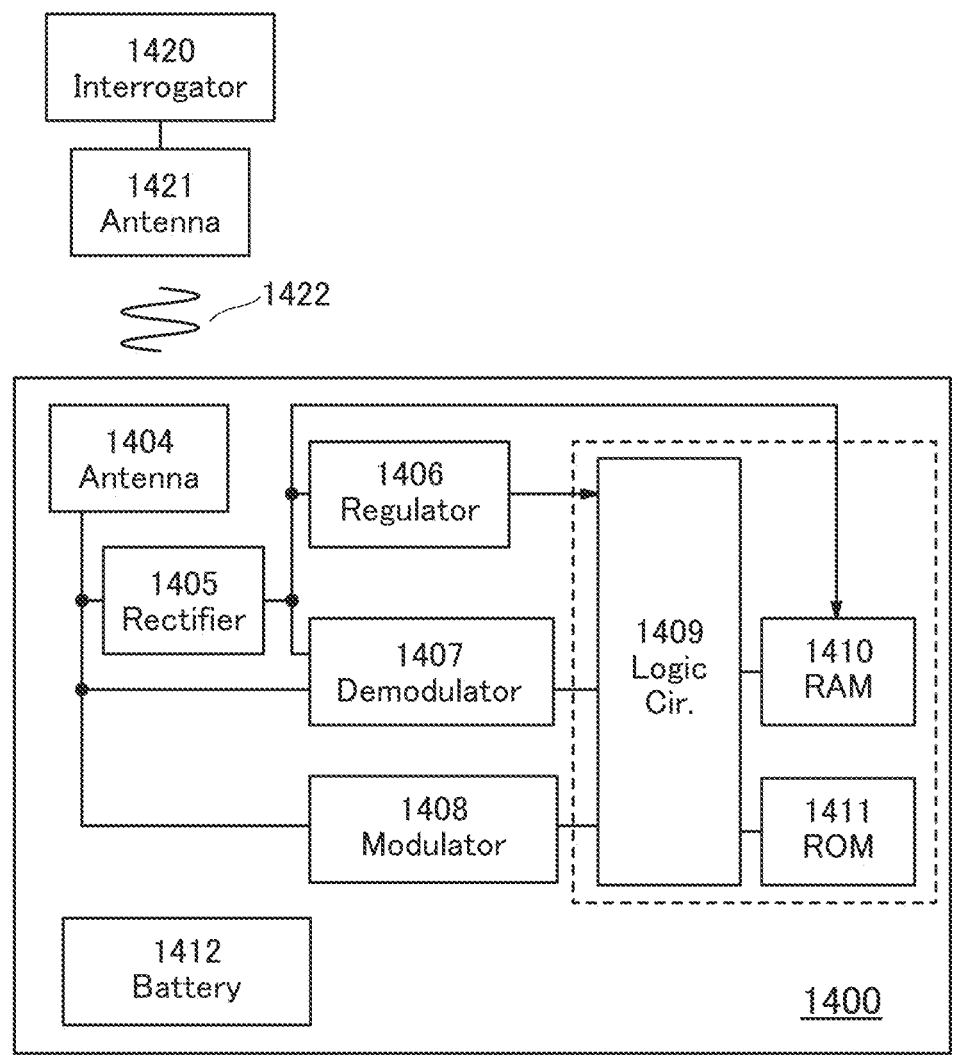
FIG. 21 A block diagram illustrating a structure example of a processor (RFIC).

FIG. 21 is a block diagram illustrating a structure example of an RFIC. An RFIC 1400 includes an antenna 1404, a rectifier circuit 1405, a constant voltage circuit 1406, a demodulation circuit 1407, a modulation circuit 1408, a logic circuit 1409, a RAM 1410, a ROM (read-only memory) 1411, and a battery 1412. Decision whether each of these circuits is provided or not can be made as needed. For example, although the RFIC 1400 is of an active type, it may be of a passive type without the battery 1412. Here, although the RFIC 1400 is a semiconductor device including the antenna 1404, a semiconductor device not including the antenna 1404 can also be referred to as the RFIC 1400.

The memory device of Embodiment 1 can be used in the RAM 1410. Because the memory device of Embodiment 1 has high compatibility with a CMOS circuit, circuits other than the antenna 1404 can be incorporated in one chip of the RFIC 1400, without complicating the manufacturing process. The antenna 1404 whose performance corresponds to the communication zone is mounted on the chip. As data transmission methods, an electromagnetic coupling method in which a pair of coils is provided so as to face each other and communicates with each other by mutual induction, an electromagnetic induction method in which communication is performed using an induction field, a radio wave method in which communication is performed using a radio wave, and the like are given. Any of these methods can be used in the RFIC 1400 described in this embodiment.

The antenna 1404 exchanges a radio signal 1422 with an antenna 1421 which is connected to a communication device 1420. The rectifier circuit 1405 generates an input voltage by rectification, for example, half-wave voltage doubler rectification of an input alternating signal generated by reception of a radio signal at the antenna 1404 and smoothing of the rectified signal with a capacitor provided in a later stage in the rectifier circuit 1405. Note that a limiter circuit may be provided on the input side or the output side of the rectifier circuit 1405. The limiter circuit controls power so that power which is higher than or equal to a certain level of power is not input to a circuit in a later stage if the amplitude of the input alternating signal is high and an internal generation voltage is high.

The constant voltage circuit 1406 generates a stable power supply voltage from an input voltage and supplies it to each circuit. Note that the constant voltage circuit 1406 may include a reset signal generation circuit. The reset signal generation circuit is a circuit which generates a reset signal of the logic circuit 1409 by utilizing the rise of the stable power supply voltage.

The demodulation circuit 1407 demodulates the input alternating signal by envelope detection and generates the demodulated signal. Furthermore, the modulation circuit 1408 performs modulation in accordance with data to be output from the antenna 1404.

The logic circuit 1409 decodes and processes the demodulated signal. The RAM 1410 retains the input information and includes a row decoder, a column decoder, a driver, a memory region, and the like. Furthermore, the ROM 1411 stores an identification number (ID) or the like and outputs it in accordance with processing.

Embodiment 6

In this embodiment, examples of a semiconductor wafer, an IC chip, and an electronic component each including the memory device or the semiconductor device described in the above embodiments will be described with reference to FIG. 22 and FIG. 24.

[Semiconductor Wafer, Chip]

Figure 22A:
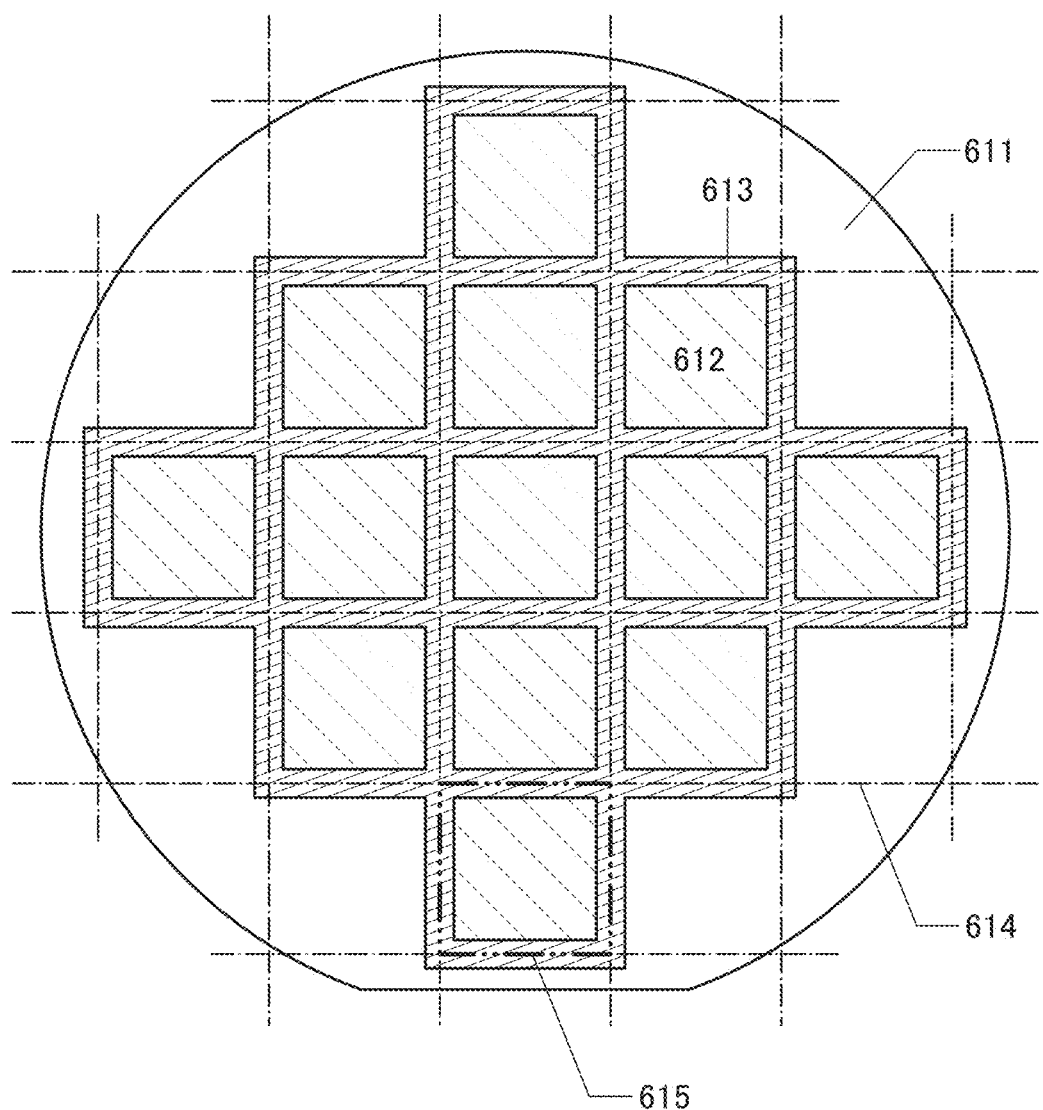

FIG. 22(A) is a top view illustrating a substrate 611 before dicing treatment. As the substrate 611, a semiconductor substrate (also referred to as "semiconductor wafer") can be used, for example. The substrate 611 has a plurality of circuit regions 612. The semiconductor device shown in any of the above embodiments, for example, can be provided in the circuit region 612.

Figure 22B:
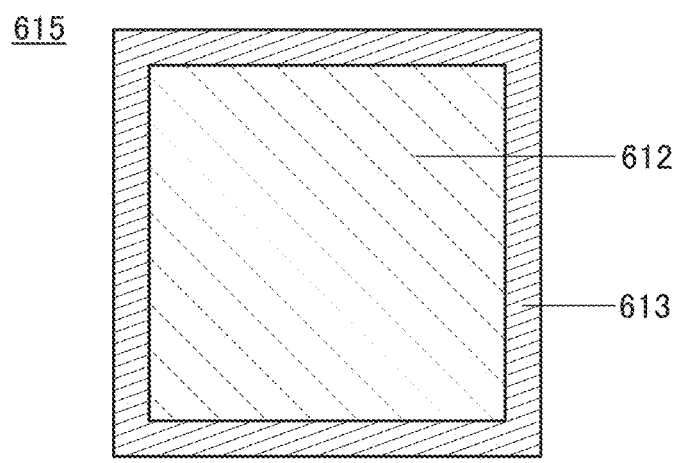

Each of the circuit regions 612 is surrounded by a separation region 613. Separation lines (also referred to as "dicing lines") 614 are set at a position overlapping the separation regions 613. Chips 615 each including the circuit region 612 can be cut from the substrate 611 by cutting the substrate 611 along the separation lines 614. FIG. 22(B) is an enlarged view of the chip 615.

Furthermore, a conductive layer or a semiconductor layer may be provided in the separation regions 613. Providing a conductive layer or a semiconductor layer in the separation regions 613 relieves ESD that might be caused in a dicing step, preventing a decrease in the yield in the dicing step. Furthermore, a dicing step is generally performed while letting pure water whose specific resistance is decreased by the inclusion of a carbonic acid gas or the like flow to a cut portion, in order to cool down a substrate, remove swarf, and prevent electrification, for example. Providing a conductive layer or a semiconductor layer in the separation regions 613 allows a reduction in the usage of the pure water. Therefore, the cost of manufacturing the semiconductor device can be reduced. Moreover, the semiconductor device can be manufactured with improved productivity.

For a semiconductor layer provided in the separation regions 613, it is preferable to use a material having a bandgap larger than or equal to 2.5 eV and smaller than or equal to 4.2 eV, preferably larger than or equal to 2.7 eV and smaller than or equal to 3.5 eV. The use of such a material allows accumulated charge to be released slowly; thus, rapid move of charge due to ESD can be suppressed and electrostatic breakdown is less likely to occur.

[Electronic Component]

FIG. 23 shows an example where the chip 615 is used for an electronic component. Note that an electronic component is also referred to as a semiconductor package or an IC package. For electronic components, there are various standards and names corresponding to a terminal extraction direction and a terminal shape.

An electronic component is completed by combining the semiconductor device described in any of the above embodiments and components other than the semiconductor device in the assembly process (post-process).

Figure 23A:
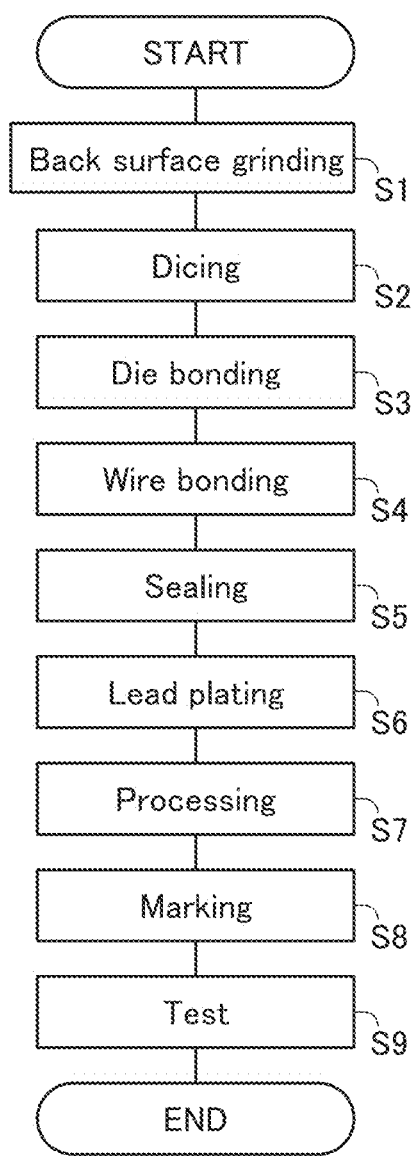
FIGS. 23A and 23B A flow chart showing fabrication steps of a semiconductor device and a perspective view of the semiconductor device.

The post-process is described with reference to a flow chart shown in FIG. 23(A). After an element substrate including the semiconductor device described in any of the above embodiments is completed in a pre-process, a "back surface grinding step" is performed to grind a back surface (a surface where the semiconductor device and the like are not formed) of the element substrate (Step S1). When the element substrate is thinned by grinding, warpage or the like of the element substrate is reduced, resulting in the reduction in size of the electronic component.

Next, a "dicing step" is performed to divide the element substrate into a plurality of chips (Step S2). Then, a "die bonding step" is performed to pick up the divided chips separately and bond them to a lead frame (Step S3). To bond a chip and a lead frame in the die bonding step, resin bonding, tape-automated bonding, or the like is selected as determined as appropriate by products. Note that the chip may be bonded to an interposer substrate instead of the lead frame.

Next, a "wire bonding step" is performed to electrically connect a lead of the lead frame and an electrode on the chip through a metal fine line (wire) (Step S4). A silver line or a gold line can be used as the metal fine line. Furthermore, ball bonding or wedge bonding can be used as the wire bonding.

The wire-bonded chip is subjected to a "sealing step (molding step)" of sealing the chip with an epoxy resin or the like (Step S5). Through the sealing step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, a "lead plating step" is performed to plate the lead of the lead frame (Step S6). With the plating process, corrosion of the lead can be prevented, and soldering for mounting the electronic component on a printed circuit board in a later step can be performed more surely. Then, a "formation step" is performed to cut and process the lead (Step S7).

Next, a "marking step" in which printing (marking) is performed on a surface of the package is conducted (Step S8). After a "testing step" (Step S9) for checking whether an external shape is good and whether there is a malfunction, for example, the electronic component is completed.

Figure 23B:
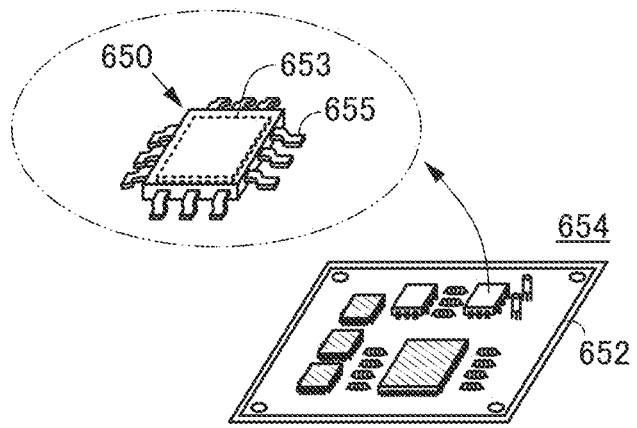

Furthermore, FIG. 23(B) is a schematic perspective view of the completed electronic component. FIG. 23(B) shows a schematic perspective view of a QFP (Quad Flat Package) as an example of the electronic component. An electronic component 650 illustrated in FIG. 23(B) includes a lead 655 and a semiconductor device 653. As the semiconductor device 653, the memory device or the semiconductor device described in any of the above embodiments can be used, for instance.

The electronic component 650 in FIG. 23(B) is, for example, mounted on a printed wiring board 652. A plurality of electronic components 650 are used in combination and electrically connected to each other over the printed wiring board 652; thus, a board 654 on which the electronic components are mounted is completed. The completed board 654 is used in an electronic device or the like.

Embodiment 7

The memory device or the semiconductor device described in any of the above embodiments is preferably used in an electronic device incorporating a battery. With use of the memory device or the semiconductor device described in any of the above embodiments for an electronic device incorporating a battery, power consumption of the electronic device can be reduced, and power of the battery can be saved. FIG. 24 illustrates specific examples.

Figure 24A:
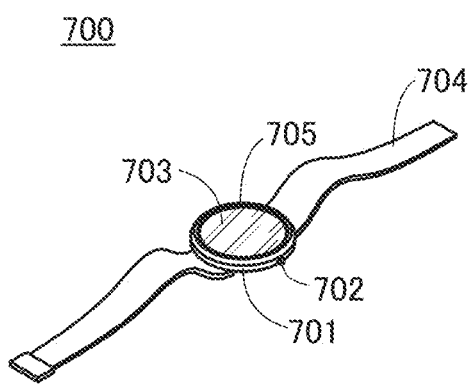
FIGS. 24A to 24F Perspective views illustrating examples of an electronic device.

FIG. 24(A) illustrates a wristwatch terminal 700. The wristwatch terminal 700 includes a housing 701, a winding crown 702, a display portion 703, a belt 704, a sensing unit 705, and the like. A battery and the memory device or the semiconductor device are provided inside the housing 701. The display portion 703 may be provided with a touch panel. A user can input information by using a finger touching the touch panel as a pointer.

The sensing unit 705 has a function of obtaining information by sensing a surrounding state. For example, a camera, an acceleration sensor, a direction sensor, a pressure sensor, a temperature sensor, a humidity sensor, an illuminance sensor, or a GPS (Global Positioning System) signal receiver circuit can be used as the sensing unit 705.

For example, when an arithmetic device in the housing 701 determines that the ambient light level sensed by an illuminance sensor of the sensing unit 705 is sufficiently higher than predetermined illuminance, the luminance of the display portion 703 is lowered. Meanwhile, when the arithmetic device determines that the ambient light level is not sufficiently high, the luminance of the display portion 703 is increased. As a result, an electronic device with reduced power consumption can be provided.

Figure 24B:
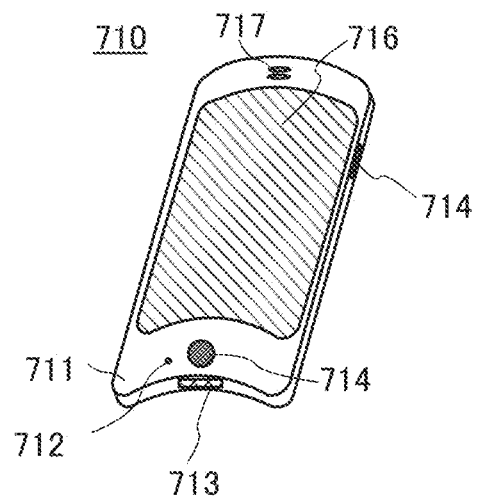

FIG. 24(B) illustrates a mobile phone 710. The mobile phone 710 includes a housing 711, a display portion 716, operation buttons 714, an external connection port 713, a speaker 717, a microphone 712, and the like. A battery and the memory device or the semiconductor device are provided inside the housing 711. When the display portion 716 is touched with a finger or the like, information can be input to the mobile phone 710. Various operations such as making a call and inputting letters can be performed by touch on the display portion 716 with a finger or the like. In addition, power ON/OFF operation or switching types of images displayed on the display portion 716 can be performed with the operation button 714. For example, the screen can be switched from a mail creation screen to a main menu screen.

Figure 24C:
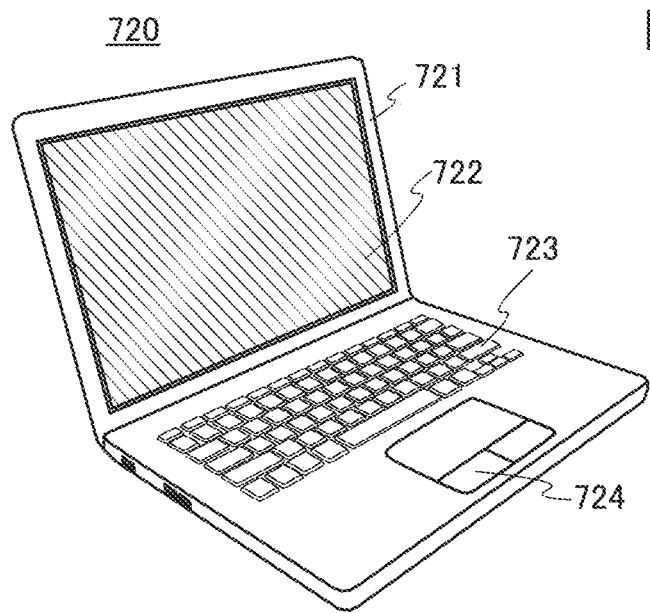

FIG. 24(C) illustrates a laptop personal computer 720 including a housing 721, a display portion 722, a keyboard 723, a pointing device 724, and the like. A battery and the memory device or the semiconductor device are provided inside the housing 711.

Figure 24D:
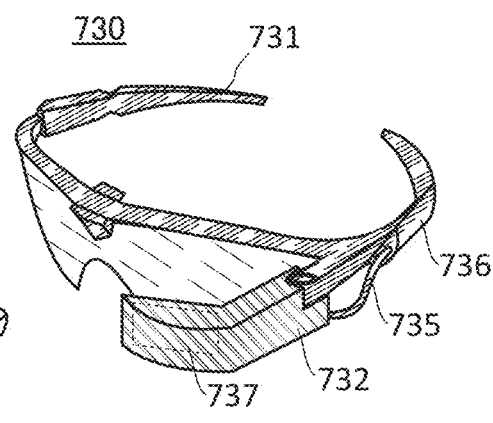

FIG. 24(D) illustrates a goggle-type display 730. The goggle-type display 730 includes temples 731, a housing 732, a cable 735, a battery 736, and a display portion 737. The battery 736 is held in the temple 731. The display portion 737 is provided in the housing 732. The housing 732 incorporates a variety of electronic components such as a semiconductor device, a wireless communication device, and a memory device. Power is supplied from the battery 736 through the cable 735 to the display portion 737 and the electronic components in the housing 732. A variety of information such as an image transmitted wirelessly is displayed on the display portion 737.

A camera may be provided in the housing 732 of the goggle-type display 730. A user can operate the goggle-type display 730 owing to the camera, which senses movement of the eye and eyelid of the user. Furthermore, the temple 731 of the goggle-type display 730 may be provided with various sensors such as a temperature sensor, a pressure sensor, an acceleration sensor, and a biosensor. For example, the goggle-type display 730 obtains biological information on the user with a biosensor and stores the information in the memory device of the housing 732. Furthermore, the goggle-type display 730 may transmit biological information to another information terminal with a radio signal.

Figure 24E:
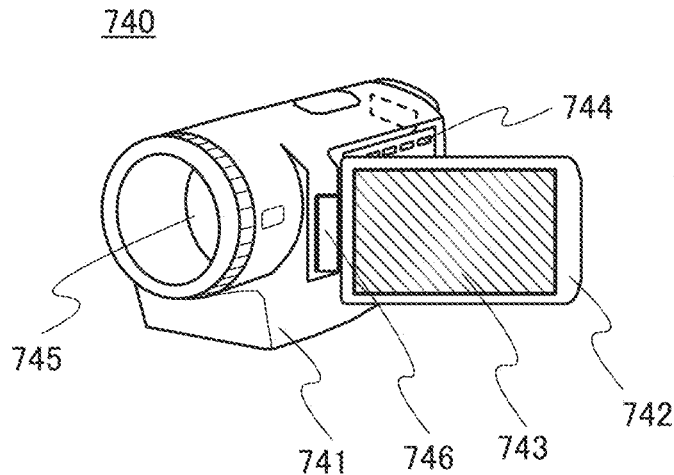

FIG. 24(E) illustrates a video camera 740. The video camera 740 includes a first housing 741, a second housing 742, a display portion 743, an operation key 744, a lens 745, a joint 746, and the like. The operation key 744 and the lens 745 are provided in the first housing 741, and the display portion 743 is provided in the second housing 742. Furthermore, a battery and the memory device or the semiconductor device are provided inside the first housing 741. The battery may be provided outside the first housing 741. The first housing 741 and the second housing 742 are connected to each other with the joint 746, and the angle between the first housing 741 and the second housing 742 can be changed with the joint 746. Images on the display portion 743 may be switched in accordance with the angle at the joint 746 between the first housing 741 and the second housing 742.

Figure 24F:
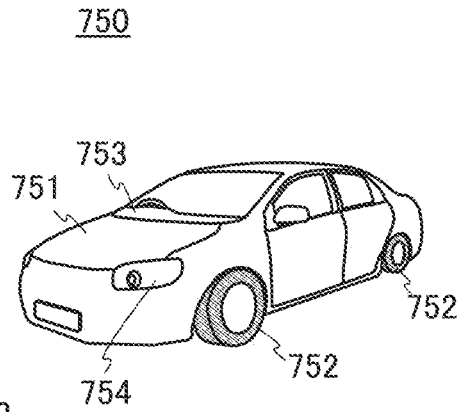

FIG. 24(F) illustrates an automobile 750. The automobile 750 includes a car body 751, wheels 752, a dashboard 753, lights 754, and the like. A battery and the memory device or the semiconductor device are provided inside the car body 751.

In this specification and the like, ordinal numbers such as "first," "second," and "third" are used in order to avoid confusion among components. Thus, the terms do not limit the number of components. In addition, the terms do not limit the order of components. For example, in this specification and the like, a "first" component in one embodiment can be referred to as a "second" component in other embodiments or claims. Furthermore, in this specification and the like, a "first" component in one embodiment can be omitted in other embodiments or claims.

In this specification and the like, one of a source and a drain is denoted as "one of a source and a drain" (or a first electrode or a first terminal) and the other of the source and the drain is denoted as "the other of the source and the drain" (or a second electrode or a second terminal) in the description of the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit a function of the component. For example, an "electrode" is used as part of a "wiring" in some cases, and vice versa. Moreover, the term "electrode" or "wiring" can also mean a plurality of "electrodes" or "wirings" formed in an integrated manner.

Furthermore, in this specification and the like, voltage and potential can be interchanged with each other as appropriate. Voltage refers to a potential difference from a reference potential. Given that the reference potential is a ground potential, for example, voltage can be replaced with potential. The ground potential does not necessarily mean 0 V. Note that potentials are relative values, and a potential supplied to a wiring or the like is sometimes changed depending on the reference potential.

Note that in this specification and the like, the terms such as "film" and "layer" can be interchanged with each other depending on the case or circumstances. For example, the term "conductive layer" can be changed into the term "conductive film" in some cases. Alternatively, for example, the term "insulating film" can be changed into the term "insulating layer" in some cases.

In this specification and the like, a switch has a function of determining whether current flows or not by being conducting (on) or not conducting (off). Alternatively, a switch has a function of selecting and changing a current path. For example, an electrical switch or a mechanical switch can be used. That is, a switch is not limited to a certain element and can be any element capable of controlling current.

Examples of an electrical switch include a transistor (e.g., a bipolar transistor and a MOS transistor), a diode (e.g., a PN diode, a PIN diode, a Schottky diode, an MIM (Metal Insulator Metal) diode, an MIS (Metal Insulator Semiconductor) diode, and a diode-connected transistor), and a logic circuit in which such elements are combined.

Note that in the case of using a transistor as a switch, the "on state" of the transistor refers to a state in which a source and a drain of the transistor can be regarded as being electrically short-circuited. In addition, the "off state" of the transistor refers to a state in which the source and the drain of the transistor can be regarded as being electrically disconnected. Note that in the case where a transistor operates just as a switch, there is no particular limitation on the polarity (conductivity type) of the transistor.

An example of a mechanical switch is a switch using a MEMS (microelectromechanical system) technology, such as a digital micromirror device (DMD). Such a switch includes an electrode that can be moved mechanically, and its conduction and non-conduction is controlled with movement of the electrode.

For example, in this specification and the like, an explicit description "X and Y are connected" means that X and Y are electrically connected and that X and Y are directly connected.

Here, X and Y each denote an object (e.g., a device, an element, a circuit, a wiring, an electrode, a terminal, a conductive film, or a layer).

An example of the case where X and Y are directly connected is the case where X and Y are connected without an element that enables an electrical connection between X and Y (e.g., a switch, a transistor, a capacitor, an inductor, a resistor, a diode, a display element, a light-emitting element, or a load).

An example of the case where X and Y are electrically connected is the case where one or more elements that enable an electrical connection between X and Y (e.g., a switch, a transistor, a capacitor, an inductor, a resistor, a diode, a display element, a light-emitting element, or a load) can be connected between X and Y. Note that a switch has a function of determining whether current flows or not by being turning on or off (becoming an on state or an off state). Alternatively, the switch has a function of selecting and changing a current path. Note that the case where X and Y are electrically connected includes the case where X and Y are directly connected.

Example

In this example, an MCU (micro control unit) chip including the memory device 100 described in Embodiment 1 and a CPU core was fabricated, and it was verified that the fabricated chip operates with low power consumption.

In this example, the memory device 100 is called DOSRAM (Dynamic Oxide Semiconductor Random Access Memory).

Figure 25:
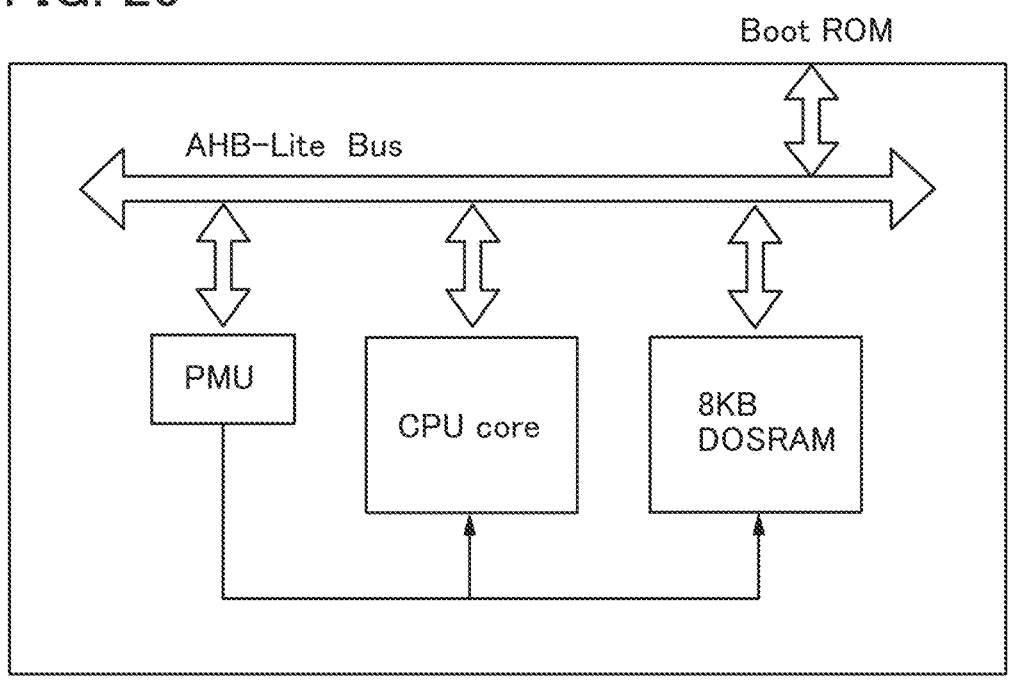
FIG. 25 A block diagram illustrating a structure example of a fabricated chip.

FIG. 25 shows a block diagram of the fabricated chip. The chip includes an 8-KB (byte) DOSRAM, a CPU core, a PMU (power management unit), and an AHB-Lite bus. The DOSRAM and a flip flop in the CPU core include Si transistors and OS transistors formed over the Si transistors. The OS transistor has the same structure as the transistor 200a illustrated in FIG. 16. Power supply to the DOSRAM and the CPU core is controlled by the PMU. Data transmission in the chip is performed through a 32-bit bus.

Figure 26:
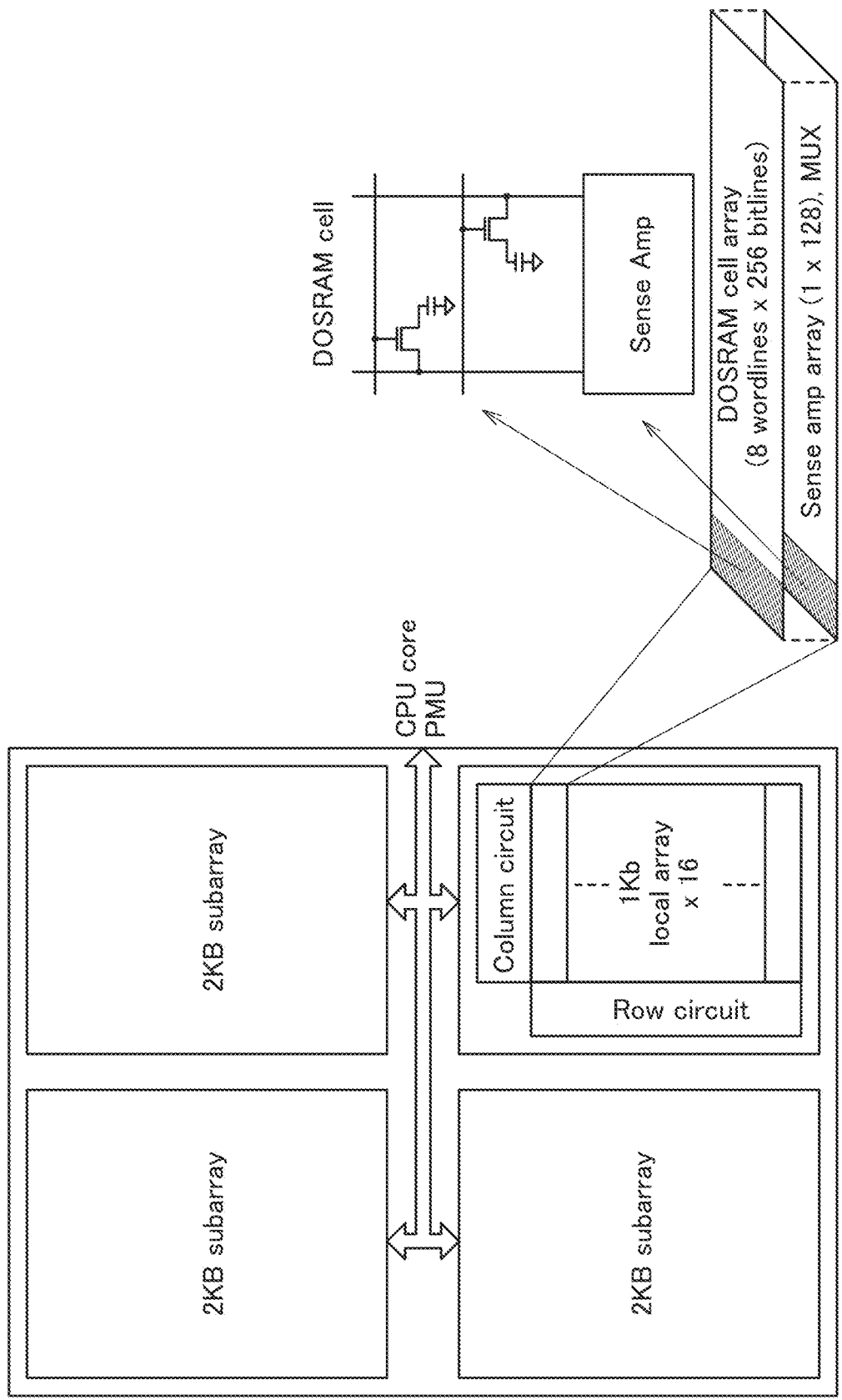
FIG. 26 A block diagram illustrating a structure example of a fabricated DOSRAM.

FIG. 26 shows a block diagram of the 8-KB DOSRAM. The 8 KB DOSRAM includes four 2-KB sub arrays. One sub array includes 16 1-Kb (bit) local arrays. The 1-Kb local array has a structure in which a cell array formed of eight word lines and 256 bit lines is stacked over 128 sense amplifiers (SA) and a multiplexer (MUX). This stacked structure can reduce a region that is activated during memory access.

The 1-Kb local array in FIG. 26 was fabricated using the memory cell 130 with the folded architecture illustrated in FIG. 8. The sense amplifier in FIG. 26 corresponds to the SMC 10 in FIG. 8. The fabricated memory cell (the NMC in FIG. 8) had an area of 2.9 μm² and a capacitance of 3.5 fF.

Figure 27A:
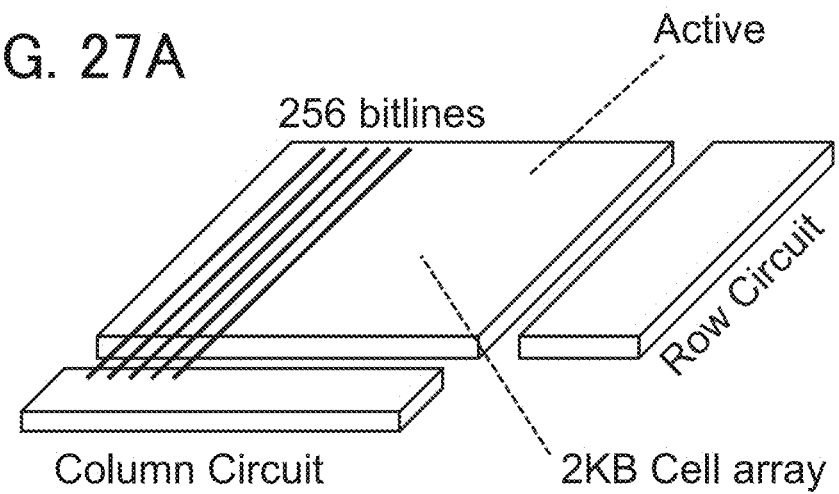
FIGS. 27A and 27B Schematic diagrams each illustrating a structure example of a DOSRAM.
Figure 27B:
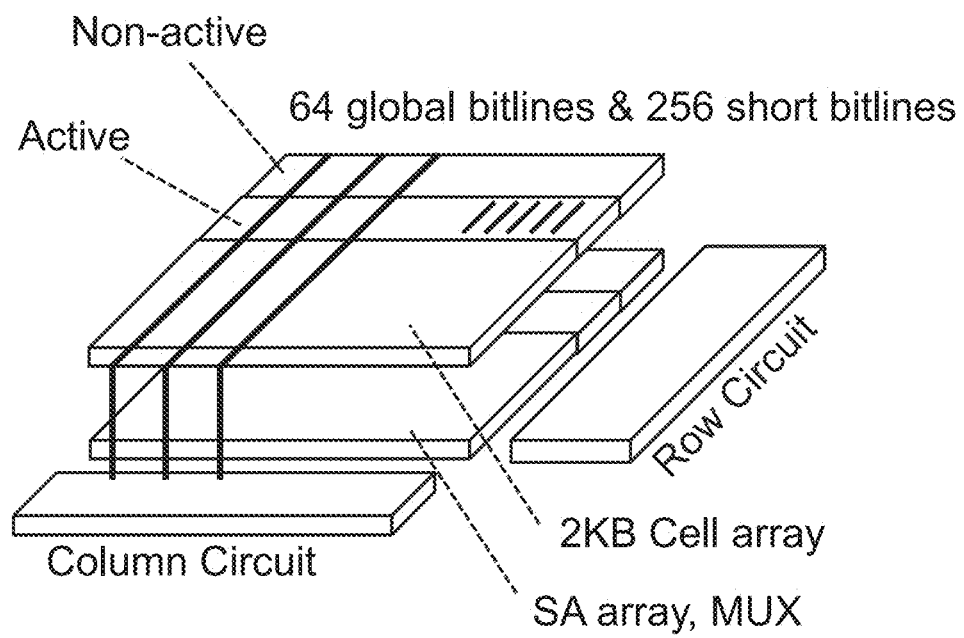

FIGS. 27(A) and 27(B) are schematic diagrams illustrating DOSRAM structures. FIG. 27(A) illustrates a case where α cell array, a sense amplifier, and a multiplexer are formed over the same layer. In FIG. 27(A), 256 long bit lines need to be driven. FIG. 27(B) illustrates a case where cell an array is stacked over a sense amplifier and a multiplexer. The bit lines can be classified into 256 local bit lines (short bit lines) and 64 global bit lines (long bit lines) depending on the stacked structure. Through the multiplexer, 64 of the 256 local bit lines are connected to the global bit lines. The structure of FIG. 27(B) can reduce the number of long bit lines and bit line capacitance. In addition, storage capacitor can be reduced and load for driving the DOSRAM can be reduced.

Figure 28:
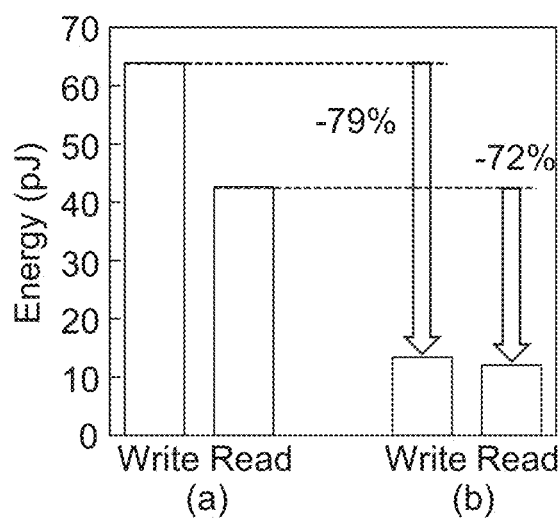
FIG. 28 A graph showing calculation results of active energy of a DODRAM.

FIG. 28 shows simulation results of active energy of a 2-KB DODRAM. In FIG. 28, (a) shows the case where α cell array, a sense amplifier, and a multiplexer are formed over the same layer (the case of FIG. 27(A)), and (a) shows the case where α cell array is stacked over a sense amplifier and a multiplexer (the case of FIG. 27(B)). The results of FIG. 28 verify that the stacked structure (b) reduces 70% or more of operation energy than the structure (a) without the stacked structure does.

Figure 29:
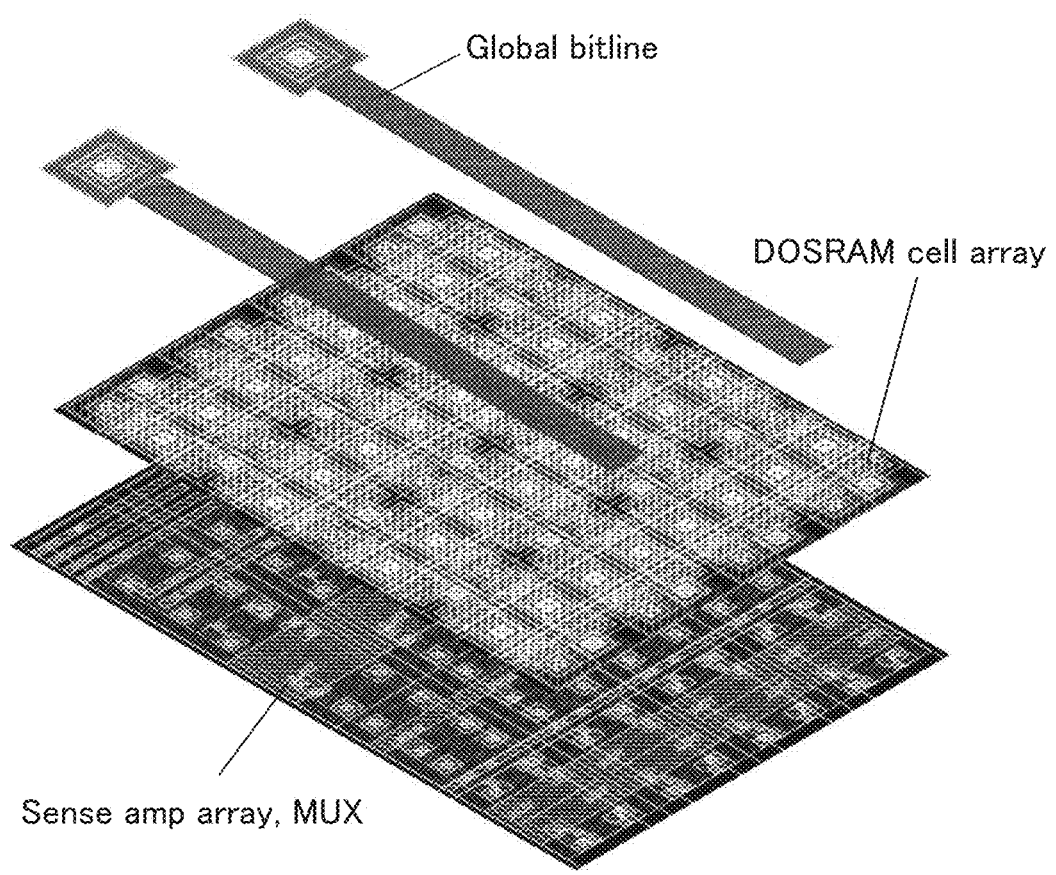
FIG. 29 A layout of a fabricated DODRAM.

FIG. 29 shows part of a layout of the fabricated DOSRAM. FIG. 29 shows a sense amplifier, a multiplexer, a cell array, and a global bit line.

Figure 30:
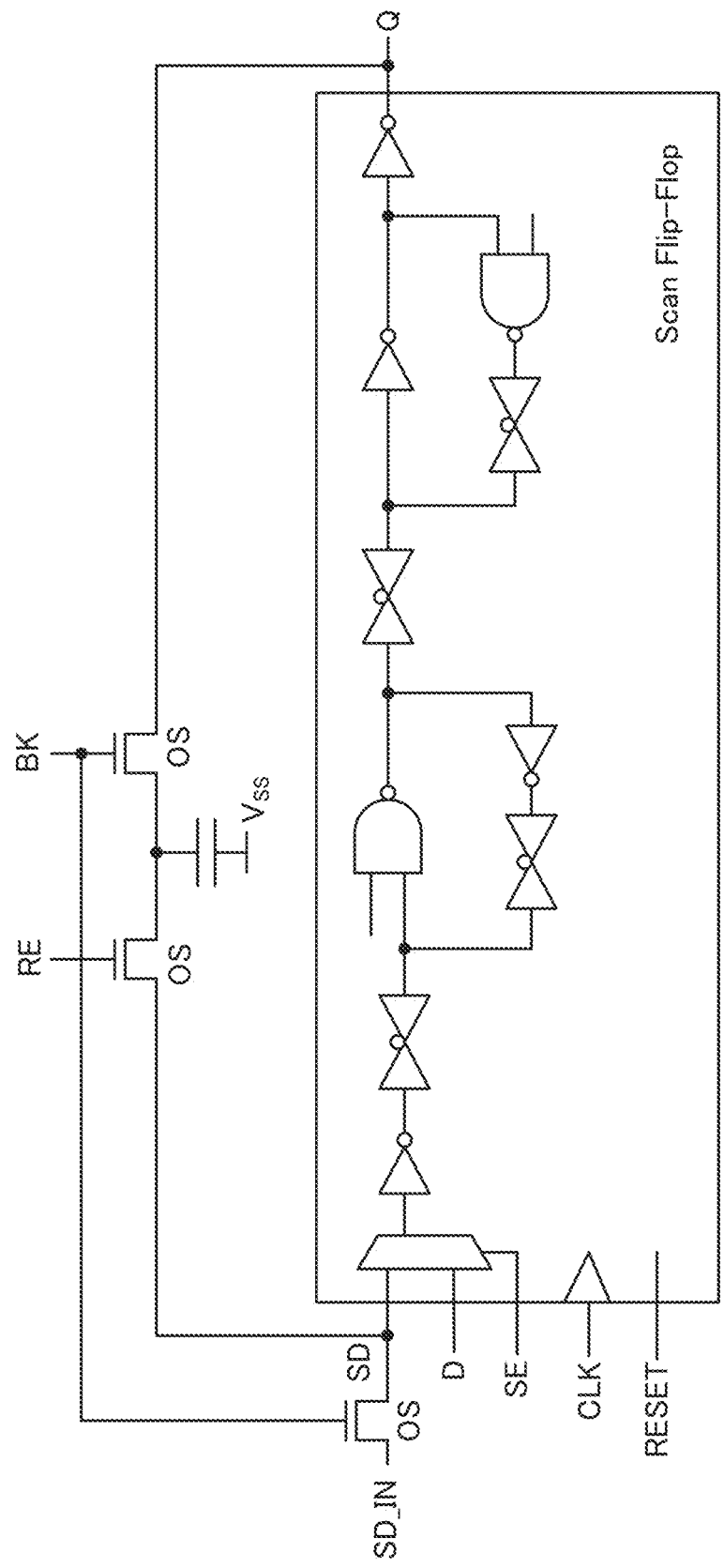
FIG. 30 A circuit diagram of a fabricated OS flip flop.

FIG. 30 is a circuit diagram of a flip flop (hereinafter referred to as an OS-FF) including an OS transistor that is used in the CPU core. Three OS transistors and one capacitor are added to a scan flip flop. Backup and recovery of the OS-FF are performed using a backup signal BK and a recovery signal RE transmitted from the PMU.

Figure 31:
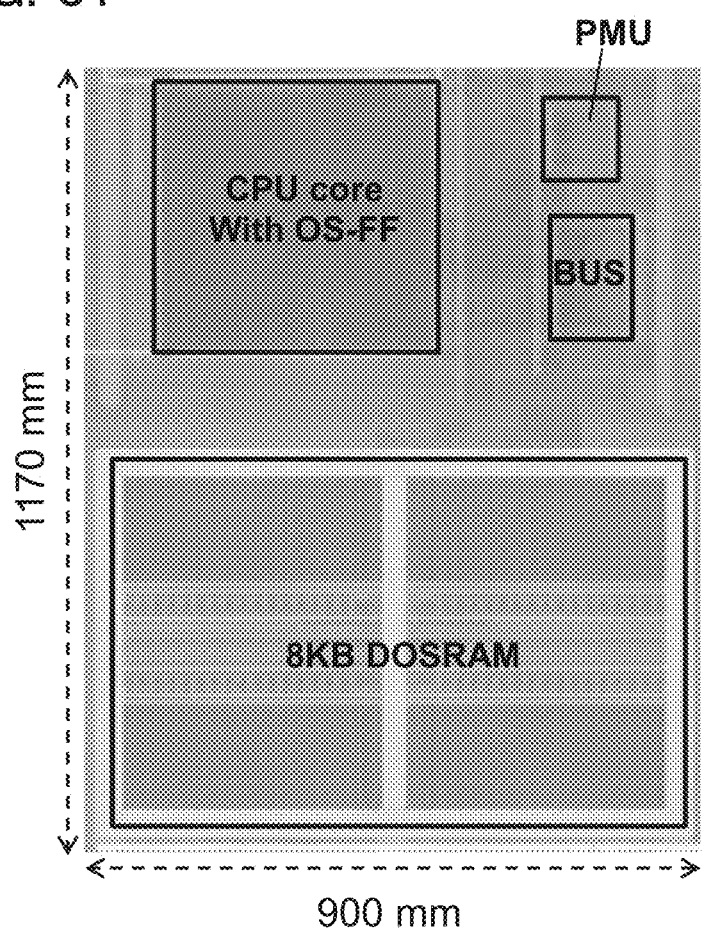
FIG. 31 An optical micrograph of a fabricated chip.

FIG. 31 is an optical micrograph of the fabricated chip. The power supply voltage of a logic circuit portion was set to 1.1 V, and the power supply voltages of a circuit using an OS transistor and an I/O were set to 3.3 V. The technology node of the Si transistor was 65 nm and the technology node of the OS transistor was 60 nm.

Figure 32:
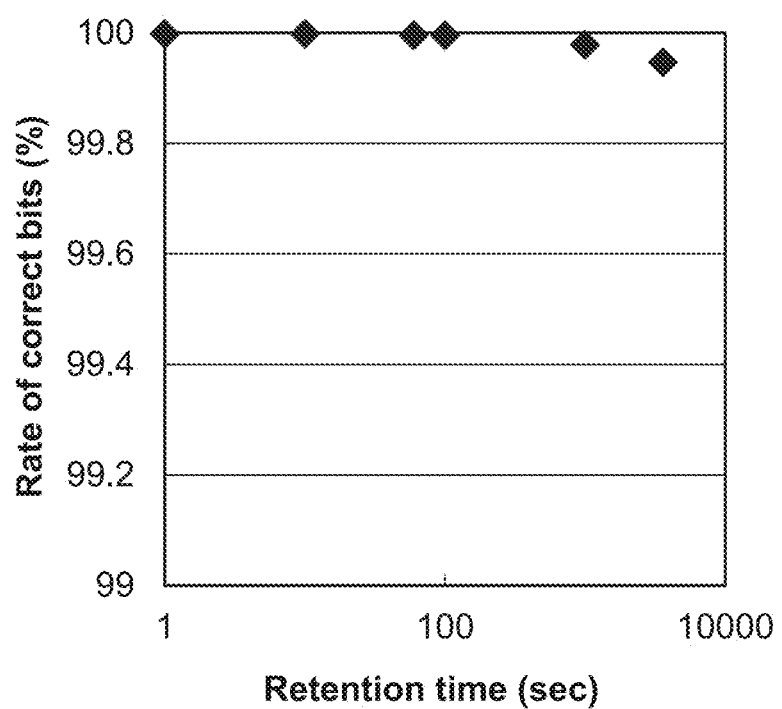
FIG. 32 A graph showing retention characteristics of a fabricated chip.

FIG. 32 shows retention characteristics of the fabricated DOSRAM at 85° C. It was verified that 99.95% of data was retained after an hour. This indicates that the DOSRAM can retain data for a long time without refreshing data. That is, the DOSRAM can perform a long-term power gating.

Figure 33:
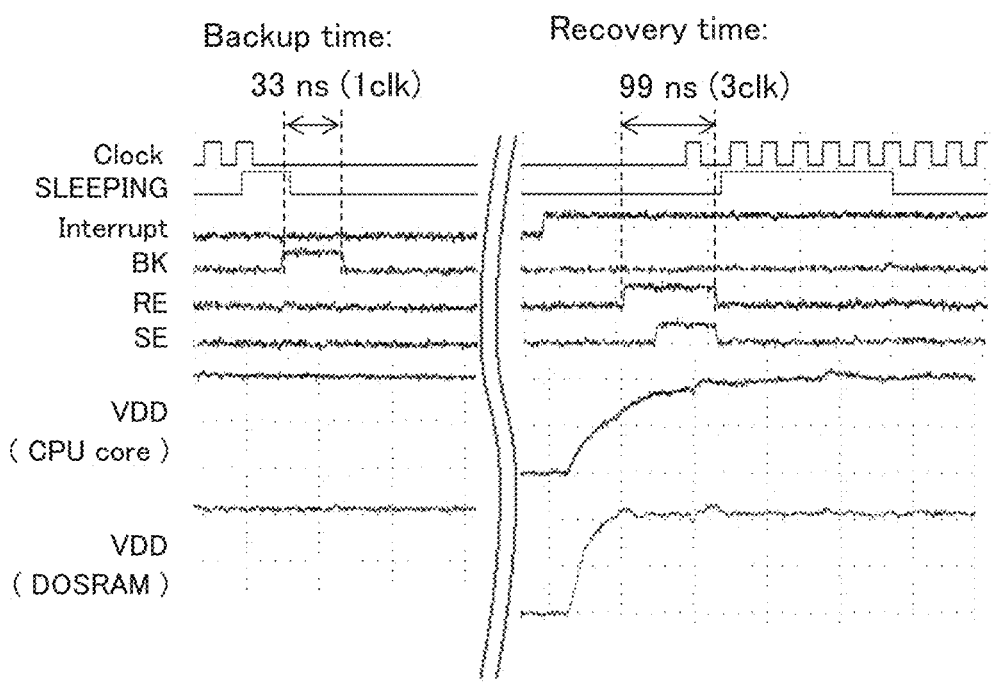
FIG. 33 A graph showing backup-recovery waveforms of a fabricated chip.

FIG. 33 shows backup-recovery waveforms of the fabricated chip. In a 30-MHz OS-FF, a backup time was 1 clock (33 ns) and a recovery time was three clocks (99 ns). Note that the DOSRAM can retain data without supply of power and does not need backup-recovery operations, and only power ON/OFF may be performed.

Table 1 shows a summary of operation modes and power consumption of the chip. In Table 1, active power of the DOSRAM was measured by repeating nine clock (seven times of reading and two times of writing) operations. As shown in Table 1, a reduction in standby power by power gating was observed in both the DOSRAM and the CPU core.

TABLE 1

|  | Active (μW/MHz) | Clock Gating (μW) | Power Gating (μW) |
|---|---|---|---|
| CPU core | 16.5 | 11.6 | 0.006 |
| 8 kB DOSRAM | 11.7 | 1.43 | 0.003 |

Table 2 shows comparison between other low-power-consumption MCUs which have been reported so far and the chip fabricated in this example. In Table 2, A represents data of the MCU described in Non-Patent Document 2, B represents data of the MCU described in Non-Patent Document 3, C represents data of the MCU described in Non-Patent Document 4, and D represents data of the chip fabricated in this example. It was verified that the fabricated chip is superior to the other chips in a technology node, a clock frequency, and active power. It was also verified that the fabricated chip achieves the lowest power consumption regardless of the ratio of active and standby.

TABLE 2

|  | A | B | C | D |
|---|---|---|---|---|
| Technology (Si) | 130 nm | 90 nm | 90 nm | 65 nm |
| Memory device | FRAM | Spin RAM | N/A | OS memory |
| Clock frequency (MHz) | 8 | 20 | 16 | 30 |
| Active Power (mW/MHz) | 170 | 145 | 28.3 | 28.2 |
| Standby Power (mW) | 0 | 1.22 | 0.32 | 0.009 |
| 100K-cycle in 1 sec (mW) | 17.00 | 15.71 | 3.15 | 2.83 |
| 10K-cycle in 1 sec (mW) | 1.70 | 2.67 | 0.60 | 0.29 |
| 1K-cycle in 1 sec (mW) | 0.17 | 1.36 | 0.35 | 0.04 |

REFERENCE NUMERALS

ADDR signal, BGL wiring, BL wiring, BLB wiring, BW signal, C0 capacitor, C1 capacitor, C2 capacitor, C21 capacitor, C23 capacitor, C22 capacitor, C24 capacitor, CE signal, CLK signal, DB1 data, DB2 data, GW signal, L1 layer, L2 layer, L3 layer, L4 layer, LBL wiring, LBLB wiring, M1 transistor, M21 transistor, M24 transistor, M31 transistor, M34 transistor, NWL wiring, NWL_0 wiring, NWL_1 wiring, OS1 transistor, PCL wiring, PON1 signal, PON2 signal, RDA signal, VCS wiring, VDDM wiring, VHH wiring, VLL wiring, VPC wiring, WDA signal, WL wiring, t1 time, t2 time, t3 time, t4 time, t5 time, t6 time, t7 time, t8 time, Tac1 transistor, Tac2 transistor, Tdr1 transistor, Teq1 transistor, Tld1 transistor, Tld2 transistor, Tpc1 transistor, Tpc2 transistor, Tr1 transistor, Tr2 transistor, Tr3 transistor, Tr4 transistor, 10 SMC, 20 NVM, 21 NVM, 30 LPC, 100 memory device, 110 memory cell array, 110A memory cell array, 110B memory cell array, 111 peripheral circuit, 112 control circuit, 115 peripheral circuit, 121 row decoder, 122 column decoder, 123 row driver, 124 column driver, 125 input circuit, 126 output circuit, 127 voltage generation circuit, 127a voltage generation circuit, 127b voltage generation circuit, 128 voltage retention circuit, 130 memory cell, 141 PSW, 142 PSW, 200a transistor, 200b transistor, 200c transistor, 200d transistor, 205 conductor, 205a conductor, 205b conductor, 214 insulator, 216 insulator, 220 insulator, 222 insulator, 224 insulator, 230 oxide semiconductor, 230a oxide semiconductor, 230b oxide semiconductor, 230c oxide semiconductor, 240a conductor, 240b conductor, 241 insulator, 250 insulator, 260 conductor, 280 insulator, 282 insulator, 300 substrate, 301 element isolation layer, 302 insulator, 303 insulator, 304 insulator, 305 insulator, 310 plug, 311 plug, 312 plug, 313 plug, 320 wiring, 321 wiring, 322 conductor, 323 conductor, 324 insulator, 331 plug, 332 plug, 333 plug, 334 plug, 341 wiring, 342 wiring, 343 wiring, 351 well, 352 channel formation region, 353 impurity region, 354 impurity region, 355 conductive region, 356 conductive region, 357 gate electrode, 358 gate insulator, 361 well, 362 channel formation region, 363 high-concentration impurity region, 364 high-concentration impurity region, 365 conductive region, 366 conductive region, 367 gate electrode, 368 gate insulator, 369 sidewall insulating layer, 370 sidewall insulating layer, 371 low-concentration impurity region, 372 low-concentration impurity region, 611 substrate, 612 circuit region, 613 separation region, 614 separation line, 615 chip, 650 electronic component, 652 printed wiring board, 653 semiconductor device, 654 board, 655 lead, 700 wristwatch terminal, 701 housing, 702 winding crown, 703 display portion, 704 belt, 705 sensing unit, 710 mobile phone, 711 housing, 712 microphone, 713 external connection port, 714 operation button, 716 display portion, 717 speaker, 720 laptop personal computer, 721 housing, 722 display portion, 723 keyboard, 724 pointing device, 730 goggle-type display, 731 temple, 732 housing, 735 cable, 736 battery, 737 display portion, 740 video camera, 741 housing, 742 housing, 743 display portion, 744 operation key, 745 lens, 746 joint, 750 automobile, 751 car body, 752 wheel, 753 dashboard, 754 light, 1300 CPU, 1302 power controller, 1303 power switch, 1304 cache memory, 1305 bus interface, 1306 debug interface, 1307 control unit, 1308 program counter, 1309 pipeline register, 1310 pipeline register, 1311 ALU, 1312 register file, 1330 CPU core, 1331 PMU, 1332 peripheral circuit, 1333 data bus, 1400 RFIC, 1404 antenna, 1405 rectifier circuit, 1406 constant voltage circuit, 1407 demodulation circuit, 1408 modulation circuit, 1409 logic circuit, 1410 RAM, 1411 ROM, 1412 battery, 1420 communication device, 1421 antenna, 1422 radio signal

The invention claimed is:

1. A memory device comprising:
a first wiring;
a second wiring;
a first array;
a second array stacked over the first array; and
a third array stacked over the second array,
wherein the first array comprises a latch circuit and a precharge circuit,
wherein each of the second array and the third array comprises a plurality of memory circuits arranged in a matrix,
wherein each of the plurality of memory circuits comprises a first transistor between a first local bit line and a first capacitor, and a second transistor between a second local bit line and a second capacitor,
wherein the plurality of memory circuits overlaps with the latch circuit and the precharge circuit,
wherein the first wiring is configured to supply a high power supply voltage and electrically connected to the latch circuit,
wherein the second wiring is configured to supply a low power supply voltage and electrically connected to the latch circuit,
wherein the precharge circuit is configured to supply a precharge voltage to the first local bit line and the second local bit line, and
wherein, in a period when the first transistor and the second transistor are off, a potential of one of the first wiring and the second wiring is the precharge voltage, and, at the same time, a potential of the other of the first wiring and the second wiring is one of the high power supply voltage and the low power supply voltage.

2. The memory device according to claim 1,
wherein each of the latch circuit and the precharge circuit comprises a transistor comprising silicon in a channel formation region.

3. The memory device according to claim 1,
wherein each of the first transistor and the second transistor comprises a first gate and a second gate.

4. The memory device according to claim 1, further comprising:
a third transistor between a first bit line and the first local bit line; and
a fourth transistor between a second bit line and the second local bit line.

5. A memory device comprising:
a first wiring;
a second wiring;
a first array; and
a second array stacked over the first array,
wherein the first array comprises a latch circuit and a precharge circuit,
wherein the second array comprises a plurality of memory circuits arranged in a matrix,
wherein each of the plurality of memory circuits comprises a first transistor between a first local bit line and a first capacitor, and a second transistor between a second local bit line and a second capacitor,
wherein the plurality of memory circuits overlaps with the latch circuit and the precharge circuit,
wherein the first wiring is configured to supply a high power supply voltage and electrically connected to the latch circuit,
wherein the second wiring is configured to supply a low power supply voltage and electrically connected to the latch circuit,
wherein the precharge circuit is configured to supply a precharge voltage to the first local bit line and the second local bit line, and
wherein, in a period when the first transistor and the second transistor are off, a potential of one of the first wiring and the second wiring is the precharge voltage, and, at the same time, a potential of the other of the first wiring and the second wiring is one of the high power supply voltage and the low power supply voltage.

6. The memory device according to claim 5,
wherein each of the latch circuit and the precharge circuit comprises a transistor comprising silicon in a channel formation region.

7. The memory device according to claim 5,
wherein each of the first transistor and the second transistor comprises a first gate and a second gate.

8. The memory device according to claim 5, further comprising:
a third transistor between a first bit line and the first local bit line; and
a fourth transistor between a second bit line and the second local bit line.

* * * * *